(12) United States Patent
Okamoto et al.

(10) Patent No.: US 10,367,015 B2
(45) Date of Patent: Jul. 30, 2019

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Satoru Okamoto, Isehara (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 60 days.

(21) Appl. No.: 15/298,307

(22) Filed: Oct. 20, 2016

(65) Prior Publication Data

US 2017/0125455 A1 May 4, 2017

(30) Foreign Application Priority Data

Oct. 29, 2015 (JP) ................................. 2015-213167

(51) Int. Cl.
*H01L 27/12* (2006.01)
*H01L 27/105* (2006.01)
(Continued)

(52) U.S. Cl.
CPC ...... *H01L 27/1288* (2013.01); *H01L 27/1052* (2013.01); *H01L 27/124* (2013.01);
(Continued)

(58) Field of Classification Search
CPC .............. H01L 27/1288; H01L 27/124; H01L 29/7869; H01L 27/14616; H01L 27/1052; H01L 27/1225
See application file for complete search history.

(56) References Cited

U.S. PATENT DOCUMENTS

| 5,528,032 A | 6/1996 | Uchiyama |
| 5,744,864 A | 4/1998 | Cillessen et al. |

(Continued)

FOREIGN PATENT DOCUMENTS

| JP | 63-239117 A | 10/1988 |
| JP | 06-275697 A | 9/1994 |
| JP | 11-505377 | 5/1999 |

OTHER PUBLICATIONS

US 9,660,006 B2, 05/2017, Ito et al. (withdrawn)

*Primary Examiner* — Yu-Hsi D Sun
(74) *Attorney, Agent, or Firm* — Robinson Intellectual Property Law Office; Eric J. Robinson

(57) ABSTRACT

Provided is a semiconductor device which can reduce leakage of current between wirings. Included steps are forming a first insulator over a first conductor which is formed over substrate; forming a first hard mask thereover; forming a first resist mask comprising a first opening, over the first hard mask; etching the first hard mask to form a second hard mask comprising a second opening; etching the first insulator using the second hard mask to form a second insulator comprising a third opening; forming a second conductor embedded in the second opening and the third opening; performing polishing treatment on the second hard mask and the second conductor to form a third conductor embedded in the third opening; forming a fourth conductor thereover; forming a second resist mask in a pattern over the fourth conductor; and dry-etching the fourth conductor to form a fifth conductor. The second hard mask can be dry-etched.

24 Claims, 48 Drawing Sheets

(51) Int. Cl.
  *H01L 27/146* (2006.01)
  *H01L 29/786* (2006.01)
(52) U.S. Cl.
  CPC .... *H01L 27/1225* (2013.01); *H01L 27/14616* (2013.01); *H01L 29/7869* (2013.01)

(56) References Cited

U.S. PATENT DOCUMENTS

| | | | |
|---|---|---|---|
| 5,886,410 A * | 3/1999 | Chiang | H01L 21/76802 257/759 |
| 7,622,338 B2 | 11/2009 | Nakamura et al. | |
| 7,977,253 B2 | 7/2011 | Nakamura et al. | |
| 8,546,181 B2 | 10/2013 | Yamazaki | |
| 8,809,855 B2 | 8/2014 | Yamazaki et al. | |
| 8,815,640 B2 | 8/2014 | Tochibayashi et al. | |
| 8,846,459 B2 | 9/2014 | Tochibayashi et al. | |
| 9,394,614 B2 | 7/2016 | Nishido | |
| 2002/0185740 A1 * | 12/2002 | Cho | H01L 21/76804 257/758 |
| 2013/0161605 A1 | 6/2013 | Sasagawa et al. | |
| 2013/0203214 A1 * | 8/2013 | Isobe | H01L 21/0237 438/104 |
| 2014/0209898 A1 | 7/2014 | Yamamoto et al. | |
| 2014/0264323 A1 | 9/2014 | Sasagawa et al. | |
| 2014/0291672 A1 | 10/2014 | Yamazaki et al. | |
| 2014/0332800 A1 | 11/2014 | Hanaoka | |
| 2014/0332801 A1 | 11/2014 | Sasagawa et al. | |
| 2014/0353839 A1 * | 12/2014 | Lin | H01L 23/481 257/774 |
| 2014/0361291 A1 | 12/2014 | Sasagawa et al. | |
| 2015/0270402 A1 | 9/2015 | Endo et al. | |
| 2016/0247934 A1 | 8/2016 | Hanaoka | |
| 2016/0293732 A1 | 10/2016 | Kurata et al. | |
| 2016/0359050 A1 | 12/2016 | Sasagawa et al. | |
| 2017/0005203 A1 | 1/2017 | Endo et al. | |
| 2017/0104018 A1 | 4/2017 | Yamazaki et al. | |
| 2017/0125450 A1 | 5/2017 | Hodo et al. | |

* cited by examiner

FIG. 10A
FIG. 10B
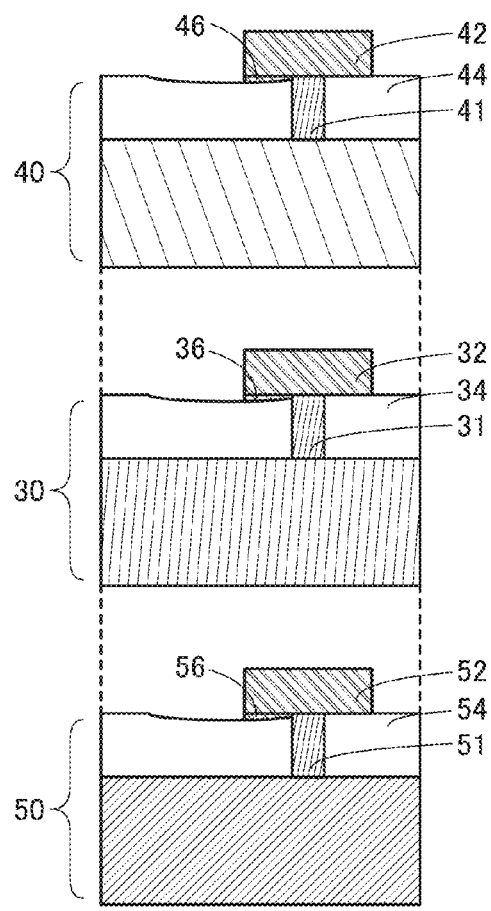
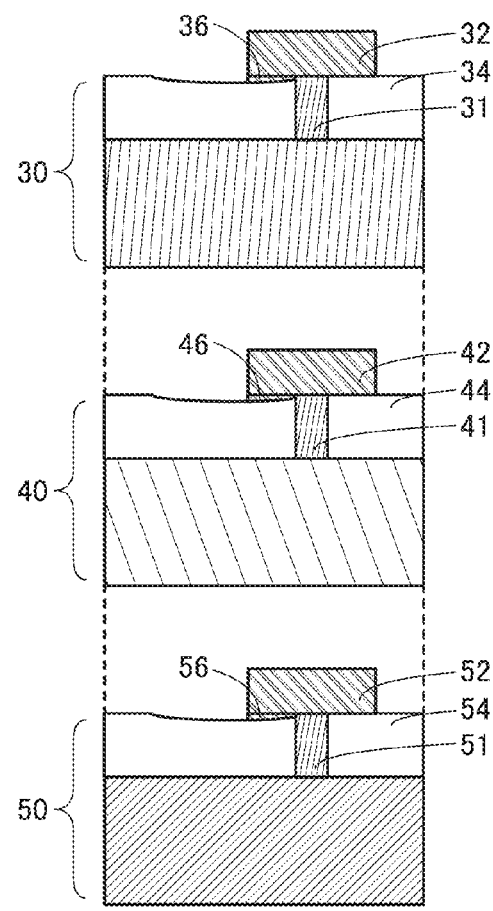

InMZnO$_4$ of crystal structure out-of-plane method
CAAC-OS in-plane method φ scan
CAAC-OS in-plane method φ scan
Single crystal OS

METHOD FOR MANUFACTURING SEMICONDUCTOR DEVICE

BACKGROUND OF THE INVENTION

1. Field of the Invention

The present invention relates to, for example, a transistor and a semiconductor device. The present invention relates to, for example, manufacturing methods of a transistor and a semiconductor device. The present invention relates to, for example, a display device, a light-emitting device, a lighting device, a power storage device, a memory device, an imaging device, a processor, and an electronic device. The present invention relates to a method for manufacturing a display device, a liquid crystal display device, a light-emitting device, a memory device, and an electronic device. The present invention relates to a method for driving a display device, a liquid crystal display device, a light-emitting device, a memory device, or an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

Transistors formed using silicon are widely used in various integrated circuits (IC) such as a CPU and a memory included in electronic devices. The integration of integrated circuits and miniaturization of transistors have progressed in accordance with an increase in performance and a reduction in size and weight of electronic devices. Thus, the process rule for fabricating a transistor has decreased year by year as follows: 45 nm, 32 nm, and 22 nm.

The decrease in the process rule for fabricating a transistor causes a problem, such as leakage of current between wirings.

In recent years, transistors including oxide semiconductors (typically, In—Ga—Zn oxide) have been actively developed and used in ICs. Oxide semiconductors have been researched since early times. In 1988, there was a disclosure of a crystal In—Ga—Zn oxide that can be used for a semiconductor element (see Patent Document 1). In 1995, a transistor including an oxide semiconductor was invented, and its electrical characteristics were disclosed (see Patent Document 2).

REFERENCE

Patent Document

[Patent Document 1] Japanese Published Patent Application No. S63-239117
[Patent Document 2] Japanese translation of PCT international application No. H11-505377

SUMMARY OF THE INVENTION

An object of one embodiment of the present invention is to provide a semiconductor device which can prevent leakage of current between wirings. Another object thereof is to provide, without an increase in the number of steps, a semiconductor device which can prevent leakage of current between wirings. Another object thereof is to provide a semiconductor device which includes an oxide semiconductor and which can prevent leakage of current between wirings. Another object thereof is to provide a miniaturized semiconductor device.

Another object thereof is to provide a module including the semiconductor device. Another object thereof is to provide an electronic device including the semiconductor device or the module. Another object thereof is to provide a novel semiconductor device. Another object thereof is to provide a novel module. An object thereof is to provide a novel electronic device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a method for manufacturing a semiconductor device comprising a semiconductor over a substrate, comprising the steps of: forming a first conductor over the substrate; forming a first insulator over the first conductor; forming a first hard mask over the first insulator; forming a first resist mask comprising a first opening, over the first hard mask; etching the first hard mask using the first resist mask to form a second hard mask comprising a second opening; etching the first insulator using the second hard mask to form a second insulator comprising a third opening; forming a second conductor embedded in the second opening and the third opening; performing polishing treatment on the second hard mask and the second conductor to form a third conductor embedded in the third opening; forming a fourth conductor over the second insulator and the third conductor; forming a second resist mask in a pattern over the fourth conductor; etching the fourth conductor using the second resist mask and an etching gas to form a fifth conductor; and removing the second resist mask. The second hard mask is etched with the etching gas.

(2) Another embodiment of the present invention is the method for manufacturing a semiconductor device, according to (1), in which the second hard mask and the fourth conductor comprise the same kind of metal element.

(3) Another embodiment of the present invention is the method for manufacturing a semiconductor device, according to (1), in which the first hard mask comprises a third hard mask and a fourth hard mask over the third hard mask, in which the third hard mask is a conductor, and in which the fourth hard mask is an insulator.

(4) Another embodiment of the present invention is the method for manufacturing a semiconductor device, according to (3), in which the third hard mask and the fourth conductor comprise the same kind of metal element.

(5) Another embodiment of the present invention is the method for manufacturing a semiconductor device, according to (1), in which the fourth conductor comprises a plurality of stacked conductors, and in which a lowermost conductor of the fourth conductor and the second hard mask are etched with the etching gas.

(6) Another embodiment of the present invention is the method for manufacturing a semiconductor device, according to (5), in which the second hard mask and the lowermost conductor of the fourth conductor comprise the same kind of metal element.

(7) Another embodiment of the present invention is a method for manufacturing a semiconductor device comprising an oxide semiconductor over a semiconductor substrate, comprising the steps of: forming a first conductor over the semiconductor substrate; forming a first insulator over the first conductor; forming a first hard mask over the first insulator; forming a first resist mask comprising a first opening, over the first hard mask; etching the first hard mask using the first resist mask to form a second hard mask comprising a second opening; etching the first insulator using the second hard mask to form a second insulator comprising a third opening; forming a second conductor embedded in the second opening and the third opening; performing polishing treatment on the second hard mask and the second conductor to form a third conductor embedded in the third opening; forming a fourth conductor over the second insulator and the third conductor; forming a second resist mask in a pattern over the fourth conductor; etching the fourth conductor using the second resist mask and an etching gas to form a fifth conductor; removing the second resist mask, forming the oxide semiconductor over the fifth conductor; forming a sixth conductor over the oxide semiconductor; forming a third insulator over the sixth conductor; forming a third hard mask over the third insulator; forming a third resist mask comprising a fourth opening, over the third hard mask; etching the third hard mask using the third resist mask to form a fourth hard mask comprising a fifth opening; etching the third insulator using the fourth hard mask to form a fourth insulator comprising a sixth opening; forming a seventh conductor embedded in the fifth opening and the sixth opening; performing polishing treatment on the fourth hard mask and the seventh conductor to form an eighth conductor embedded in the sixth opening; forming a ninth conductor over the fourth insulator and the eighth conductor; forming a fourth resist mask in a pattern over the ninth conductor; etching the ninth conductor using the fourth resist mask and an etching gas to form a tenth conductor; and removing the fourth resist mask. The second hard mask is etched with the first etching gas. The fourth hard mask is etched with the second etching gas. A melting point of the tenth semiconductor is lower than a melting point of the fifth conductor.

(8) Another embodiment of the present invention is the method for manufacturing a semiconductor device, according to (7), in which the second hard mask and the fourth conductor comprise the same kind of metal element, and in which the fourth hard mask and the ninth conductor comprise the same kind of metal element.

(9) Another embodiment of the present invention is the method for manufacturing a semiconductor device, according to (7), in which the first hard mask comprises a fifth hard mask and a sixth hard mask over the fifth hard mask, in which the fifth hard mask comprises a metal element, in which the sixth hard mask comprises an insulator, in which the third hard mask comprises a seventh hard mask and an eighth hard mask over the seventh hard mask, in which the seventh hard mask is a conductor, and in which the eighth hard mask is an insulator.

(10) Another embodiment of the present invention is the method for manufacturing a semiconductor device, according to (9), in which the fifth hard mask and the fourth conductor comprise the same kind of metal element, and in which the seventh hard mask and the ninth conductor comprise the same kind of metal element.

(11) Another embodiment of the present invention is the method for manufacturing a semiconductor device, according to (7), in which the fourth conductor comprises a plurality of stacked conductors, in which the lowermost conductor of the fourth conductor and the second hard mask are etched with the first etching gas, in which the ninth conductor comprises a plurality of stacked conductors, and in which a lowermost conductor of the ninth conductor and the fourth hard mask are etched with the second etching gas.

(12) Another embodiment of the present invention is the method for manufacturing a semiconductor device, according to (11), in which the second hard mask and the lowermost conductor of the fourth conductor comprise the same kind of metal element, and in which the fourth hard mask and the lowermost conductor of the ninth conductor comprise the same kind of metal element.

A semiconductor device which can prevent leakage of current between wirings can be provided. A semiconductor device which can prevent leakage of current between wirings can be provided without an increase in the number of steps. A semiconductor device which includes an oxide semiconductor and which can prevent leakage of current between wirings can be provided. A miniaturized semiconductor device can be provided.

A module including the semiconductor device can be provided. An electronic device including the semiconductor device or the module can be provided. A novel semiconductor device can be provided. A novel module can be provided. A novel electronic device can be provided.

Note that the description of these effects does not preclude the existence of other effects. One embodiment of the present invention does not necessarily have all the effects listed above. Other effects will be apparent from and can be derived from the description of the specification, the drawings, the claims, and the like.

BRIEF DESCRIPTION OF THE DRAWINGS

FIGS. 10A and 10B are schematic views illustrating structures of a semiconductor device of one embodiment of the present invention.

DETAILED DESCRIPTION OF THE INVENTION

Figure 1A:
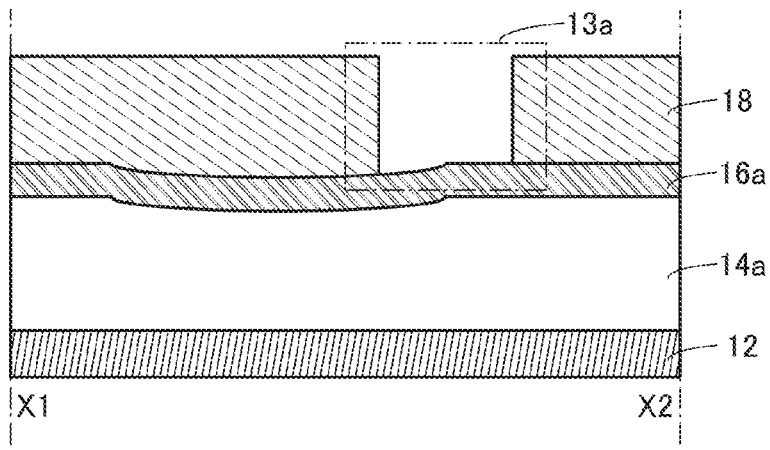
FIGS. 1A to 1D are cross-sectional views and top views illustrating a method for manufacturing a semiconductor device of one embodiment of the present invention.

Hereinafter, embodiments of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to description of the embodiments. In describing structures of the invention with reference to the drawings, common reference numerals are used for the same portions in different drawings. Note that the same hatched pattern is used for similar parts, and the similar parts are not denoted by reference numerals in some cases.

A structure in one of the following embodiments can be appropriately applied to, combined with, or replaced with another structure in another embodiment, for example, and the resulting structure is also one embodiment of the present invention.

Note that the size, the thickness of films (layers), or regions in drawings is sometimes exaggerated for simplicity.

In this specification, the terms "film" and "layer" can be interchanged with each other.

A voltage usually refers to a potential difference between a given potential and a reference potential (e.g., a source potential or a ground potential (GND)). A voltage can be referred to as a potential. Note that in general, a potential (a voltage) is relative and is determined depending on the amount relative to a reference potential. Therefore, a potential that is represented as a "ground potential" or the like is not always 0 V. For example, the lowest potential in a circuit may be represented as a "ground potential." Alternatively, a substantially intermediate potential in a circuit may be represented as a "ground potential." In these cases, a positive potential and a negative potential are set using the potential as a reference.

Note that the ordinal numbers such as "first" and "second" are used for convenience and do not denote the order of steps or the stacking order of layers. Therefore, for example, the term "first" can be replaced with the term "second," "third," or the like as appropriate. In addition, the ordinal numbers in this specification and the like do not correspond to the ordinal numbers which specify one embodiment of the present invention in some cases.

Note that a "semiconductor" has characteristics of an "insulator" in some cases when the conductivity is sufficiently low, for example. Furthermore, a "semiconductor" and an "insulator" cannot be strictly distinguished from each other in some cases because a border therebetween is not clear. Accordingly, a "semiconductor" in this specification can be called an "insulator" in some cases. Similarly, an "insulator" in this specification can be called a "semiconductor" in some cases.

Furthermore, a "semiconductor" has characteristics of a "conductor" in some cases when the conductivity is sufficiently high, for example. Furthermore, a "semiconductor" and a "conductor" cannot be strictly distinguished from each other in some cases because a border therebetween is not clear. Accordingly, a "semiconductor" in this specification can be called a "conductor" in some cases. Similarly, a "conductor" in this specification can be called a "semiconductor" in some cases.

Note that impurities in a semiconductor refer to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is a silicon layer, examples of an impurity which changes characteristics of the semiconductor include oxygen, Group 1 elements except hydrogen, Group 2 elements, Group 13 elements, and Group 15 elements.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source (a source region or a source electrode) and a drain (a drain region or a drain electrode) face each other in a region where a semiconductor (or a portion where a current flows in a semiconductor when a transistor is on) and a gate electrode overlap with each other, or a region where a channel is formed in a top view of the transistor. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on a transistor structure, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

Note that the proportion of oxygen in silicon oxynitride in this specification and the like is higher than that of nitrogen. The concentration range of oxygen, nitrogen, silicon, and hydrogen is preferably from 55 atomic % to 65 atomic %, 1 atomic % to 20 atomic %, 25 atomic % to 35 atomic %, and 0.1 atomic % to 10 atomic %, respectively. In addition, the proportion of nitrogen in silicon nitride oxide is higher than that of oxygen. The concentration range of nitrogen, oxygen, silicon, and hydrogen is preferably from 55 atomic % to 65 atomic %, 1 atomic % to 20 atomic %, 25 atomic % to 35 atomic %, and 0.1 atomic % to 10 atomic %, respectively.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. The term "substantially parallel" indicates that the angle formed between two straight lines is greater than or equal to $-30°$ and less than or equal to $30°$. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

In this embodiment, a method for manufacturing a semiconductor device of one embodiment of the present invention is described with reference to FIGS. 1A to 1D to FIGS. 19A to 19D.

<Method for Forming Wiring and Plug>

A method for forming a wiring and a plug as components of a semiconductor device of one embodiment of the present invention is described below with reference to cross-sectional views and top views illustrated in FIGS. 1A to 1D to FIGS. 4A and 4B. FIGS. 1A to 1D to FIGS. 4A and 4B are cross-sectional views each taken along dashed dotted line X1-X2 and top views. FIGS. 1A to 1D to FIGS. 4A and 4B illustrate a process for connecting a conductor 12 (hereinafter also referred to as a conductive film or a wiring) and a conductor 22b (hereinafter also referred to as a conductive film or a wiring) which are provided in a lower layer and an upper layer, respectively, through a conductor 20b (hereinafter also referred to as a plug) which is provided in an opening 13c (hereinafter also referred to as a via hole or a contact hole).

First, the conductor 12 is formed over a substrate. The conductor 12 may have either a single-layer structure or a stacked-layer structure. Note that the substrate is not illustrated in FIGS. 1A to 1D to FIGS. 4A and 4B. Another conductor, insulator, semiconductor, or the like may be provided between the substrate and the conductor 12.

The conductor 12 can be formed by a method similar to a method for forming a hard mask 16a, a conductor 20a, and the like which will be described later. The conductor 12 can be formed in a pattern by a method similar to a method for forming the conductor 22b and the like which will be described later.

Next, an insulator 14a is formed over the conductor 12. The insulator 14a may have either a single-layer structure or a stacked structure. The insulator 14a can be formed by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. CVD methods can be further classified into a metal CVD (MCVD) method and a metal organic CVD (MOCVD) method depending on their source gases.

Next, the hard mask 16a is formed over the insulator 14a. Here, the hard mask 16a may be an insulator or a conductor such as a metal material. The hard mask 16a may be either a single layer or a stack of an insulator and a conductor. When the hard mask 16a has a stack structure, a structure in which an insulator is formed over a conductor is preferably used. Note that in this specification and the like, a hard mask refers to a mask formed using a material (a metal material or an insulating material) other than a resist. Note that in this specification and the like, a film which has not been processed by etching (for example, hard masks 16a, 146a, 147a, and the like) is also referred to as a hard mask.

Note that the hard mask 16a is formed using a material that can be etched with an etching gas used for etching the conductor 22b, which is described below. Thus, the hard mask 16a and the conductor 22a which will be the conductor 22b preferably contain the same kind of metal element. When the hard mask 16a has the structure in which an insulator is formed over the conductor, the conductor and the conductor 22a preferably contain the same kind of metal element.

The hard mask 16a can be formed by a sputtering method, a CVD method, an MBE method, a PLD method, an ALD method, or the like.

Figure 1B:
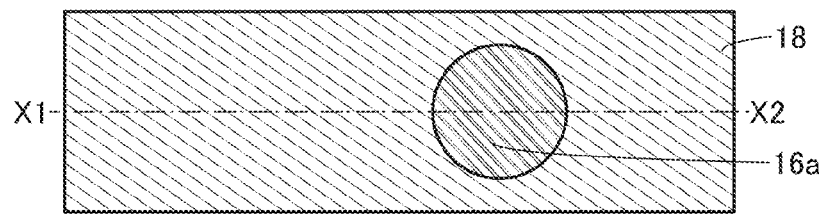

Next, a resist mask 18 having an opening 13a is formed over the hard mask 16a (see FIGS. 1A and 1B). Here, FIG. 1A corresponds to a cross section taken along dashed dotted line X1-X2 shown in FIG. 1B. In the same manner, each cross-sectional view shown in the following description corresponds to a cross section taken along dashed dotted line X1-X2 shown in the corresponding top view. The resist mask 18 is formed by a lithography method or the like. Note that the case where the resist is simply formed also includes the case where an anti-reflection layer is formed below the resist. Note that the opening 13a is not limited to a via hole, a contact hole, and the like and can have a shape of trench and the like, for example.

Note that in lithography, first, a resist is exposed to light through a photomask. Next, a region exposed to light is removed or left using a developing solution, so that a resist mask is formed. Then, etching through the resist mask is conducted. As a result, the conductor, the semiconductor, the insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a photomask is not necessary in the case of using an electron beam or an ion beam. Note that dry etching treatment such as ashing or wet etching treatment can be used for removal of the resist mask. Alternatively, wet etching treatment is performed in addition to dry etching treatment. Further alternatively, dry etching treatment is performed in addition to wet etching treatment.

Figure 1C:
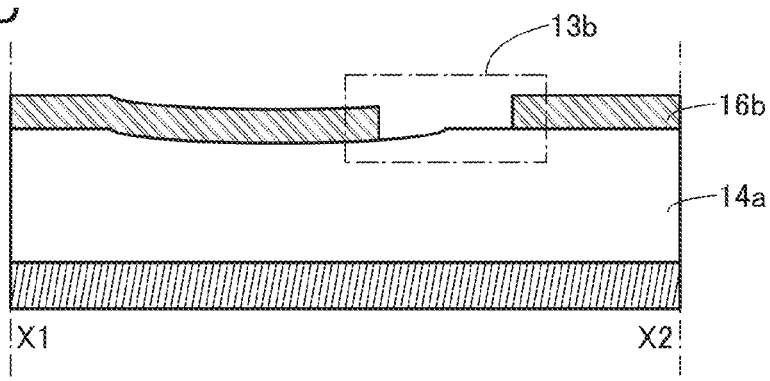
Figure 1D:
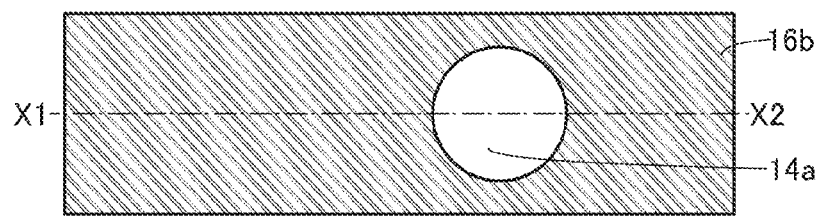

Next, the hard mask 16a is etched using the resist mask 18 to form a hard mask 16b which has an opening 13b (see FIGS. 1C and 1D). The etching is performed until a top surface of the insulator 14a is exposed in the opening 13b. Note that dry etching is preferably employed for the etching.

As a dry etching apparatus, a capacitively coupled plasma (CCP) etching apparatus including parallel-plate electrodes can be used. The capacitively coupled plasma etching apparatus including the parallel-plate electrodes may have a structure in which a high-frequency power source is applied to one of the parallel-plate electrodes. Alternatively, the capacitively coupled plasma etching apparatus may have a structure in which different high-frequency power sources are applied to one of the parallel-plate electrodes. Alternatively, the capacitively coupled plasma etching apparatus may have a structure in which high-frequency power sources with the same frequency are applied to the parallel-plate electrodes. Alternatively, the capacitively coupled plasma etching apparatus may have a structure in which high-frequency power sources with different frequencies are applied to the parallel-plate electrodes. Alternatively, a dry etching apparatus including a high-density plasma source can be used. As the dry etching apparatus including a high-density plasma source, an inductively coupled plasma (ICP) etching apparatus can be used, for example.

The resist mask 18 is preferably removed after the etching. The removal of the resist mask 18 can be performed by dry etching treatment such as ashing, wet etching treatment, wet etching treatment after dry etching treatment, or dry etching treatment after wet etching treatment. When the hard mask 16a has the stacked-layer structure in which a conductor is formed over an insulator, the resist mask 18 may be removed after the upper insulator is processed and before the lower conductor is etched.

Figure 2A:
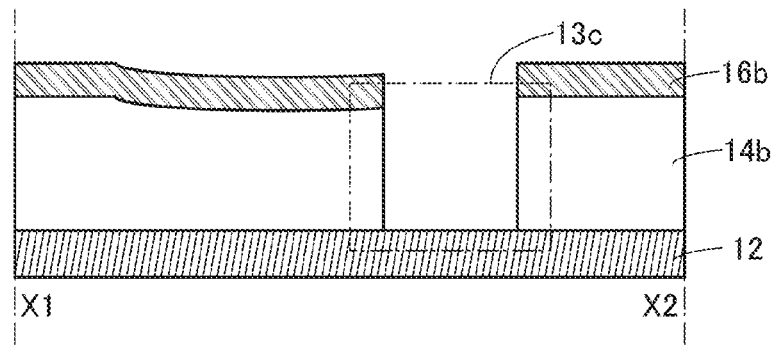
FIGS. 2A to 2D are cross-sectional views and top views illustrating the method for manufacturing a semiconductor device of one embodiment of the present invention.
Figure 2B:
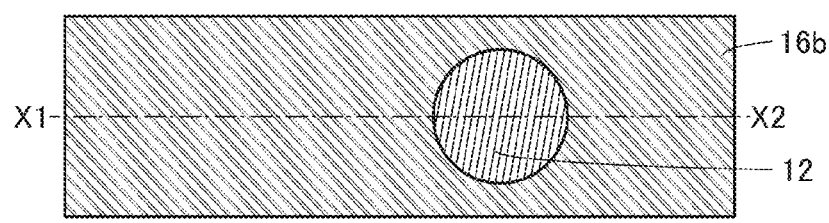

Next, the insulator 14a is etched using the hard mask 16b, so that an insulator 14b having an opening 13c is obtained (see FIGS. 2A and 2B). The etching is performed so that a top surface of the conductor 12 is exposed in the opening 13c. Note that dry etching is preferable as the etching. A dry etching apparatus similar to the one described above can be used.

The opening 13c is a via hole where a plug is provided and is required to have a high aspect ratio in many cases. Thus, an anisotropic dry etching is preferably used for formation of the opening 13c. In addition, disappearance of a mask in etching can be prevented because the hard mask 16b is used for formation of the opening 13c; thus, a fine opening 13c with high aspect ratio can be formed.

The shape of the opening 13c that is seen from above is, but not limited to, circular; the shape seen from above can alternatively be, for example, an elliptical shape or a polygonal shape such as a triangle or a quadrangle. In the case where a polygonal shape is employed, corners thereof may be rounded. The opening 13c may have a shape where a lower (on the conductor 12 side) cross section is smaller than an upper (on the hard mask 16b side) cross section. The conductor 20b, which is formed in later step, may change its shape in accordance with the shape of the opening 13c.

When the opening 13c is formed, a by-product is sometimes formed on the side wall of the opening 13c by etching reaction. In that case, the by-product is preferably removed by plasma treatment (such as ashing treatment) in an oxygen-containing atmosphere after the opening 13c is formed. The above-described dry etching apparatus can be used for the plasma treatment in an oxygen-containing atmosphere.

Figure 2C:
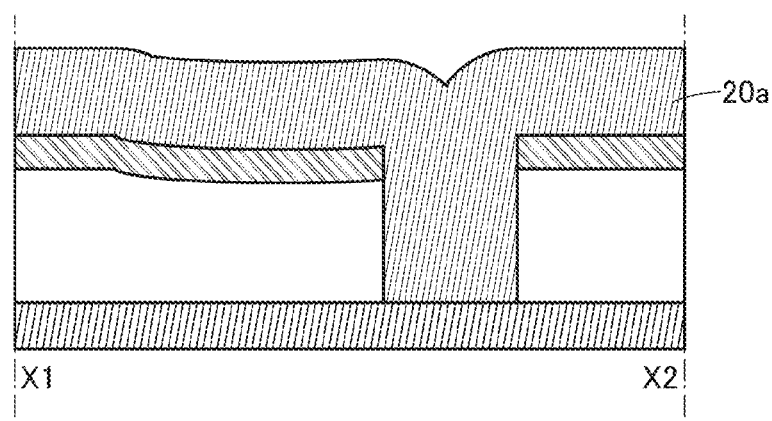
Figure 2D:
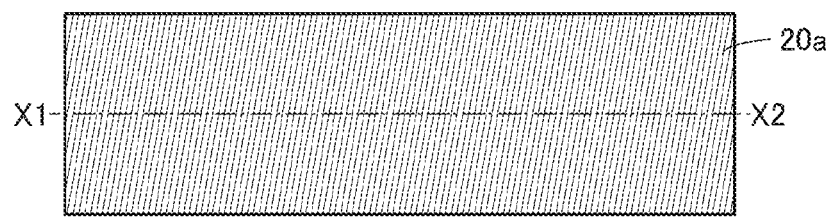

Next, the conductor 20a embedded in the openings 13b and 13c is formed (see FIGS. 2C and 2D). The conductor 20a can be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. The conductor 20a can be formed by a sputtering method, a CVD method, an MBE method, a PLD method, an ALD method, or the like. A CVD method (an MCVD method, in particular) is preferable because the conductor 20a is formed so as to be embedded in the openings 13b and 13c.

Figure 3A:
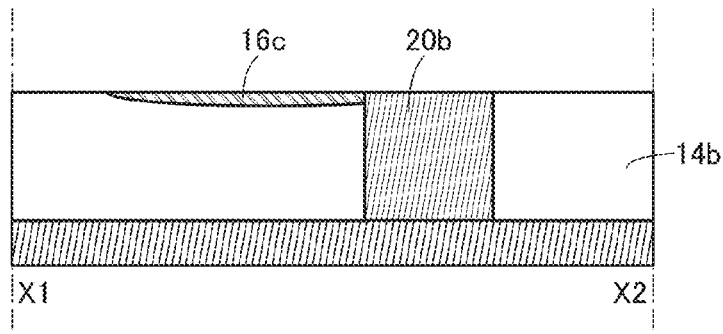
FIGS. 3A to 3D are cross-sectional views and top views illustrating the method for manufacturing a semiconductor device of one embodiment of the present invention.
Figure 3B:
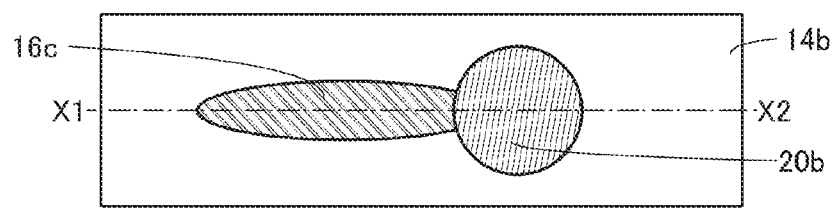

Next, the hard mask 16b and the conductor 20a are subjected to polishing treatment, so that the conductor 20b embedded in the opening 13c is obtained (see FIGS. 3A and 3B). As the polishing treatment, mechanical polishing, chemical polishing, chemical mechanical polishing (CMP), or the like is performed. For example, the CMP treatment can remove the conductor 20a over the insulator 14b and the hard mask 16b. As a result, the conductor 20a is left only in the opening 13c in the insulator 14b, so that the conductor 20b with a flat top surface is obtained.

In the case where a top surface of the insulator 14b is not sufficiently flat, a hard mask residue 16c sometimes remains in a depressed portion on the top surface of the insulator 14b as shown in FIGS. 3A and 3B. Although a top surface of the hard mask residue 16c is aligned with the top surface of the insulator 14b in FIGS. 3A and 3B, they are not necessarily aligned with each other. The top surface of the hard mask residue 16c is sometimes higher or lower than the top surface of the insulator 14b.

Next, the conductor 22a is formed over the insulator 14b and the conductor 20b. The conductor 22a can be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. The conductor 22a can be formed by a sputtering method, a CVD method, an MBE method, a PLD method, an ALD method, or the like.

As described above, a material which can be etched with the etching gas for the hard mask 16b is used for the conductor 22a. Thus, the hard mask 16a and the conductor 22a preferably contain the same kind of metal element. When the hard mask 16a has the structure in which an insulator is formed over the conductor, the conductor and the conductor 22a preferably contain the same kind of metal element.

In the case where the conductor 22a has a stacked-layer structure of a plurality of conductors, a conductor in the lowest layer of the conductor 22a is etched with the etching gas which is used for the hard mask 16b. For this reason, the conductor in the lowest layer of the conductor 22a preferably contains the same kind of metal element as the hard mask 16a.

Figure 3C:
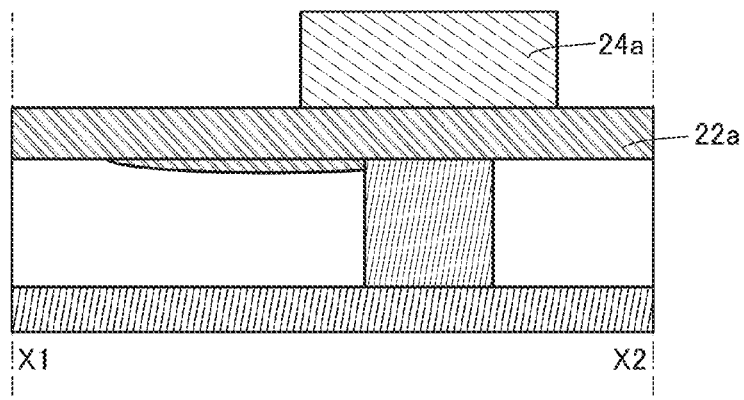
Figure 3D:
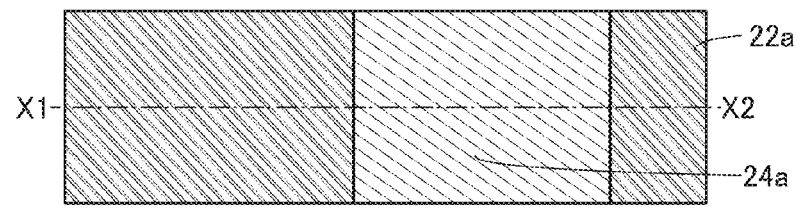

Next, a resist mask 24a is formed in a pattern over the conductor 22a (see FIGS. 3C and 3D). The resist mask 24a can be formed by a lithography method or the like.

Figure 4A:
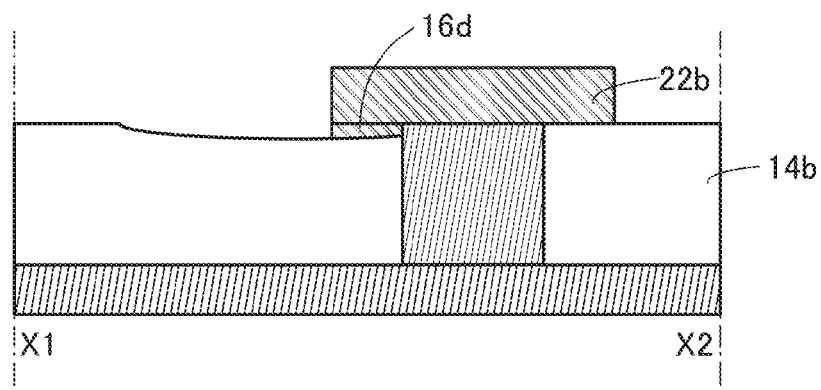
FIGS. 4A and 4B are cross-sectional views and top views illustrating the method for manufacturing a semiconductor device of one embodiment of the present invention.
Figure 4B:
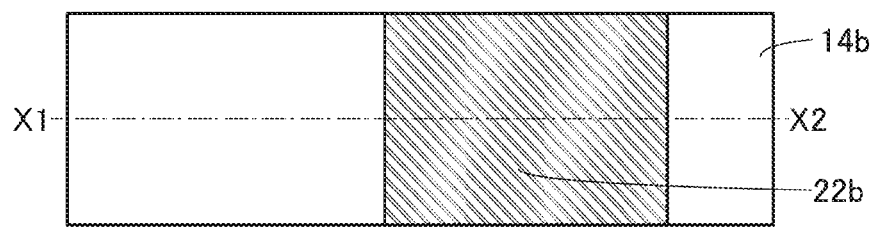

The conductor 22a is etched using the resist mask 24a, so that the conductor 22b is obtained (see FIGS. 4A and 4B). The etching is performed so that the top surface of the insulator 14b is exposed at a region not overlapping with the resist mask 24a. Note that dry etching is preferably employed for the etching. As a dry etching apparatus, an apparatus similar to that described above can be used.

A side surface of the conductor 22b is substantially perpendicular to the top surface of the insulator 14b in FIG. 4A; however, the semiconductor device in this embodiment is not limited thereto. For example, the conductor 22b may have a tapered shape in which its side surface is inclined at an angle larger than or equal to 30° and smaller than 90° to the top surface of the insulator 14b.

The resist mask 24a is preferably removed after the etching. The resist mask 24a can be removed by a method similar to the method for removing the resist mask 18.

Note that an etching gas which can etch both of the conductor 22a and the hard mask residue 16c is used in the dry etching. Etching conditions, such as power applied to electrodes of the dry etching apparatus, the flow rate of the etching gas, and pressure, are also adjusted appropriately so that both of the conductor 22a and the hard mask residue 16c can be etched.

The region of the hard mask residue 16c not overlapping with the resist mask 24a is removed together with the formation of the conductor 22b, so that a hard mask residue 16d remains only in a region overlapping with the conductor 22b. Note that the hard mask residue 16c is thoroughly removed if there is no hard mask residue 16c in the region overlapping with the resist mask 24a.

Figure 5A:
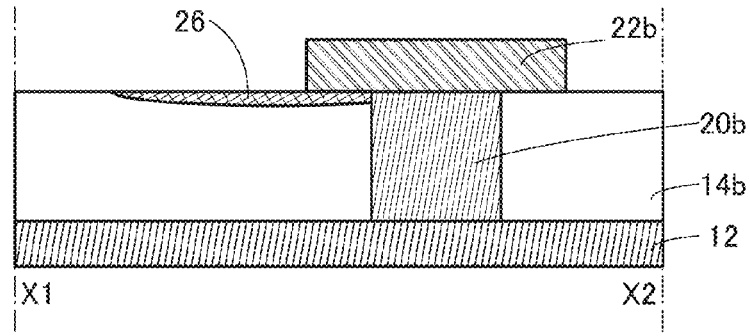
FIGS. 5A to 5D are cross-sectional views and a top view illustrating a conventional semiconductor device
Figure 5B:
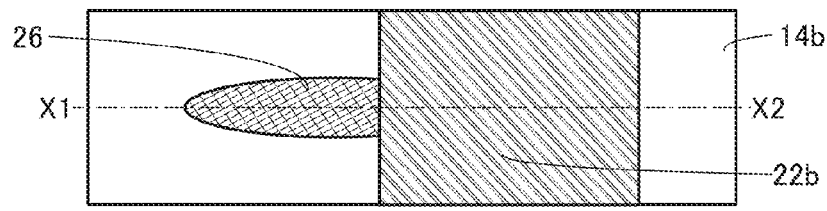

The hard mask residue 26 remains on the top surface of the insulator 14b as shown in FIGS. 5A and 5B when a hard mask which is difficult to etch with the etching gas used for etching of the conductor 22a is used, for example.

Figure 5C:
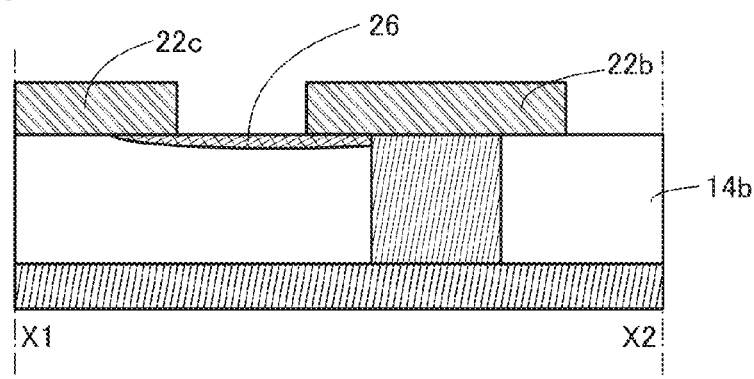
Figure 5D:
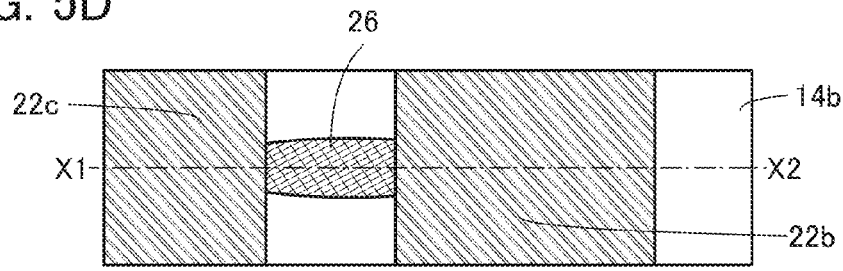

There is a possibility of a short circuit between the conductors 22b and 22c serving as wirings in one layer when the hard mask residue 26 remains on the top surface of the insulator 14b as shown in FIGS. 5C and 5D. There is a strong possibility of the leakage between wirings particularly when an integrated circuit in which the distance between wirings is reduced based on the process rule is manufactured.

However, the hard mask residue 16d can be prevented from remaining on the top surface of the insulator 14b as shown in FIGS. 4A and 4B when the wiring and the plug are formed by the manufacturing method of a semiconductor device described in this embodiment. This can prevent a short circuit between wirings via a hard mask residue in the semiconductor device in this embodiment.

In this manner, leakage between wirings can be prevented in the semiconductor device in this embodiment even in an integrated circuit whose process rule is smaller. In addition, the wiring (the conductor 22b) can be formed at the same time as the removal of the hard mask residue 16c as shown in FIGS. 4A and 4B: thus, the semiconductor device can be manufactured without an increase in the number of steps for removing a hard mask residue.

Note that an insulator may be formed over the conductor 22b so that the conductor 22b can be embedded in the insulator. The insulator may be subjected to polishing treatment such as CMP treatment so that a top surface of the conductor 22b can be exposed at a top surface of the insulator.

The method for forming a wiring and a plug described in this embodiment is not limited to that described above. A method for forming a wiring and a plug which is different from the above-described method is described below.

The method for forming a wiring and a plug that is different from that described above is described with reference to FIGS. 6A to 6D. Note that a process up to the step shown in FIGS. 2A and 2B is similarly performed as the above method.

Figure 6A:
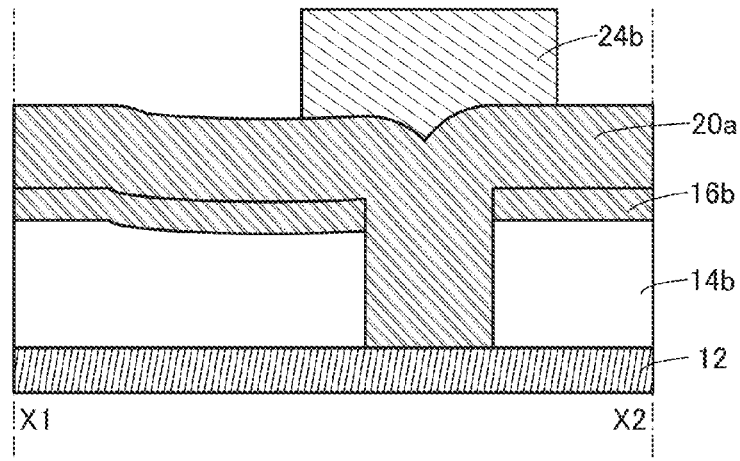
FIGS. 6A to 6D are cross-sectional views and top views illustrating the method for manufacturing a semiconductor device of an embodiment of the present invention.
Figure 6B:
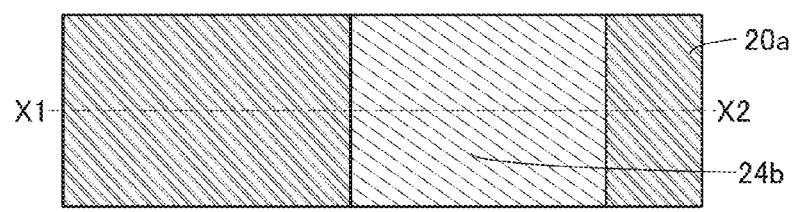

After the process shown in FIGS. 2A and 2B, the conductor 20a embedded in the openings 13b and 13c is formed (see FIGS. 6A and 6B). Note that the conductor 20a may have a single-layer structure or a stacked structure. The conductor 20a can be formed by a sputtering method, a CVD method, an MBE method, a PLD method, an ALD method, or the like.

A material which can be etched with the etching gas for the hard mask 16b is used for the conductor 20a. Thus, the hard mask 16a and the conductor 20a preferably contain the same kind of metal element. In the case where the conductor 20a has a stacked-layer structure of a plurality of conductors, a conductor in the lowest layer of the conductor 20a is etched with the etching gas which is used for the hard mask 16b. For this reason, the conductor in the lowest layer of the conductor 20a preferably contains the same kind of metal element as the hard mask 16a.

Next, a resist mask 24b is formed in a pattern over the conductor 20a (see FIGS. 6A and 6B). The resist mask 24b can be formed by a lithography method or the like.

Figure 6C:
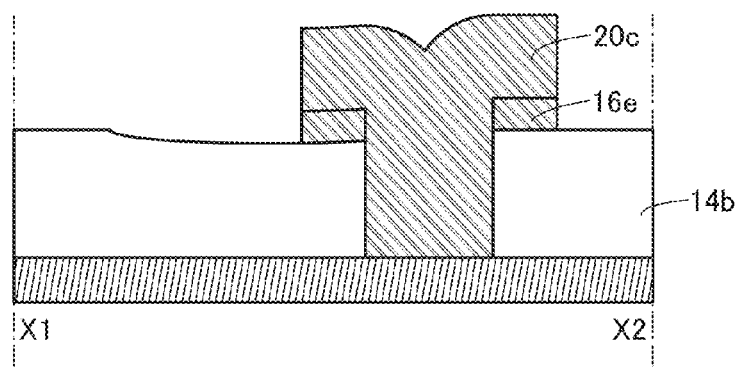
Figure 6D:
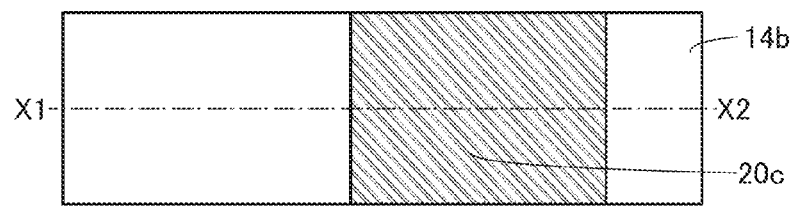

Next, the conductor 20a is etched using the resist mask 24b, so that a conductor 20c is obtained (see FIGS. 6C and 6D). The etching is performed so that the top surface of the insulator 14b is exposed at a region not overlapping with the resist mask 24b. Note that dry etching is preferably employed for the etching. As a dry etching apparatus, an apparatus similar to that described above can be used.

Note that the resist mask 24b is preferably removed after the etching. The resist mask 24b can be removed by a method similar to the method for removing the resist mask 18.

Note that an etching gas which can etch both of the conductor 20a and the hard mask 16b is used in the dry etching. Etching conditions, such as power applied to electrodes of the dry etching apparatus, the flow rate of the etching gas, and pressure, are also adjusted appropriately so that both of the conductor 20a and the hard mask 16b can be etched.

The region of the hard mask 16b not overlapping with the resist mask 24b is removed together with the formation of the conductor 20c, so that a hard mask residue 16e remains only in a region overlapping with the conductor 20c. The hard mask residue 16e can be prevented from remaining on the top surface of the insulator 14b as shown in FIGS. 6C and 6D. As a result, a short circuit between wirings via a hard mask residue can be prevented in the semiconductor device in this embodiment.

In this manner, leakage between wirings can be prevented in the semiconductor device in this embodiment even in an integrated circuit whose process rule is smaller. In addition, the wiring (the conductor 20c) can be formed at the same time as the removal of the hard mask 16b as shown in FIGS. 6C and 6D: thus, the semiconductor device can be manufactured without an increase in the number of steps for removing a hard mask.

The method for forming a wiring and a plug that is different from that described above is described with reference to FIGS. 7A to 7D. Note that a process up to the step shown in FIGS. 3A and 3B is similarly performed as the above method. Note that materials of the conductor 20a and the hard mask 16a are selected so that the conductor 20a is not etched with the etching gas for the hard mask 16a.

Figure 7A:
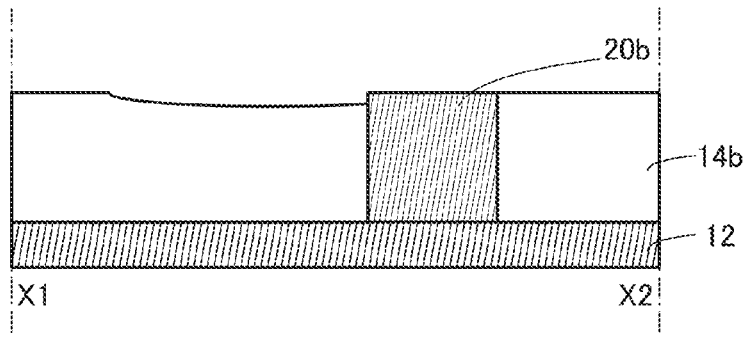
FIGS. 7A to 7D are cross-sectional views and top views illustrating the method for manufacturing a semiconductor device of one embodiment of the present invention.
Figure 7B:
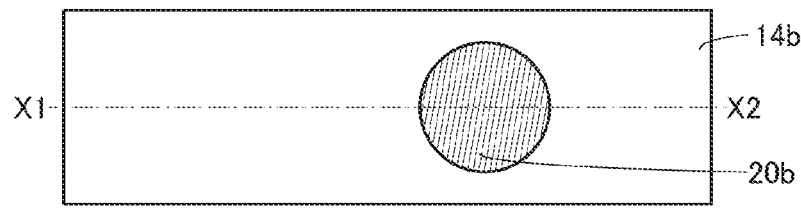

After the process shown in FIGS. 3A and 3B, slight etching is performed on the surface of the insulator 14b to remove the hard mask residue 16c (see FIGS. 7A and 7B). The slight etching is performed preferably under the condition that the etching rate of the hard mask residue 16c is sufficiently higher than that of the conductor 20b. Note that dry etching or wet etching is preferable as the slight etching. As a dry etching apparatus, an apparatus similar to that described above can be used.

Such a method can remove the hard mask residue 16c which remains on the top surface of the insulator 14b.

Next, the conductor 22a is formed over the insulator 14b and the conductor 20b. The conductor 22a may have either a single-layer structure or a stacked-layer structure. The conductor 22a can be formed by a sputtering method, a CVD method, an MBE method, a PLD method, an ALD method, or the like.

Figure 7C:
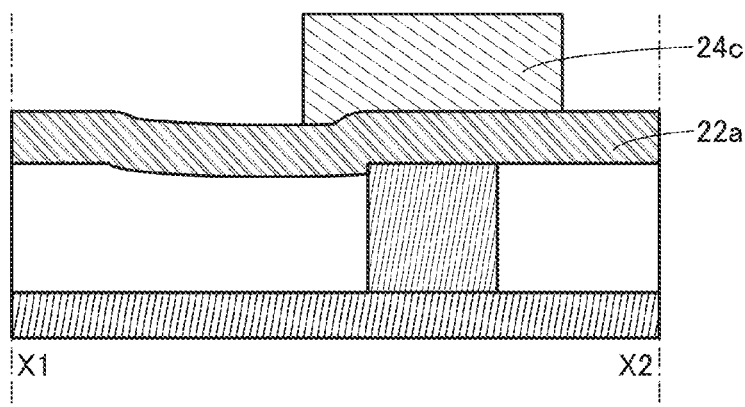
Figure 7D:

Next, a resist mask 24c is formed in a pattern over the conductor 22a (see FIGS. 7C and 7D). The resist mask 24c can be formed by a lithography method or the like.

Figure 8A:
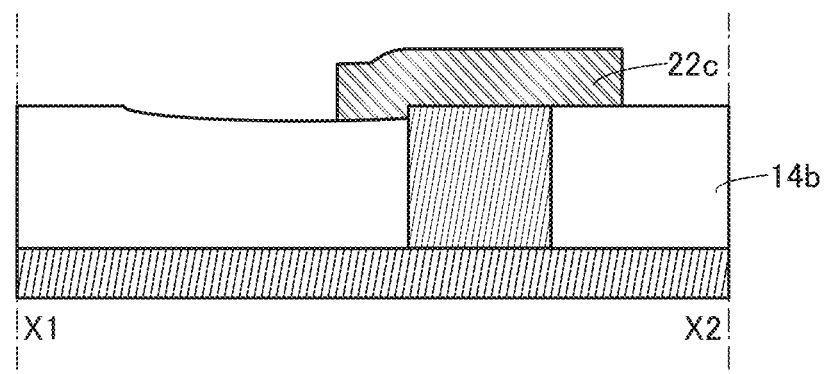
FIGS. 8A and 8B are a cross-sectional view and a top view illustrating the method for manufacturing a semiconductor device of one embodiment of the present invention.
Figure 8B:
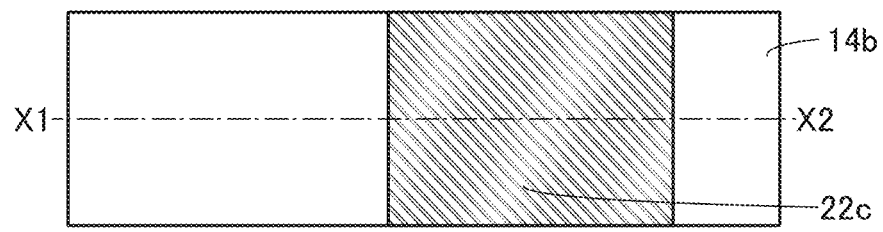

Next, the conductor 22a is etched using the resist mask 24c, so that a conductor 22c is obtained (see FIGS. 8A and 8B). Note that dry etching is preferably employed for the etching. As a dry etching apparatus, an apparatus similar to that described above can be used.

Note that the resist mask 24c is preferably removed after the etching. The resist mask 24c can be removed by a method similar to the method for removing the resist mask 18.

The leakage between wirings can be suppressed when the wiring (the conductor 22c) is formed over the insulator 14b where the hard mask residue is removed.

<Structure of Element Layer>

An element layer including the wiring and the plug in a semiconductor device according to one embodiment of the present invention will be described with reference to FIGS. 9A to 9D and FIGS. 10A and 10B.

The structure of an element layer 30 which includes a transistor including a semiconductor film is described with reference to a schematic view of FIG. 9A. Note that the semiconductor film basically means, but not limited to, an oxide semiconductor and can include various semiconductors.

In the element layer 30, a conductor 31 is embedded in an insulator 34 which is formed in the upper layer. The conductor 31 is connected to a transistor including a semiconductor film and included in the element layer 30. A top surface of the conductor 31 is approximately flush with a top surface of the insulator 34. A conductor 32 is formed over the insulator 34. The conductor 32 is in contact with the top surface of the conductor 31. The hard mask residue 36 remains in a depressed portion of the top surface of the insulator 34 overlapping with the conductor 32.

Figure 9A:
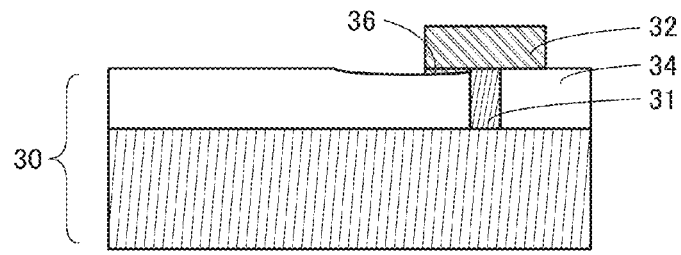
FIGS. 9A to 9D are schematic views illustrating structures of a semiconductor device of one embodiment of the present invention.

The structure on the upper side of the element layer 30 shown in FIG. 9A corresponds to the structure of the wiring and the plug shown in FIGS. 4A and 4B. In other words, the insulator 34, the conductor 31, the conductor 32, and the hard mask residue 36 correspond respectively to the insulator 14b, the conductor 20b, the conductor 22b, and the hard mask residue 16d.

As described above, the wiring and the plug are connected to the transistor including a semiconductor film. An example of the structure of the transistor including a semiconductor film will be described below. Although the wiring and the plug shown in FIGS. 4A and 4B are used in FIG. 9A, a wiring and a plug shown in FIGS. 6C and 6D or FIGS. 8A and 8B may be used.

Figure 9B:
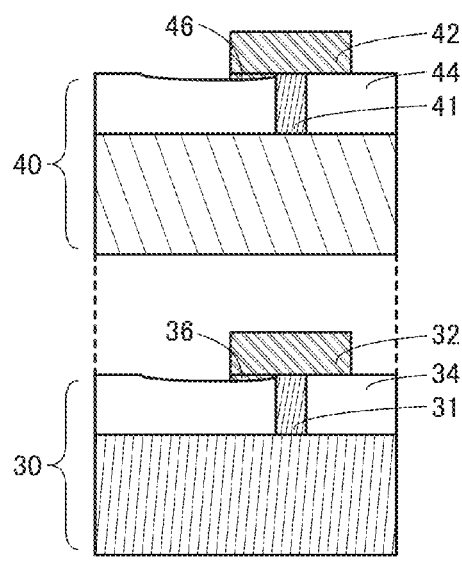

FIG. 9B shows a structure in which an element layer 40 including a capacitor is provided over the element layer 30. A wiring and a plug on the upper side of the element layer 40 are connected to the capacitor. An example of the structure of the capacitor will be described below. Note that the upper structure of the element layer 40 is similar to that of the element layer 30.

The upper structure of the element layer 40 corresponds to the structure of the wiring and the plug shown in FIGS. 4A and 4B. In other words, the insulator 44, the conductor 41, the conductor 42, and the hard mask residue 46 correspond respectively to the insulator 14b, the conductor 20b, the conductor 22b, and the hard mask residue 16d.

Although the element layers 30 and 40 are apart from each other in FIG. 9B, the conductor 32 may be included in the element layer 30 and serve as a wiring, an electrode, or the like. Another element layer or wiring layer may be formed between the element layers 30 and 40. Although the conductor 41 serving as a plug is embedded in the insulator 44 in FIG. 9B, it may pass through the element layer 40. For example, the conductor 41 serving as a plug may pass through the element layer 40 to reach the element layer 30.

Figure 9C:
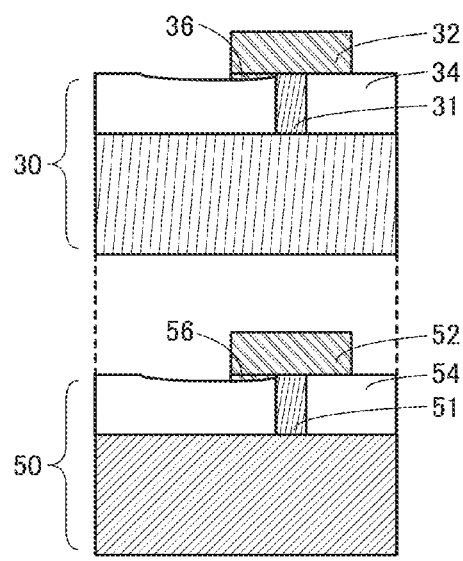

FIG. 9C shows a structure in which the element layer 30 is provided over an element layer 50 including a transistor over a semiconductor substrate. A wiring and a plug on the upper side of the element layer 50 are connected to the transistor over the semiconductor substrate. An example of the structure of the transistor over the semiconductor substrate will be described below. Note that the upper structure of the element layer 50 is similar to that of the element layer 30.

The upper structure of the element layer 50 corresponds to the structure of the wiring and the plug shown in FIGS. 4A and 4B. In other words, the insulator 54, the conductor 51, the conductor 52, and the hard mask residue 56 correspond respectively to the insulator 14b, the conductor 20b, the conductor 22b, and the hard mask residue 16d.

Although the element layers 50 and 30 are apart from each other in FIG. 9C, the conductor 52 may be included in the element layer 30 and serve as a wiring, an electrode, or the like. Another element layer or wiring layer may be formed between the element layers 50 and 30. Although the conductor 31 serving as a plug is embedded in the insulator 34 in FIG. 9C, it may pass through the element layer 30. For example, the conductor 31 serving as a plug may pass through the element layer 30 to reach the element layer 50.

Figure 9D:
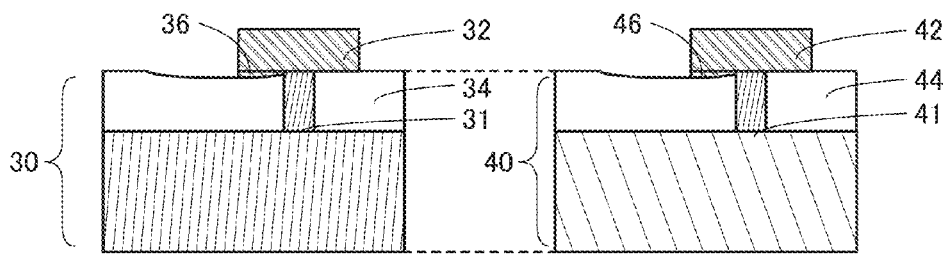

The element layers 30 and 40 may be formed in one layer as shown in FIG. 9D. In that case, the conductors 32 and 42 may be combined into one to serve as one conductor.

As shown in FIG. 10A, the element layer 30 may be provided over the electrode layer 50, and the element layer 40 may be provided over the element layer 30.

Although the element layer 30 is apart from the element layers 40 and 50 in FIG. 10A, the conductor 52 (or the conductor 32) in the lower layer may be included in the element layer 30 (or the element layer 40) and serve as a wiring, an electrode, or the like. Another element layer or wiring layer may be formed between the element layers 30, 40, and 50. Although the conductor 41 (or the conductor 31) serving as a plug is embedded in the insulator 44 (or the insulator 34) in FIG. 10A, it may pass through the element layer 40 (or the element layer 30). For example, the conductor 41 (or the conductor 31) serving as a plug may pass through the element layer 40 (or the element layer 30) to reach the element layer 30 (or the element layer 50).

Although the element layer 30 is provided over the element layer 50 and the element layer 40 is provided over the element layer 30 in FIG. 10A, the semiconductor device in this embodiment is not limited thereto. For example, a structure shown in FIG. 10B in which the element layer 40 is provided over the electrode layer 50 and the element layer 30 is provided over the element layer 40 may be used.

The wirings and plugs included in the element layers 30, 40, and 50 can be formed by the method shown in FIGS. 1 to 4, for example. For example, when the semiconductor device shown in FIG. 9C is fabricated, the conductors 51 and 52 included in the element layer 50 are formed by the method shown in FIGS. 1 to 4, an oxide semiconductor included in the element layer 30 is formed, and the conductors 31 and 32 included in the element layer 30 are formed by the method shown in FIGS. 1 to 4.

Note that high-temperature heat treatment is preferably performed when a transistor including the oxide semiconductor included in the element layer 30 is formed. In view of this, a conductor with high heat resistance, such as metal with a high melting point, is preferably used as the conductor 52 which is formed below the element layer 30. In contrast, a conductor with low heat resistance, such as metal with a low melting point, can be used as the conductor 32 which is formed over the element layer 30 because the conductor 32 is not subjected to high-temperature heat treatment. Note that the same as the element layer 30 can be applied to the element layer 40 because high-temperature heat treatment may be necessary when the element layer 40 is formed.

In other words, when conductors used for wirings are changed depending on the element layer, conductors used for hard masks for the element layers are changed accordingly. For example, when metal with a high melting point is used for a wiring of the element layer 50, metal with a high melting point is preferably used also for a hard mask used for forming the wiring. Accordingly, metal with a high melting point is contained also in the hard mask residue 56 formed on the element layer 50. In contrast, when metal with a low melting point is used for a wiring of the element layer 30, metal with a low melting point is preferably used also for a hard mask used for forming the wiring. Accordingly, metal with a low melting point is contained also in the hard mask residue 36 formed on the element layer 30.

As described above, hard mask residues formed on different element layers in one semiconductor device contain different conductors in some cases.

<Structure of Transistor Including Oxide Semiconductor Film>

Figure 11A:
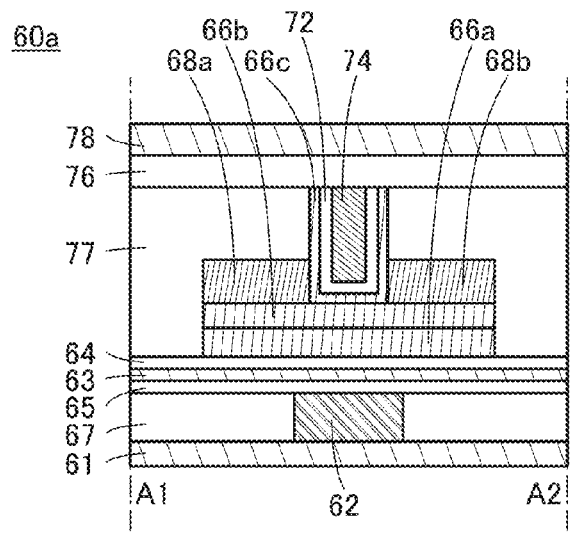
FIGS. 11A to 11D are cross-sectional views illustrating structures of a semiconductor device of one embodiment of the present invention.
Figure 11B:
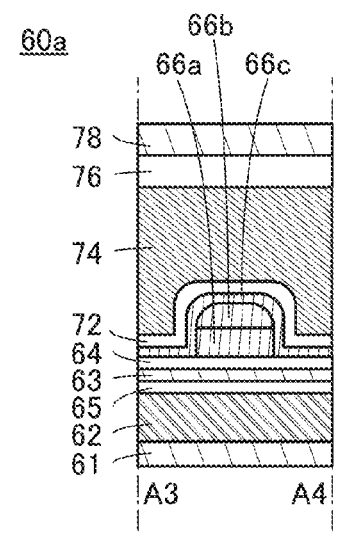

FIGS. 11A and 11B illustrate an example of the structure of a transistor 60a included in the element layer 30. FIG. 11A is a cross-sectional view of the transistor 60a in a channel length direction A1-A2, and FIG. 11B is a cross-sectional view of the transistor 60a in a channel width direction A3-A4. Note that in this specification, the channel length direction of a transistor means the direction in which carriers move between a source (source region or source electrode) and a drain (drain region or drain electrode) in a plane parallel to the substrate, and the channel width direction means the direction perpendicular to the channel length direction in the plane parallel to a substrate.

In the cross-sectional views such as FIGS. 11A and 11B, end portions of some of patterned conductors, semiconductors, and insulators have right-angled corners; however, the semiconductor device in this embodiment is not limited thereto and can have rounded end portions.

The transistor 60a includes a conductor 62, an insulator 65, an insulator 63, an insulator 64, an insulator 66a, a semiconductor 66b, a conductor 68a, a conductor 68b, an insulator 66c, an insulator 72, and a conductor 74. Here, the conductor 62 serves as a back gate of the transistor 60a, and the insulator 65, the insulator 63, and the insulator 64 serve as gate insulating films for the back gate of the transistor 60a. The conductor 68a and the conductor 68b serve as a source and a drain of the transistor 60a. The insulator 72 serves as a gate insulating film of the transistor 60a, and the conductor 74 serves as a gate of the transistor 60a.

Note that as the details are described later, the insulator 66a and the insulator 66c are each sometimes formed using a substance that can function as a conductor, a semiconductor, or an insulator when they are used alone. However, when the transistor is formed using a stack including the insulator 66a, the semiconductor 66b, and the insulator 66c, electrons flow in the semiconductor 66b, in the vicinity of the interface between the semiconductor 66b and the insulator 66a, and in the vicinity of the interface between the semiconductor 66b and the insulator 66c; thus, the insulator 66a and the insulator 66c have a region not functioning as a channel of the transistor. For that reason, in this specification and the like, the insulator 66a and the insulator 66c are not referred to as conductors or semiconductors but referred to as insulators or oxide insulators.

In this embodiment and the like, the term "insulator" can be replaced with the term "insulating film" or "insulating layer". In addition, the term "conductor" can be replaced with the term "conductive film" or "conductive layer". Moreover, the term "semiconductor" can be replaced with the term "semiconductor film" or "semiconductor layer".

In a portion below the transistor 60a, an insulator 67 having an opening is provided over the insulator 61. The conductor 62 is embedded in the opening. At least part of the conductor 62 overlaps with the insulator 66a, the semiconductor 66b, and the insulator 66c. The insulator 65 is provided over and in contact with the conductor 62 and covers a top surface of the conductor 62. The insulator 63 is provided over the insulator 65. The insulator 64 is provided over the insulator 63.

Here, it is preferable that one end of the conductor 62 in the channel length direction overlap with part of the conductor 68a and the other end of the conductor 62 in the channel length direction overlap with part of the conductor 68b. The conductor 62 provided as described above can sufficiently overlap with a region in the semiconductor 66b which is between the conductor 68a and the conductor 68b, that is, a channel formation region of the semiconductor 66b. Accordingly, with the use of the conductor 62, the threshold voltage of the transistor 60a can be controlled more effectively.

The insulator 66a is provided over the insulator 64. The semiconductor 66b is provided in contact with at least part of the top surface of the insulator 66a. Although end portions of the insulator 66a and the semiconductor 66b are substantially aligned in FIGS. 11A and 11B, the structure of the semiconductor device described in this embodiment is not limited to this example.

The conductor 68a and the conductor 68b are formed in contact with at least part of a top surface of the semiconductor 66b. The conductor 68a and the conductor 68b are apart from each other. It is preferable that they face each other with the conductor 74 provided therebetween as illustrated in FIG. 11A.

An insulator 77 is provided over the insulator 64, the conductor 68a, and the conductor 68b.

The insulator 66c is provided in contact with at least part of the top surface of the semiconductor 66b. The insulator 66c is preferably in contact with part of the top surface of the semiconductor 66b in the opening formed in the insulator 77 and the conductors 68a and 68b.

The insulator 72 is provided over the insulator 66c. The insulator 72 is preferably in contact with part of a top surface of the insulator 66c in the opening formed in the insulator 77 and the conductors 68a and 68b.

The conductor 74 is provided over the insulator 72. The conductor 74 is preferably in contact with part of the top surface of the insulator 72 in the opening formed in the insulator 77 and the conductors 68a and 68b. Note that in FIG. 11A, the side surfaces of the insulator 66c, the insulator 72, and the conductor 74 are substantially perpendicular to the top surface of the semiconductor 66b; however, the semiconductor device in this embodiment is not limited thereto. For example, the insulator 66c, the insulator 72, and the conductor 74 may each have a tapered shape in which the side surface is inclined at an angle larger than or equal to 30° and smaller than 90° to the top surface of the semiconductor 66b.

Note that the conductor 74 may be connected to the conductor 62 through an opening formed in the insulator 72, the insulator 66c, the insulator 64, the insulator 63, the insulator 65, and the like.

The insulator 76 is provided over the insulator 77. The insulator 78 is provided over the insulator 76.

The conductor 31 serving as a plug in the element layer 30 shown in FIGS. 9A to 9D and the like is in contact with any of the conductor 62, the conductors 68a and 68b, and the conductor 74 which serve respectively as a backgate, a source and drain, and a gate of a transistor 60a shown in FIG. 11A. In other words, the conductors 62, 68a, 68b, and 74 correspond to the conductor 12 shown in FIG. 4A and the like. Note that the number of the conductor 31 serving as a plug is two or more in some cases.

The insulator 34 included in the element layer 30 shown in FIGS. 9A to 9D and the like corresponds to the stack of the insulators 77, 76, and 78 of the transistor 60a shown in FIG. 11A. In some cases, an insulator formed over the insulator 78 is included in the insulator 34. In some cases, the insulators 65, 63, and 64 are included in the insulator 34.

<Oxide Semiconductor>

An oxide semiconductor used as the semiconductor 66b is described below.

The oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Next, preferred ranges of atomic ratios of indium to the element M and zinc in the oxide semiconductor according to the present invention will be described with reference to FIGS. 20A to 20C. Note that the proportion of oxygen atoms is not illustrated in FIGS. 20A to 20C. The terms of the atomic ratio of indium to the element M and zinc in the oxide semiconductor are denoted by [In], [M], and [Zn], respectively.

Figure 20A:
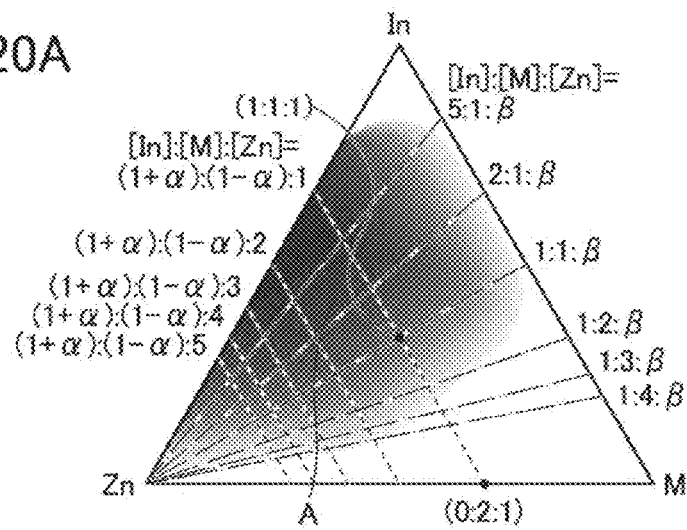
FIGS. 20A to 20C each illustrate an atomic ratio range of an oxide semiconductor of one embodiment of the present invention.
Figure 20B:
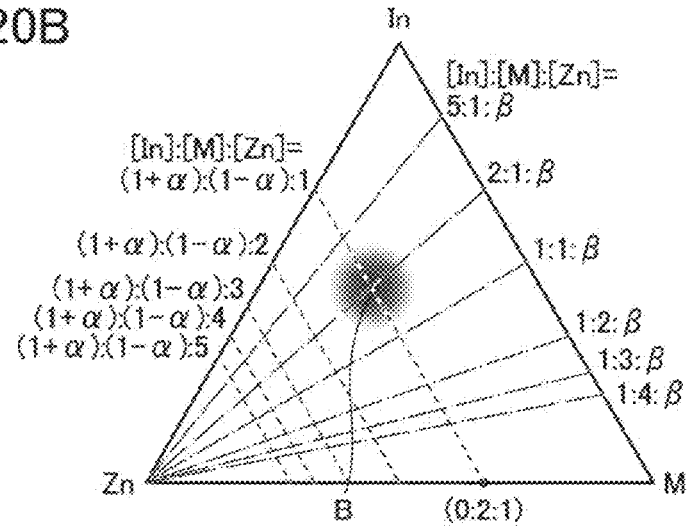
Figure 20C:
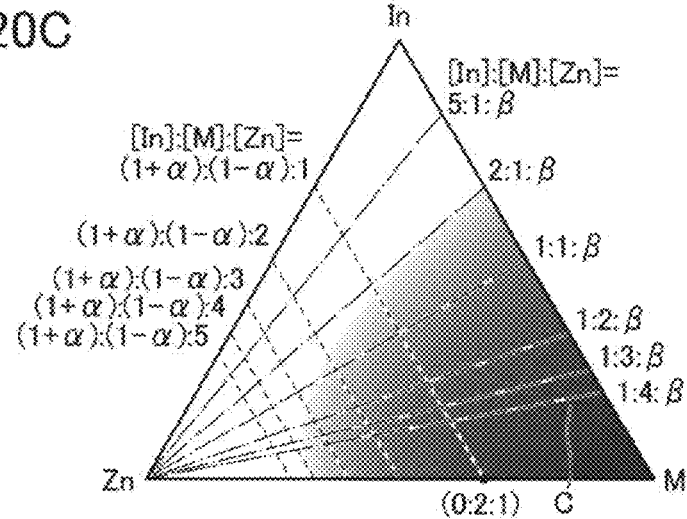

In FIGS. 20A to 20C, dashed lines correspond to a line representing the atomic ratio of $[In]:[M]:[Zn]=(1+\alpha):(1-\alpha):1$ $(-1\leq\alpha\leq1)$, a line representing the atomic ratio of $[In]:[M]:[Zn]=(1+\alpha):(1-\alpha):2$, a line representing the atomic ratio of $[In]:[M]:[Zn]=(1+\alpha):(1-\alpha):3$, a line representing the atomic ratio of $[In]:[M]:[Zn]=(1+\alpha):(1-\alpha):4$, and a line representing the atomic ratio of $[In]:[M]:[Zn]=(1+\alpha):(1-\alpha):5$.

Dashed-dotted lines correspond to a line representing the atomic ratio of $[In]:[M]:[Zn]=1:1:\beta$ $(\beta\geq0)$, a line representing the atomic ratio of $[In]:[M]:[Zn]=1:2:\beta$, a line representing the atomic ratio of $[In]:[M]:[Zn]=1:3:\beta$, a line representing the atomic ratio of $[In]:[M]:[Zn]=1:4:\beta$, a line representing the atomic ratio of $[In]:[M]:[Zn]=2:1:\beta$, and a line representing the atomic ratio of $[In]:[M]:[Zn]=5:1:\beta$.

An oxide semiconductor having the atomic ratio of $[In]:[M]:[Zn]=0:2:1$ or a neighborhood thereof in FIGS. 20A to 20C tends to have a spinel crystal structure.

FIGS. 20A and 20B illustrate examples of the preferred ranges of the atomic ratios of indium to the element M and zinc contained in an oxide semiconductor in one embodiment of the present invention.

Figure 21:
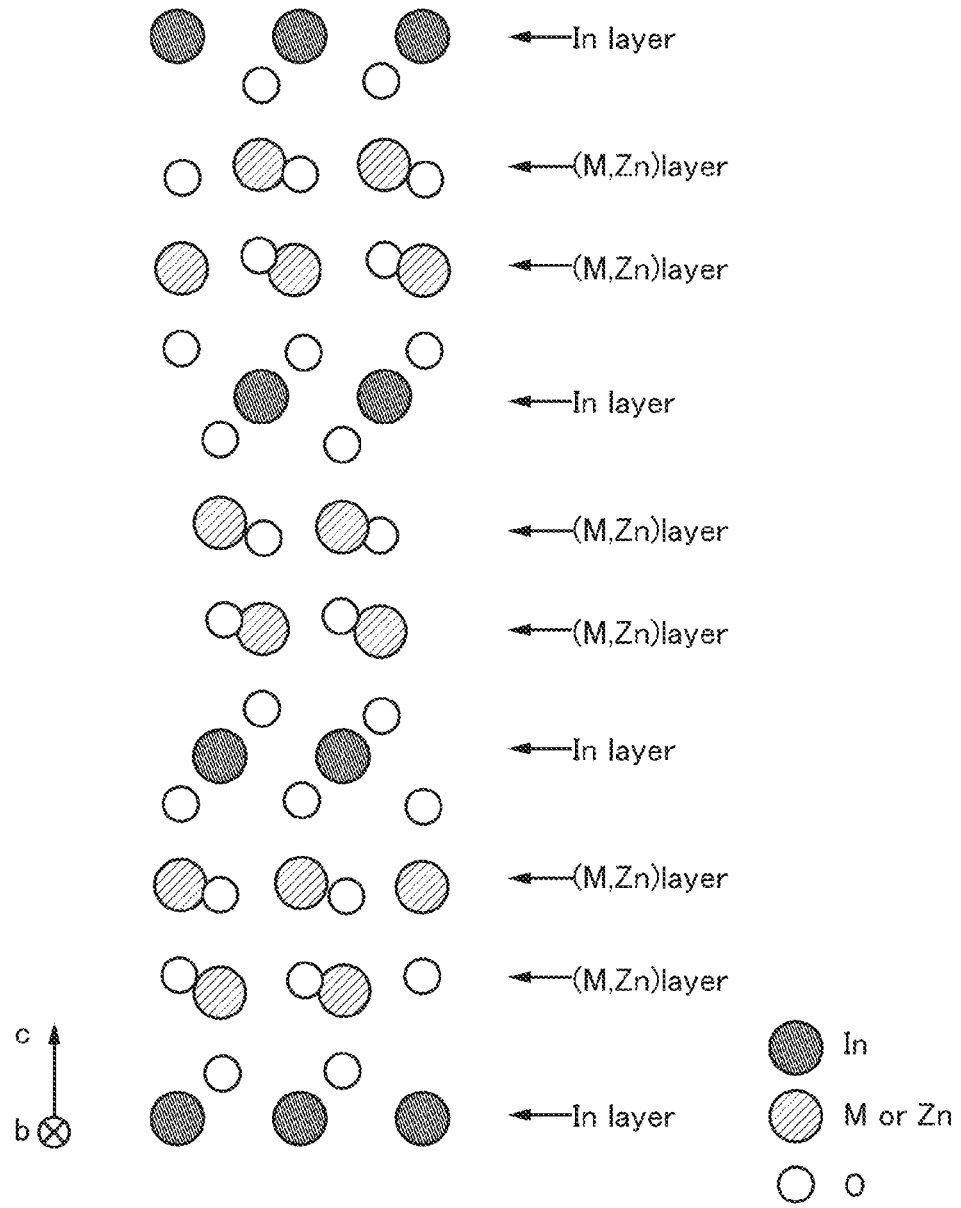
FIG. 21 illustrates an $InMZnO_4$ crystal.

FIG. 21 illustrates an example of the crystal structure of $InMZnO_4$ with an atomic ratio of $[In]:[M]:[Zn]=1:1:1$. The crystal structure illustrated in FIG. 21 is $InMZnO_4$ observed from a direction parallel to a b-axis. Note that a metal element in a layer that contains M, Zn, and oxygen (hereinafter, this layer is referred to as an "(M,Zn) layer") in FIG. 21 represents the element M or zinc. In that case, the proportion of the element M is the same as the proportion of zinc. The element M and zinc can be replaced with each other, and their arrangement is random.

Note that $InMZnO_4$ has a layered crystal structure (also referred to as a layered structure) and includes one layer that contains indium and oxygen (hereinafter referred to as an In layer) for every two (M,Zn) layers that contain the element M, zinc, and oxygen, as illustrated in FIG. 21.

Indium and the element M can be replaced with each other. Therefore, when the element M in the (M,Zn) layer is replaced by indium, the layer can also be referred to as an (In,M,Zn) layer. In that case, a layered structure that includes one In layer for every two (In,M,Zn) layers is obtained.

An oxide with an atomic ratio of $[In]:[M]:[Zn]=1:1:2$ has a layered structure that includes one In layer for every three (M,Zn) layers. In other words, if [Zn] is larger than [In] and [M], the proportion of (M,Zn) layers to In layers becomes higher when the oxide is crystallized.

Note that in the case where the number of (M,Zn) layers for every In layer is not an integer in the oxide, the oxide might have a plurality of kinds of layered structures where the number of (M,Zn) layers for every In layer is an integer. For example, in the case of $[In]:[M]:[Zn]=1:1:1.5$, the oxide might have the following layered structures: a layered structure that includes one In layer for every two (M,Zn) layers and a layered structure that includes one In layer for every three (M,Zn) layers.

For example, in the case where the oxide is deposited with a sputtering apparatus, a film having an atomic ratio deviated from the atomic ratio of a target is formed. In particular, [Zn] in the film might be smaller than [Zn] in the target depending on the substrate temperature in deposition.

In some cases, a plurality of phases (two, three, or more phases) coexist in the oxide semiconductor. For example, in the case of the atomic ratio of $[In]:[M]:[Zn]=0:2:1$ or a neighborhood thereof, two phases, i.e., a spinel crystal structure and a layered crystal structure, tend to coexist. In the case of the atomic ratio of $[In]:[M]:[Zn]=1:0:0$ or a neighborhood thereof, two phases, i.e., a bixbyite crystal structure and a layered crystal structure, tend to coexist. In the case where a plurality of phases coexist in an oxide semiconductor, a grain boundary might be formed between different crystal structures.

In addition, an oxide semiconductor containing indium in a higher proportion can have higher carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of In atoms are increased; therefore, an oxide semiconductor having a high content of indium has higher carrier mobility than an oxide semiconductor having a low content of indium.

In contrast, when the indium content and the zinc content in an oxide semiconductor become lower, carrier mobility becomes lower. Thus, with an atomic ratio of $[In]:[M]:[Zn]=0:1:0$ and neighborhoods thereof (e.g., a region C in FIG. 20C), insulation performance becomes better.

Accordingly, an oxide semiconductor in one embodiment of the present invention preferably has an atomic ratio represented by a region A in FIG. 20A. With the atomic ratio, a layered structure with high carrier mobility and a few grain boundaries is easily obtained.

A region B in FIG. 20B represents atomic ratios from [In]:[M]:[Zn]=4:2:3 to [In]:[M]:[Zn]=4:2:4.1 and neighborhoods thereof. The neighborhoods include an atomic ratio of [In]:[M]:[Zn]=5:3:4. An oxide semiconductor with an atomic ratio represented by the region B is an excellent oxide semiconductor that has particularly high crystallinity and high carrier mobility.

Note that conditions where a layered structure of an oxide semiconductor is formed are not uniquely determined by the atomic ratio. The atomic ratio affects difficulty in forming a layered structure. Even oxide semiconductors with the same atomic ratio have a layered structure in some cases, but not in others, depending on formation conditions. Therefore, the illustrated regions show atomic ratios at which a layered structure of an oxide semiconductor can be formed; boundaries of the regions A to C are not clear.

Next, the case where the oxide semiconductor is used for a transistor will be described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. For example, an oxide semiconductor whose carrier density is lower than $8 \times 10^{11}/cm^3$, preferably lower than $1 \times 10^{11}/cm^3$, further preferably lower than $1 \times 10^{10}/cm^3$, and greater than or equal to $1 \times 10^{-9}/cm^3$ is used.

A highly purified intrinsic or substantially highly purified intrinsic oxide semiconductor has few carrier generation sources, and thus can have a low carrier density. A highly purified intrinsic or substantially highly purified intrinsic oxide semiconductor has a low density of defect states and accordingly has a low density of trap states in some cases.

Charges trapped by the trap states in the oxide semiconductor take a long time to be released and may behave like fixed charges. Thus, the transistor whose channel region is formed in the oxide semiconductor having a high density of trap states has unstable electrical characteristics in some cases.

To obtain stable electrical characteristics of the transistor, it is effective to reduce the concentration of impurities in the oxide semiconductor. In addition, to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

Here, the influence of impurities in the oxide semiconductor will be described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2 \times 10^{18}$ atoms/cm$^3$, and preferably lower than or equal to $2 \times 10^{17}$ atoms/cm$^3$.

When the oxide semiconductor contains alkali metal or alkaline earth metal, defect states are formed and carriers are generated, in some cases. Thus, a transistor including an oxide semiconductor which contains alkali metal or alkaline earth metal is likely to be normally-on. Therefore, it is preferable to reduce the concentration of alkali metal or alkaline earth metal in the oxide semiconductor. Specifically, the concentration of alkali metal or alkaline earth metal in the oxide semiconductor, which is measured by SIMS, is lower than or equal to $1 \times 10^{18}$ atoms/cm$^3$, preferably lower than or equal to $2 \times 10^{16}$ atoms/cm$^3$.

When the oxide semiconductor contains nitrogen, the oxide semiconductor easily becomes n-type by generation of electrons serving as carriers and an increase of carrier density. Thus, a transistor including an oxide semiconductor which contains nitrogen is likely to be normally-on. For this reason, nitrogen in the oxide semiconductor is preferably reduced as much as possible; the nitrogen concentration measured by SIMS is set, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration measured by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

When an oxide semiconductor with sufficiently reduced impurity concentration is used for a channel formation region in a transistor, the transistor can have stable electrical characteristics.

The case where the semiconductor 66b that is the oxide semiconductor used for the transistor 60a has a two-layer structure or three-layer structure is described below. A band diagram in which insulators are in contact with the stacked-layer structure of the insulator 66a, the semiconductor 66b, and the insulator 66c, and a band diagram in which insulators are in contact with the stacked-layer structure of the semiconductor 66b and the insulator 66c are described using FIGS. 22A and 22B.

Figure 22A:
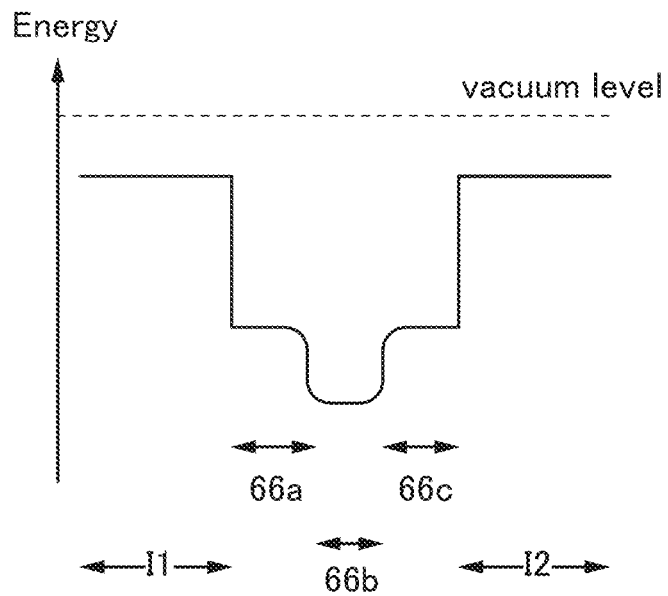
FIGS. 22A and 22B are each a band diagram of a layered structure including an oxide semiconductor.
Figure 22B:
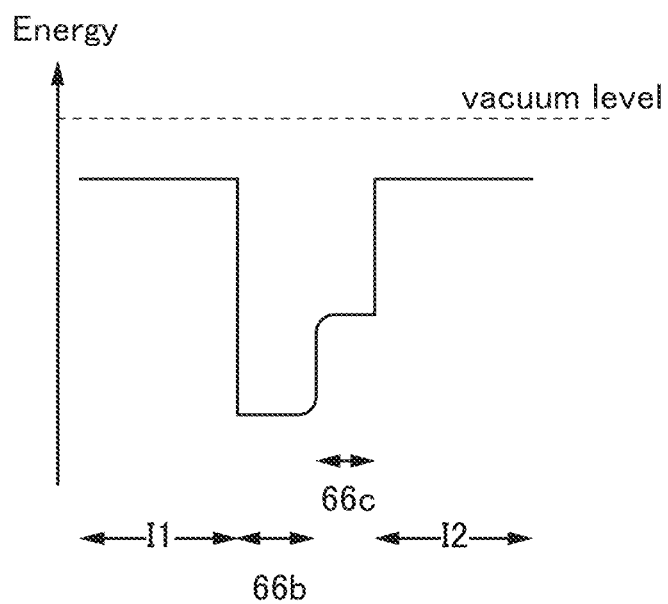

FIG. 22A shows an example of a band diagram along the thickness direction of a stacked-layer structure including an insulator I1, the insulator 66a, the semiconductor 66b, the insulator 66c, and an insulator I2. FIG. 22B is an example of a band diagram along the thickness direction of a stacked-layer structure including the insulator I1, the semiconductor 66b, the insulator 66c, and the insulator I2. For easy understanding, these band diagrams show the energy levels (Ec) of the conduction band minimum of the insulator I1, the insulator 66a, the semiconductor 66b, the insulator 66c, and the insulator I2.

The energy levels of the conduction band minimum of the insulator 66a and the insulator 66c are closer to the vacuum level than that of the semiconductor 66b; typically, a difference in the energy level of the conduction band minimum between the semiconductor 66b and each of the insulators 66a and 66c be preferably greater than or equal to 0.15 eV or greater than or equal to 0.5 eV, and less than or equal to 2 eV or less than or equal to 1 eV. In other words, it is preferable that the electron affinity of the semiconductor 66b be greater than or equal to that of each of the insulator 66a and the insulator 66c, and that the difference in electron affinity between the semiconductor 66b and each of the insulator 66a and the insulator 66c be greater than or equal to 0.15 eV or greater than or equal to 0.5 eV, and less than or equal to 2 eV or less than or equal to 1 eV.

As illustrated in FIGS. 22A and 22B, the energy level of the conduction band minimum gradually changes between the insulator 66a and the semiconductor 66b and between the semiconductor 66b and the insulator 66c. In other words, the energy level of the conduction band minimum is continuously varied or continuously connected. To obtain such band diagrams, the density of defect states in a mixed layer formed at an interface between the insulator 66a and the semiconductor 66b or an interface between the semiconductor 66b and the insulator 66c is preferably made low.

Specifically, when the insulator 66a and the semiconductor 66b or the oxide semiconductor 66b and the insulator 66c contain the same element (as a main component) in addition to oxygen, a mixed layer with a low density of defect states can be formed. For example, in the case where the semiconductor 66b is an In—Ga—Zn oxide semiconductor, it is preferable to use an In—Ga—Zn oxide semiconductor, a Ga—Zn oxide semiconductor, gallium oxide, or the like as each of the insulator 66a and the insulator 66c.

At this time, the semiconductor 66b serves as a main carrier path. Since the density of defect states at the interface between the insulator 66a and the semiconductor 66b and the interface between the semiconductor 66b and the insulator 66c can be made low, the influence of interface scattering on carrier conduction is small, and a high on-state current can be obtained.

When an electron is trapped in a trap state, the trapped electron behaves like fixed charge; thus, the threshold voltage of the transistor is shifted in a positive direction. The insulator 66a and the insulator 66c can make the trap state apart from the semiconductor 66b. This structure can prevent the positive shift of the threshold voltage of the transistor.

A material whose conductivity is sufficiently lower than that of the semiconductor 66b is used for the insulator 66a and the insulator 66c. In that case, the semiconductor 66b, the interface between the semiconductor 66b and the insulator 66a, and the interface between the semiconductor 66b and the insulator 66c mainly function as a channel region. For example, an oxide semiconductor with high insulation performance and the atomic ratio represented by the region C in FIG. 20C may be used for the insulator 66a and the insulator 66c. Note that the region C in FIG. 20C represents the atomic ratio of [In]:[M]:[Zn]=0:1:0 or the vicinity thereof.

In the case where an oxide semiconductor with the atomic ratio represented by the region A is used as the semiconductor 66b, it is particularly preferable to use an oxide semiconductor with M/[In] of greater than or equal to 1, preferably greater than or equal to 2, as each of the insulator 66a and the insulator 66c. In addition, it is preferable to use an oxide semiconductor with sufficiently high insulation performance and [M]/([Zn]+[In]) of greater than or equal to 1 as the insulator 66c.

The insulator 66a, the semiconductor 66b, and the insulator 66c can be formed by a sputtering method, a CVD method, an MBE method, a PLD method, an ALD method, or the like.

The insulator 66a, the semiconductor 66b, and the insulator 66c are preferably subjected to substrate heating after the deposition. Heat treatment can reduce water or hydrogen included in the insulator 66a, the semiconductor 66b, the insulator 66c, and the like. Furthermore, excess oxygen can be supplied to the insulator 66a and the semiconductor 66b in some cases. The heat treatment is performed at a temperature higher than or equal to 250° C. and lower than or equal to 650° C., preferably higher than or equal to 450° C. and lower than or equal to 600° C., and further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate released oxygen. For the heat treatment, lamp heating can be performed with use of an RTA apparatus. Heat treatment with an RTA apparatus is effective for an improvement in productivity because it needs short time as compared with the case of using a furnace.

In addition, regions of the semiconductor 66b or the insulator 66c that are in contact with the conductor 68a and the conductor 68b include low-resistance regions in some cases. The low-resistance regions are mainly formed when oxygen is extracted by the conductor 68a and the conductor 68b that are in contact with the semiconductor 66b, or when a conductive material in the conductor 68a or the conductor 68b is bonded to an element in the semiconductor 66b. The formation of the low-resistance regions leads to a reduction in contact resistance between the conductor 68a or 68b and the semiconductor 66b, whereby the transistor 60a can have a large on-state current.

The semiconductor 66b might have a smaller thickness in a region between the conductor 68a and the conductor 68b than in regions overlapping the conductor 68a and the conductor 68b. This is because part of the top surface of the semiconductor 66b is removed at the time of formation of the conductor 68a and the conductor 68b. In formation of the conductor to be the conductor 68a and the conductor 68b, a region with low resistance like the above low-resistance regions is formed on the top surface of the semiconductor 66b in some cases. The removal of the region that is on the top surface of the semiconductor 66b and between the conductor 68a and the conductor 68b can prevent a channel from being formed in the low-resistance region on the top surface of the semiconductor 66b.

Note that the three-layer structure including the insulator 66a, the semiconductor 66b, and the insulator 66c is an example. For example, a two-layer structure not including the insulator 66a or the insulator 66c may be employed. Alternatively, a single-layer structure not including the insulator 66a and the insulator 66c may be employed. Further alternatively, it is possible to employ an n-layer structure (n is an integer of four or more) that includes any of the insulator, semiconductor, and conductor given as examples of the insulator 66a, the semiconductor 66b, and the insulator 66c.

<Insulator and Conductor>

Components other than the semiconductor of the transistor 60a are described in detail below.

As the insulator 61, an insulator having a function of blocking hydrogen or water is used. Hydrogen and water in the insulator that is provided in the vicinity of the insulator 66a, the semiconductor 66b, and the insulator 66c cause carriers to be generated in the insulator 66a, the semiconductor 66b, and the insulator 66c that also function as oxide semiconductors. Because of this, the reliability of the transistor 60a might be decreased. In particular, when the element layer 30 is formed over the element layer 50 as shown in FIG. 9C, hydrogen is used in the element layer 50 to terminate dangling bonds of the semiconductor substrate; thus, the hydrogen might diffuse into the transistor 60a. In that case, the insulator 61 that has a function of blocking hydrogen or water can inhibit diffusion of hydrogen or water from layers below the transistor 60a, increasing the reliability of the transistor 60a. It is preferable that the insulator 61 be less permeable to hydrogen or water than the insulator 65 and the insulator 64.

The insulator 61 preferably has a function of blocking oxygen. When the insulator 61 blocks oxygen diffused from the insulator 64, oxygen can be effectively supplied from the insulator 64 to the insulator 66a, the semiconductor 66b, and the insulator 66c.

The insulator 61 can be formed using, for example, aluminum oxide, aluminum oxynitride, gallium oxide, gallium oxynitride, yttrium oxide, yttrium oxynitride, hafnium oxide, or hafnium oxynitride. The use of such a material enables the insulator 61 to function as an insulating film having an effect of blocking diffusion of oxygen, hydrogen, or water. The insulator 61 can be formed using, for example, silicon nitride or silicon nitride oxide. The use of such a material enables the insulator 61 to function as an insulating film having an effect of blocking diffusion of hydrogen or water. Note that the insulator 61 can be formed by a sputtering method, a CVD method, an MBE method, a PLD method, an ALD method, or the like.

The insulator 67 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Note that the insulator 67 can be formed by a sputtering method, a CVD method, an MBE method, a PLD method, an ALD method, or the like.

The semiconductor 66b in a region between the conductor 68a and the conductor 68b preferably overlaps at least part of the conductor 62. The conductor 62 functions as a back gate of the transistor 60a. The conductor 62 enables control of the threshold voltage of the transistor 60a. Control of the threshold voltage can prevent the transistor 60a from being turned on when a low voltage, e.g., a voltage of 0 V or lower, is applied to the gate (conductor 74) of the transistor 60a. Thus, the electrical characteristics of the transistor 60a can be easily made normally-off characteristics.

Note that the conductor 62 functioning as a back gate may be connected to a wiring or a terminal to which a predetermined potential is supplied. For example, the conductor 62 may be connected to a wiring to which a constant potential is supplied. The constant potential can be a high power supply potential or a low power supply potential such as a ground potential.

The conductor 62 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The conductor 62 can be formed by a sputtering method, a CVD method, an MBE method, a PLD method, an ALD method, or the like.

The insulator 65 is provided to cover the top surface of the conductor 62. An insulator similar to the insulator 64 or the insulator 72 to be described later can be used as the insulator 65.

The insulator 63 is provided to cover the insulator 65. The insulator 63 preferably has a function of blocking oxygen. Such an insulator 63 can prevent extraction of oxygen from the insulator 64 by the conductor 62. Accordingly, oxygen can be effectively supplied from the insulator 64 to the insulator 66a, the semiconductor 66b, and the insulator 66c. By improving the coverage with the insulator 63, extraction of oxygen from the insulator 64 can be further reduced and oxygen can be more effectively supplied from the insulator 64 to the insulator 66a, the semiconductor 66b, and the insulator 66c.

As the insulator 63, an oxide or a nitride containing boron, aluminum, silicon, scandium, titanium, gallium, yttrium, zirconium, indium, lanthanum, cerium, neodymium, hafnium, or thallium is used. It is preferable to use hafnium oxide or aluminum oxide. Note that the insulator 63 can be formed by a sputtering method, a CVD method, an MBE method, a PLD method, an ALD method, or the like.

Of the insulators 65, 63, and 64, the insulator 63 preferably includes an electron trap region. When the insulator 65 and the insulator 64 have a function of inhibiting release of electrons, the electrons trapped in the insulator 63 behave as if they are negative fixed charges. Thus, the insulator 63 has a function of a floating gate.

The amounts of hydrogen and water contained in the insulator 64 are preferably small. For example, the insulator 64 may be formed to have a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 64 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. It is preferable to use silicon oxide or silicon oxynitride. Note that the insulator 64 can be formed by a sputtering method, a CVD method, an MBE method, a PLD method, an ALD method, or the like.

The insulator 64 preferably contains excess oxygen. Such an insulator 64 makes it possible to supply oxygen from the insulator 64 to the insulator 66a, the semiconductor 66b, and the insulator 66c. The oxygen can reduce oxygen vacancies which are to be defects in the insulator 66a, the semiconductor 66b, and the insulator 66c which are oxide semiconductors. As a result, the insulator 66a, the semiconductor 66b, and the insulator 66c, can be oxide semiconductors with a low density of defect states and stable transistor characteristics.

In this specification and the like, excess oxygen refers to oxygen in excess of the stoichiometric composition, for example. Alternatively, excess oxygen refers to oxygen released from a film or layer containing the excess oxygen by heating, for example. Excess oxygen can move inside a film or a layer. Excess oxygen moves between atoms in a film or a layer, or replaces oxygen that is a constituent of a film or a layer and moves like a billiard ball, for example.

The insulator 64 including excess oxygen releases oxygen molecules, the number of which is greater than or equal to $1.0 \times 10^{14}$ molecules/cm$^2$ and less than or equal to $1.0 \times 10^{16}$ molecules/cm$^2$, preferably greater than or equal to $1.0 \times 10^{15}$ molecules/cm$^2$ and less than or equal to $5.0 \times 10^{15}$ molecules/cm$^2$ in thermal desorption spectroscopy (TDS) analysis in the range of surface temperatures of 100° C. to 700° C. or 100° C. to 500° C.

A method for measuring the number of released molecules using TDS analysis is described below by taking the amount of released oxygen as an example.

The total amount of gas released from a measurement sample in TDS analysis is proportional to the integral value of the ion intensity of the released gas. Then, comparison with a reference sample is made, whereby the total amount of released gas can be calculated.

For example, the number of oxygen molecules ($N_{O2}$) released from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that CH$_3$OH, which is a gas having the mass-to-charge ratio of 32, is not taken into consideration because it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = N_{H2}/S_{H2} \times S_{O2} \times a$$

A value $N_{H2}$ is obtained by conversion of the amount of hydrogen molecules released from the standard sample into densities. A value $S_{H2}$ is the integral value of ion intensity when the standard sample is subjected to TDS analysis. Here, the reference value of the standard sample is set to $N_{H2}/S_{H2}$. S$_{ot}$ is the integral value of ion intensity when the measurement sample is analyzed by TDS. $\alpha$ is a coefficient which influences the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W, using a silicon substrate containing certain amount of hydrogen atoms as the reference sample.

Further, in the TDS analysis, oxygen is partly detected as an oxygen atom. The ratio of oxygen molecules and oxygen atoms can be calculated from the ionization rate of the oxygen molecules. Note that since the above $\alpha$ includes the ionization rate of the oxygen molecules, the amount of the released oxygen atoms can also be estimated through the measurement of the amount of the released oxygen molecules.

Note that $N_{O2}$ is the amount of the released oxygen molecules. The amount of released oxygen in the case of being converted into oxygen atoms is twice the amount of the released oxygen molecules.

Furthermore, the insulator from which oxygen is released by heat treatment may contain a peroxide radical. Specifically, the spin density attributed to the peroxide radical is greater than or equal to $5 \times 10^{17}$ spins/cm$^3$. Note that the insulator containing a peroxide radical may have an asymmetric signal with a g factor of approximately 2.01 in ESR.

The insulator 64 or the insulator 63 may have a function of preventing diffusion of impurities from the lower layers.

As described above, the top surface or the bottom surface of the semiconductor 66b preferably has high planarity.

Thus, to improve the planarity, the top surface of the insulator 64 may be subjected to planarization treatment performed by CMP process or the like.

The conductor 68a and the conductor 68b function as the source electrode and the drain electrode of the transistor 60a.

The conductor 68a and the conductor 68b may each be formed so as to have a single-layer structure or a stacked-layered structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. For example, the conductor 68a and the conductor 68b each may have a stacked-layered structure in which tungsten is stacked over tantalum nitride. As the conductor 68a and the conductor 68b, for example, an alloy or a compound may be used, and a conductor containing aluminum, a conductor containing copper and titanium, a conductor containing copper and manganese, a conductor containing indium, tin, and oxygen, a conductor containing titanium and nitrogen, or the like may be used. The conductor 68a and the conductor 68b can be formed by a sputtering method, a CVD method, an MBE method, a PLD method, an ALD method, or the like.

The insulator 72 functions as a gate insulating film of the transistor 60a. Like the insulator 64, the insulator 72 may be an insulator containing excess oxygen. Such an insulator 72 makes it possible to supply oxygen from the insulator 72 to the insulator 66a, the semiconductor 66b, and the insulator 66c.

The insulator 72, the insulator 77, and the insulator 76 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 72, the insulator 77, and the insulator 76 may each be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. The insulator 72 and the insulator 77 can be formed by a sputtering method, a CVD method, an MBE method, a PLD method, an ALD method, or the like.

The insulator 77 preferably contains excess oxygen. Such an insulator 77 makes it possible to supply oxygen from the insulator 77 to the insulator 66a, the semiconductor 66b, and the insulator 66c. The oxygen can reduce oxygen vacancies which are to be defects in the insulator 66a, the semiconductor 66b, and the insulator 66c which are oxide semiconductors. As a result, the insulator 66a, the semiconductor 66b, and the insulator 66c can be oxide semiconductors with a low density of defect states and stable transistor characteristics. It is preferable that the amount of impurities such as hydrogen, water, and nitrogen oxide (NO$_x$, e.g., nitrogen monoxide and nitrogen dioxide) contained in the insulator 77 be small.

The conductor 74 functions as a gate electrode of the transistor 60a. As the conductor 74, any of the conductors that can be used as the conductor 62 can be used.

Here, as illustrated in FIG. 11B, the semiconductor 66b can be electrically surrounded by electric fields of the conductor 62 and the conductor 74 (a structure in which a semiconductor is electrically surrounded by an electric field of a conductor is referred to as a surrounded channel (s-channel) structure). Therefore, a channel is formed in the entire semiconductor 66*b* (the top, bottom, and side surfaces). In the s-channel structure, a large amount of current can flow between a source and a drain of a transistor, so that a high on-state current can be obtained.

In the case where the transistor has the s-channel structure, a channel is formed also in the side surface of the semiconductor 66*b*. Therefore, as the semiconductor 66*b* has a larger thickness, the channel region becomes larger. In other words, the thicker the semiconductor 66*b* is, the larger the on-state current of the transistor is. In addition, when the semiconductor 66*b* is thick, the proportion of the region with a high carrier controllability increases, leading to a smaller subthreshold swing value. For example, the semiconductor 66*b* has a region with a thickness greater than or equal to 10 nm, preferably greater than or equal to 20 nm, further preferably greater than or equal to 30 nm. Note that to prevent a decrease in the productivity of the semiconductor device, the semiconductor 66*b* has a region with a thickness of, for example, less than or equal to 150 nm.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, further preferably less than or equal to 30 nm, still further preferably less than or equal to 20 nm and the channel width of the transistor is preferably less than or equal to 40 nm, further preferably less than or equal to 30 nm, still further preferably less than or equal to 20 nm.

Here, the thickness of the insulator 78 can be greater than or equal to 5 nm, or greater than or equal to 20 nm, for example. It is preferable that at least part of the insulator 78 be in contact with the top surface of the insulator 76.

The insulator 78 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 78 preferably has a blocking effect against oxygen, hydrogen, water, alkali metal, alkaline earth metal, and the like. As such an insulator, for example, a nitride insulating film can be used. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. As the oxide insulating film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given. Any of the above-described oxides that can be used as the insulator 66*a* or the insulator 66*c* can also be used as the insulator 78. The insulator 78 can be formed by a sputtering method, a CVD method, an MBE method, a PLD method, an ALD method, or the like.

Here, it is preferable that the insulator 78 be formed by a sputtering method and it is further preferable that the insulator 78 be formed by a sputtering method in an atmosphere containing oxygen. When the insulator 78 is formed by a sputtering method, oxygen is added to the vicinity of a surface of the insulator 76 (after the formation of the insulator 78, the interface between the insulator 76 and the insulator 78) at the same time as the formation. For example, aluminum oxide may be formed by a sputtering method. In addition, aluminum oxide is preferably formed thereover by an ALD method. The use of an ALD method can prevent formation of pin holes and the like, leading to a further improvement in the blocking effect of the insulator 78 against oxygen, hydrogen, water, alkali metals, alkaline earth metals, and the like.

The insulator 78 is preferably subjected to heat treatment after the deposition. By the heat treatment, the oxygen added to the insulator 76 can be diffused through the insulator 77 to be supplied to the insulator 66*a*, the semiconductor 66*b*, and the insulator 66*c*. The oxygen may be supplied from the insulator 77 to the insulator 66*a*, the semiconductor 66*b*, and the insulator 66*c* through the insulator 72 or the insulator 64. The heat treatment is performed at a temperature higher than or equal to 250° C. and lower than or equal to 650° C., preferably higher than or equal to 350° C. and lower than or equal to 450° C. The heat treatment is performed in an inert gas atmosphere or an atmosphere containing an oxidizing gas at 10 ppm or more, 1% or more, or 10% or more. The heat treatment may be performed under a reduced pressure. For the heat treatment, lamp heating can be performed with use of an RTA apparatus.

It is preferable that the insulator 78 be less permeable to oxygen than the insulator 76 and have a function of blocking oxygen. Such an insulator 78 can prevent oxygen from being externally released to above the insulator 78 at the time of supply of oxygen from the insulator 76 to the insulator 66*a*, the semiconductor 66*b*, and the insulator 66*c*.

Aluminum oxide is preferably used for the insulator 78 because it is highly effective in preventing passage of both oxygen and impurities such as hydrogen and moisture.

Next, a transistor 60*b* which is a modification example of the transistor 60*a* is described with reference to FIGS. 11A to 11D. Note that FIGS. 11C and 11D are cross-sectional views of the transistor 60*b* in the channel length direction and in the channel width direction, like FIGS. 11A and 11B showing those of the transistor 60*a*.

Figure 11C:
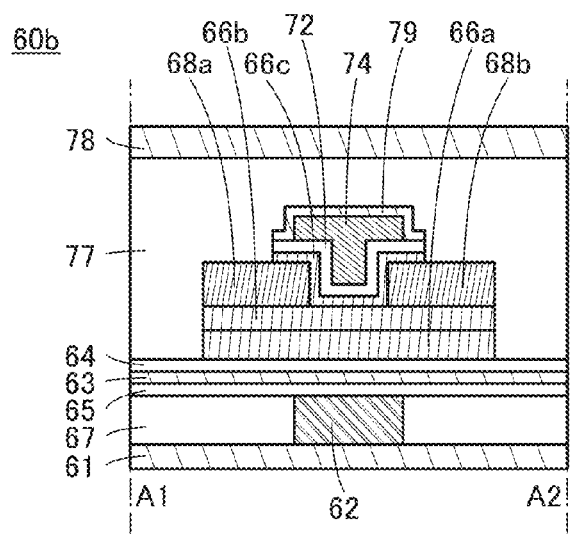
Figure 11D:
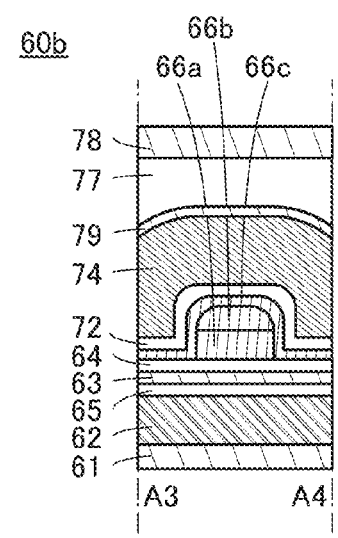

The transistor 60*b* shown in FIGS. 11C and 11D is different from the transistor 60*a* shown in FIGS. 11A and 11B in that the insulators 66*c* and 72 cover part of the top surfaces of the conductors 68*a* and 68*b* and the like, and that the insulator 76 overlaps the insulator 72 and the conductor 74. For the other structures of the transistor 60*b* in FIGS. 11C and 11D, the structures of the transistor 60*a* in FIGS. 11A and 11B can be referred to.

The insulator 78 is provided over and in contact with the insulator 77 in the transistor 60*b*; thus, oxygen is added to the vicinity of a surface of the insulator 77 (to the interface between the insulators 77 and 78 after the formation of the insulator 78) at the same time as the formation of the insulator 78.

An insulator 79 is preferably provided to cover the conductor 74. However, the insulator 79 is not necessarily provided.

Any of the insulators that can be used for the insulator 63 is preferably formed as the insulator 79. For example, gallium oxide or aluminum oxide formed by an ALD method is used as the insulator 79. Covering the conductor 74 with the insulator 79 can prevent excess oxygen that has been supplied to the insulator 77 from being taken by the conductor 74, which causes oxidation of the conductor 74.

Note that the structure of the transistor 60*b* is not limited to that illustrated in FIGS. 11C and 11D. For example, the insulator 66*c* or the insulator 72 may cover the insulator 66*a*, the semiconductor 66*b*, the conductor 68*a*, and the conductor 68*b* and may be in contact with the top surface of the insulator 64.

<Structure of Capacitor>

Figure 12A:
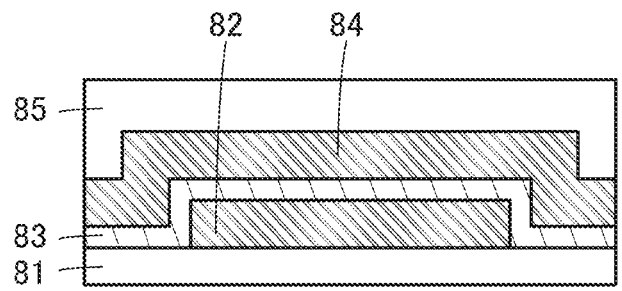
FIGS. 12A and 12C are cross-sectional views illustrating structures of a semiconductor device of one embodiment of the present invention.

FIG. 12A illustrates a structure example of a capacitor 80a included in the element layer 40. The capacitor 80a includes a conductor 82, an insulator 83, and a conductor 84. As illustrated in FIG. 12A, the conductor 82 is provided over an insulator 81, the insulator 83 covers the conductor 82, the conductor 84 covers the insulator 83, and an insulator 85 is provided over the conductor 84.

Here, it is preferable that the insulator 83 be in contact with a side surface of the conductor 82, and that the conductor 84 be in contact with a side surface of a projecting portion of the insulator 83. Accordingly, not only the top surface of the conductor 82 but also the side surface of the conductor 82 can function as a capacitor, resulting in an increased capacitance value.

The conductor 41 serving as a plug in the element layer 40 shown in FIGS. 9A to 9D and the like is in contact with the conductor 82 serving as one electrode of a capacitor 80a shown in FIG. 12A or with the conductor 84 serving as the other electrode thereof. In other words, the conductors 82 and 84 correspond to the conductor 12 shown in FIG. 4A and the like. Note that the number of the conductor 41 serving as a plug is two or more in some cases.

The insulator 44 included in the element layer 40 shown in FIGS. 9A to 9D and the like corresponds to the insulator 85 of the capacitor 80a shown in FIG. 12A. In some cases, an insulator formed over the insulator 85 is included in the insulator 44. In some cases, the insulator 44 is included in the insulator 83.

The conductor 82 and conductor 84 may each be formed to have a single-layer structure or a layered structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used. The conductor 82 and the conductor 84 can be formed by a sputtering method, a CVD method, an MBE method, a PLD method, an ALD method, or the like.

For example, an insulator containing one or more of aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used as the insulator 83. It is particularly preferable to use a high-k material such as hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), hafnium oxide, or yttrium oxide. In the case where a high-k material is used as the insulator 83, the capacitance can be increased by heat treatment in some cases. The use of such a high-k material enables sufficient capacitance of the capacitor 80a to be ensured even if the insulator 83 has a large thickness. The insulator 83 having a large thickness can prevent leakage current generated between the conductor 82 and the conductor 84. The insulator 83 can be formed by a sputtering method, a CVD method, an MBE method, a PLD method, an ALD method, or the like.

As the insulator 81 and insulator 85, any of the insulators that can be used as the insulator 76 in the transistor 60a shown in FIGS. 11A to 11D may be used. The insulator 85 may be formed using an organosilane gas (e.g., tetra-ethyl-ortho-silicate (TEOS)).

Next, modification examples of the capacitor 80a are described with reference to FIGS. 12B and 12C.

Figure 12B:
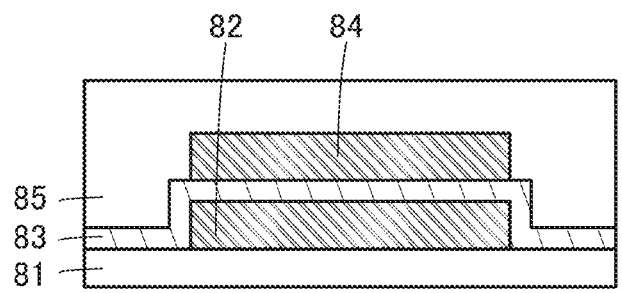

A capacitor 80b illustrated in FIG. 12B is different from the capacitor 80a illustrated in FIG. 12A in that the conductor 84 overlaps the top surface of the conductor 82. Note that although an edge portion of the side surface of the conductor 84 is aligned with an edge portion of the side surface of the conductor 82 in FIG. 12B, the capacitor 80b is not limited thereto.

Figure 12C:
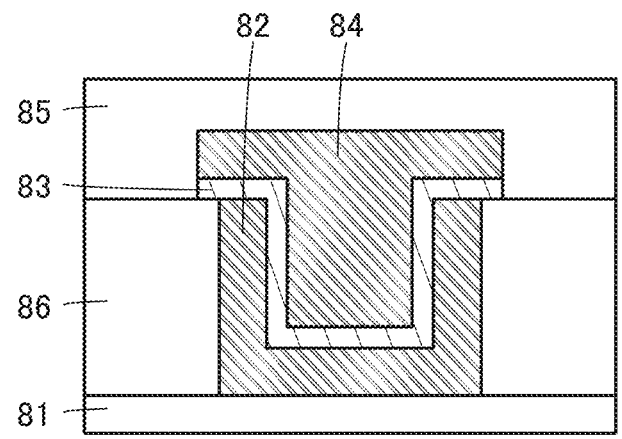

A capacitor 80c illustrated in FIG. 12C is different from the capacitor 80a illustrated in FIG. 12A in that an insulator 86 with an opening is provided over the insulator 81, and that the conductor 82 is provided in the opening. Here, the opening in the insulator 86 and the top surface of the insulator 81 can be regarded as forming a groove portion, and the conductor 82 is preferably provided along the groove portion. Furthermore, as in FIG. 12C, the insulator 86 and the conductor 82 may be formed so that their top surfaces are substantially aligned with each other.

The insulator 83 is provided over the conductor 82, and the conductor 84 is provided over the insulator 83. Here, in the groove portion, the conductor 84 has a region which faces the conductor 82 with the insulator 83 provided therebetween. In addition, the insulator 83 is preferably provided to cover the top surface of the conductor 82. When the insulator 83 is provided as described above, leakage current can be prevented from flowing between the conductor 82 and the conductor 84. In addition, the end portions of the side surfaces of the insulator 83 may be substantially aligned with the end portions of the side surfaces of the conductor 84. In this manner, the capacitor 80c preferably has a concave shape, a cylinder shape, or the like. Note that in the capacitor 80c, the shapes of the top surfaces of the conductor 82, the insulator 83, and the conductor 84 may each be a polygonal shape other than the quadrangular shape or a circular shape including an elliptical shape.

<Structure of Transistor Formed in Semiconductor Substrate>

Figure 13A:
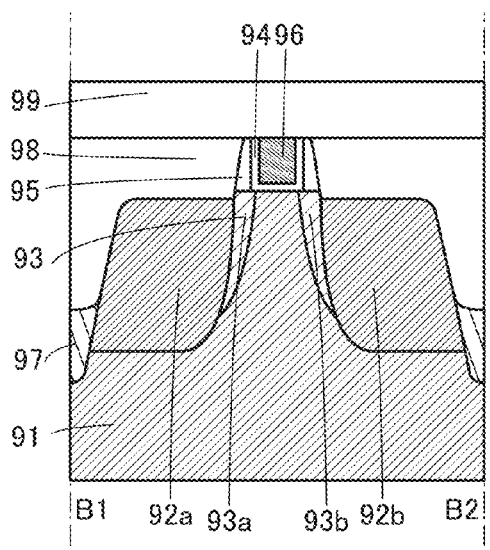
FIGS. 13A to 13D are cross-sectional views illustrating structures of a semiconductor device of one embodiment of the present invention.
Figure 13B:
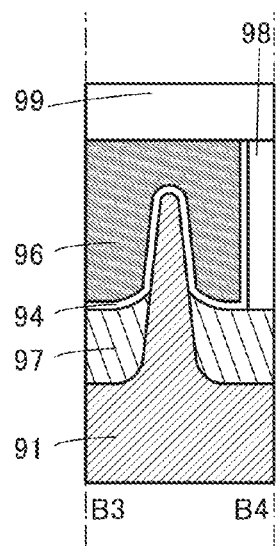

FIGS. 13A and 13B illustrate a structure example of a transistor 90a included in the element layer 50. FIG. 13A is a cross-sectional view of the transistor 90a in a channel length direction B1-B2, and FIG. 13B is a cross-sectional view of the transistor 90a in a channel width direction B3-B4.

A plurality of projecting portions is formed on the semiconductor substrate 91, and an element separation region 97 is formed in groove portions (also referred to as trenches) between the plurality of projecting portions. An insulator 98 having an opening is provided over the semiconductor substrate 91 and the element separation region 97. In the opening of the insulator 98, an insulator 94 is formed over the semiconductor substrate 91 and the element separation region 97, and a conductor 96 is formed over the insulator 94. An insulator 99 is provided over the insulator 98.

As illustrated in FIG. 13A, the opening of the insulator 98 is formed over at least part of the projection of the semiconductor substrate 91, and an insulator 95 is provided in the opening of the insulator 98. The insulator 94 is provided on the inner surface of the insulator 95, and a conductor 96 is provided on the inner surface of the insulator 94. As illustrated in FIG. 13A, a low-resistance region 93a and a low-resistance region 93b are formed in the projecting portion of the semiconductor substrate 91 so that at least part of the insulator 95 overlaps the low-resistance region 93a and the low-resistance region 93b; and a low-resistance region 92a and a low-resistance region 92b are formed on the outer side than the low-resistance region 93a and the low-resistance region 93b. Note that it is preferable that the low-resistance region 92a and the low-resistance region 92b have lower resistances than the low-resistance region 93a and the low-resistance region 93b.

Here, the conductor 96 functions as a gate of the transistor 90a, the insulator 94 functions as a gate insulating film of the transistor 90a, the low-resistance region 92a functions as one of a source and a drain of the transistor 90a, and the low-resistance region 92b functions as the other of the source and the drain of the transistor 90a. The insulator 95 functions as a side wall insulating film of the transistor 90a. The low-resistance region 93a and the low-resistance region 93b function as lightly doped drain (LDD) regions of the transistor 90a. In the projecting portion of the semiconductor substrate 91, a region which is positioned under the conductor 96 and between the low-resistance regions 93a and the low-resistance region 93b functions as a channel formation region of the transistor 90a.

As illustrated in FIG. 13B, in the transistor 90a, the conductor 96 overlaps side and top portions of the projecting portion in the channel formation region with the insulator 94 positioned therebetween, so that carriers flow in a wide area including the side and top portions of the channel formation region. Therefore, an area over the substrate occupied by the transistor 90a can be reduced, and the number of transferred carriers in the transistor 90a can be increased. As a result, the on-state current and field-effect mobility of the transistor 90a are increased. Suppose the length of the projecting portion of the channel formation region in the channel width direction (i.e., channel width) is W and the height of the projecting portion of the channel formation region is T. When the aspect ratio that corresponds to the ratio of the height T of the projecting portion to the channel width W (T/W) is high, a region where carrier flows becomes wider. Thus, the on-state current of the transistor 90a is further increased and the field-effect mobility of the transistor 90a is further increased. For example, when the transistor 90a is formed using a bulk semiconductor substrate 91, the aspect ratio is desirably 0.5 or more, further desirably 1 or more.

The transistor 90a illustrated in FIGS. 13A and 13B is subjected to element isolation by a shallow trench isolation (STI) method; however, the semiconductor device in this embodiment is not limited thereto.

The conductor 51 serving as a plug in the element layer 50 shown in FIGS. 9A to 9D and the like is in contact with the low-resistance region 92a, the low-resistance region 92b, or the conductor 96. The low-resistance regions 92a and the low-resistance region 92b serve as a source and a drain of a transistor 90a shown in FIG. 13A, and the conductor 96 serves as a gate thereof. In other words, low-resistance regions 92a, the low-resistance region 92b, and the conductor 96 correspond to the conductor 12 shown in FIG. 4A and the like. Note that the number of the conductor 51 serving as a plug is two or more in some cases.

The insulator 54 included in the element layer 50 shown in FIGS. 9A to 9D and the like corresponds to the stack of the insulators 98 and 99 of the transistor 90a shown in FIG. 13A. In some cases, an insulator formed over the insulator 99 is included in the insulator 54.

As the semiconductor substrate 91, a single-material semiconductor substrate formed using silicon, germanium, or the like or a compound semiconductor substrate formed using silicon carbide, silicon germanium, gallium arsenide, indium phosphide, zinc oxide, gallium oxide, or the like may be used, for example. A single crystal silicon substrate is preferably used as the semiconductor substrate 91. A semiconductor substrate in which an insulator region is provided in the above semiconductor substrate, e.g., silicon on insulator (SOI) substrate or the like may be used as the semiconductor substrate 91.

As the semiconductor substrate 91, for example, a semiconductor substrate including impurities imparting p-type conductivity is used. However, a semiconductor substrate including impurities imparting n-type conductivity may be used as the semiconductor substrate 91. Alternatively, the semiconductor substrate 91 may be an i-type semiconductor substrate.

The low-resistance region 92a and the low-resistance region 92b provided in the semiconductor substrate 91 preferably contain an element that imparts n-type conductivity, such as phosphorus or arsenic, or an element that imparts p-type conductivity, such as boron or aluminum. Similarly, the low-resistance region 93a and the low-resistance region 93b also preferably contain an element that imparts n-type conductivity, such as phosphorus or arsenic, or an element that imparts p-type conductivity, such as boron or aluminum. Since the low-resistance region 93a and the low-resistance region 93b preferably serve as LDD regions, the concentrations of the element imparting a conductivity type contained in the low-resistance region 93a and the low-resistance region 93b are preferably lower than those of the element imparting a conductivity type contained in the low-resistance region 92a and the low-resistance region 92b. Note that the low-resistance region 92a and the low-resistance region 92b may be formed using silicide.

For example, an insulator containing one or more of aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used as the insulator 94 and the insulator 95. A high-k material such as hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), hafnium oxide, or yttrium oxide may be used. The insulator 94 and the insulator 95 can be formed by a sputtering method, a CVD method, an MBE method, a PLD method, an ALD method, or the like.

It is preferable that the conductor 96 be formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Still alternatively, a stacked-layer structure including a film of metal nitride and a film of any of the above metals may be used for the conductor 96. As a metal nitride, tungsten nitride, molybdenum nitride, or titanium nitride can be used. When the metal nitride film is provided, adhesiveness of the metal film can be increased; thus, separation can be prevented. The conductor 96 can be formed by a sputtering method, a CVD method, an MBE method, a PLD method, an ALD method, or the like.

The insulator 98 and the insulator 99 may each be formed to have, for example, a single-layer structure or a stacked-layered structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulators 98 and 99 can be formed by a sputtering method, a CVD method, an MBE method, a PLD method, an ALD method, or the like.

Alternatively, the insulators 98 and 99 can be formed using silicon carbonitride, silicon oxycarbide, or the like. Further alternatively, undoped silicate glass (USG), boron phosphorus silicate glass (BPSG), borosilicate glass (BSG), or the like can be used. USG, BPSG, and the like may be formed by an atmospheric pressure CVD method. Alternatively, hydrogen silsesquioxane (HSQ) or the like may be applied by a coating method.

Here, the insulator 98 preferably contains hydrogen in some cases. When the insulator 98 contains hydrogen, defects and the like in the semiconductor substrate 91 are reduced and electrical characteristics of the transistor 90a are improved in some cases. For example, in the case where the semiconductor substrate 91 is formed using a material containing silicon, a defect such as a dangling bond in the silicon can be terminated by hydrogen.

As the insulator 99, an insulator having a function of blocking oxygen and an impurity, such as hydrogen, is preferably used. For example, in the case of the structure shown in FIG. 9C and the like, the insulator having a function of blocking oxygen and an impurity, such as hydrogen, is provided below the element layer 30 of the transistor 60a, whereby stable electric characteristics of the transistor 60a can be obtained.

As the insulator having a function of blocking oxygen and impurities such as hydrogen, for example, one with a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum can be used. For example, nitride silicon can be used.

Next, a transistor 90b which is a modification example of the transistor 90a is described with reference to FIGS. 13C and 13D. Note that FIGS. 13C and 13D show a cross-sectional view of the transistor 90b in the channel length direction and that in the channel width direction, like FIGS. 13A and 13B showing the transistor 90a.

Figure 13C:
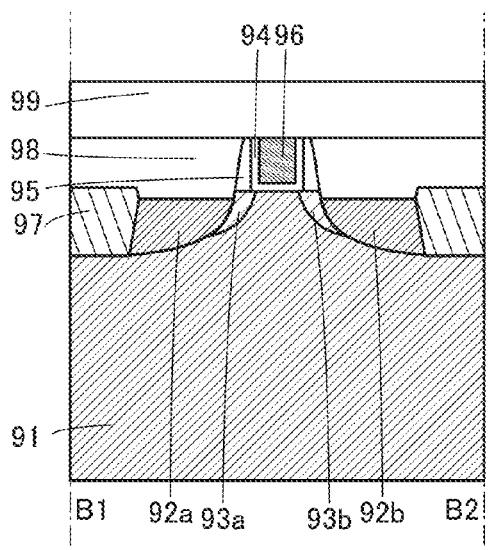
Figure 13D:
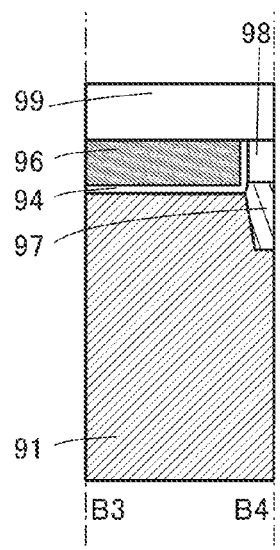

The transistor 90b illustrated in FIGS. 13C and 13D is different from the transistor 90a illustrated in FIGS. 13A and 13B in that no projecting portion is formed on the semiconductor substrate 91. For the other structures of the transistor 90b in FIGS. 13C and 13D, the structures of the transistor 90a in FIGS. 13A and 13B can be referred to.

Although the insulator 94 is provided in contact with the bottom surface of the conductor 96 in each of the transistor 90a and the transistor 90b, the semiconductor device described in this embodiment is not limited thereto. For example, the insulator 94 may be in contact with the bottom and side surfaces of the conductor 96.

<Structure Example of Semiconductor Device>

Figure 14:
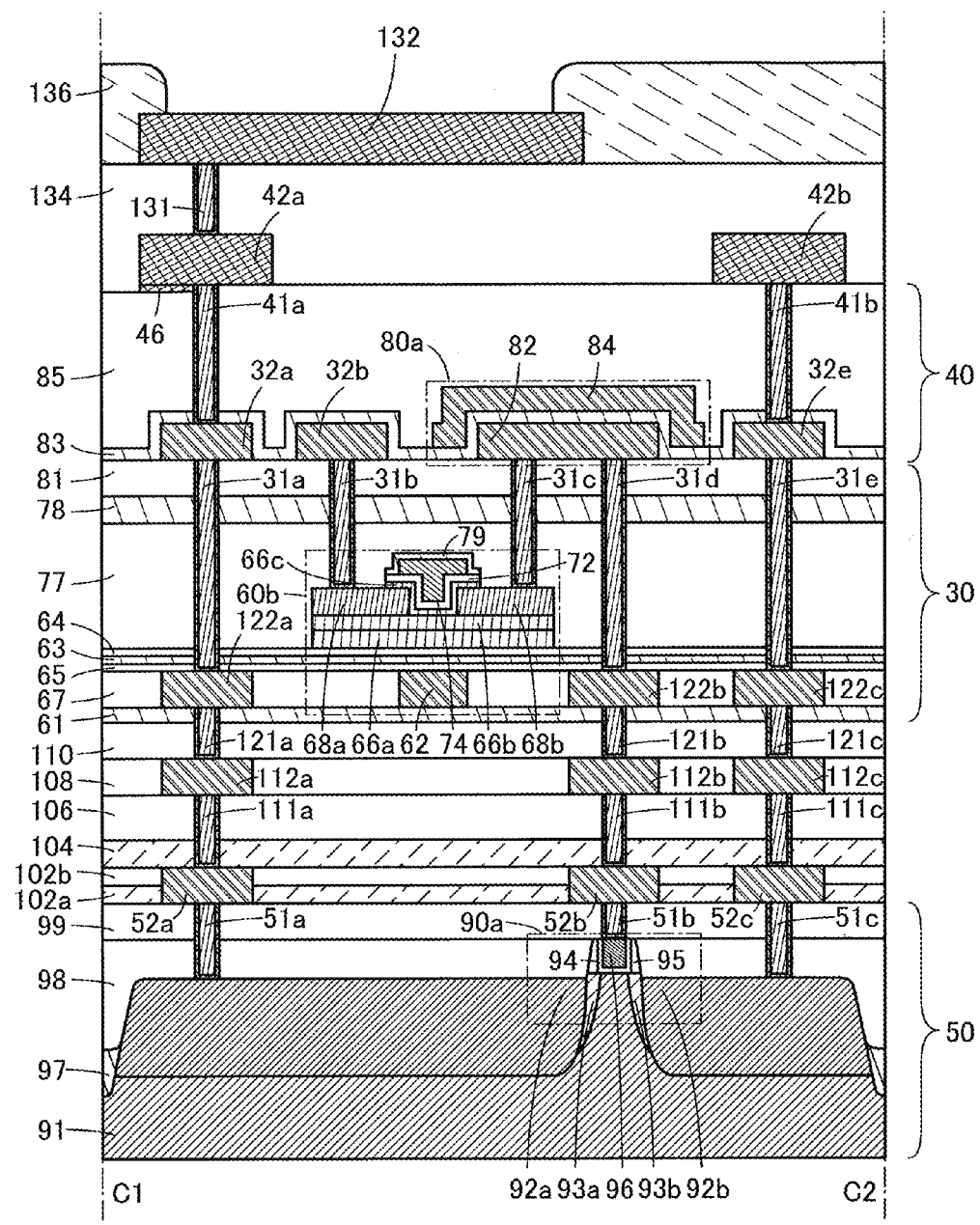
FIG. 14 is a cross-sectional view illustrating a structure of a semiconductor device of one embodiment of the present invention.

FIG. 14 shows an example of a semiconductor device including the structure shown in FIG. 10A in which the element layer 30 is provided over the element layer 50 and the element layer 40 is provided over the element layer 30. FIG. 14 is a cross-sectional view taken along a channel length C1-C2 of the transistor 60b and the transistor 90a. Note that although the channel length direction of the transistor 60b is parallel to that of the transistor 90a in FIG. 14, the directions are not limited thereto and can be set appropriately.

Since the transistor 90a illustrated in FIG. 13A is provided in the element layer 50, the above description can be referred to for the semiconductor substrate 91, the element separation region 97, the insulator 98, the insulator 99, the insulator 94, the insulator 95, the conductor 96, the low-resistance region 93a, the low-resistance region 93b, the low-resistance region 92a, and the low-resistance region 92b.

Conductors 51a, 51b, and 51c which serve as plugs are provided in the element layer 50. The conductor 51a is formed in an opening formed in the insulator 98 and the insulator 99 so that the bottom surface is in contact with the low-resistance region 92a. The conductor 51b is formed in an opening formed in the insulator 99 so that the bottom surface is in contact with the conductor 96. The conductor 51c is formed in an opening formed in the insulator 98 and the insulator 99 so that the bottom surface is in contact with the low-resistance region 92b.

As illustrated in FIG. 14, the conductors 51a to 51c and the conductors 52a to 52c preferably have a stacked-layer structure. For a lower conductor of the conductors 51a to 51c, for example, a single layer or a stacked-layer including any of titanium, tantalum, titanium nitride, tantalum nitride, and the like may be used. The use of a metal nitride such as tantalum nitride or titanium nitride, in particular tantalum nitride, for the conductors 51a to 51c can inhibit impurities such as hydrogen and water which are included in the element layer 50 and the like from diffusing into the conductors 51a to 51c, which prevents the impurities from entering the upper layer. These apply not only to the conductors 51a to 51c but also to other conductors which functions as plugs. Therefore, when conductors 111a to 111c and conductors 121a to 121c, which are located below the element layer 30, have a stacked-layer structure, and the bottom layer of the stacked-layer structure is formed using a metal nitride such as tantalum nitride or titanium nitride, in particular tantalum nitride, impurities such as hydrogen and water can be prevented from diffusing into the element layer 30 located over these conductors. Such a structure makes the oxide semiconductor included in the element layer 30 a highly purified intrinsic or substantially highly purified intrinsic oxide semiconductor.

The conductors 52a, 52b, and 52c are provided over the insulator 99. The conductors 52a, 52b, and 52c are in contact with top surfaces of the conductors 51a, 51b, and 51c, respectively. Note that the conductors 51a, 51b, and 51c correspond to the conductor 51 shown in FIG. 9C and the like. The conductors 52a, 52b, and 52c correspond to the conductor 52 shown in FIG. 9C and the like. Hard mask residues formed when the wiring and the plug are formed by the above method (e.g., the hard mask residue 56 in FIG. 9C) except for the hard mask residue 46 which is described below are not illustrated.

The insulators 102a and 102b are provided over the insulator 99. The conductors 52a, 52b, and 52c are embedded in the insulators 102a and 102b. For example, in the case where a metal which tends to diffuse, e.g., copper, is used for the conductors 52a to 52c, an insulator which is less permeable to copper, such as silicon nitride or silicon nitride carbide, is used, in which case impurities such as copper can be prevented from diffusing into the transistor 90a. In addition, an insulator which has a lower hydrogen concentration than the insulator 98 or the like is preferably used as the insulator 102a. The dielectric constant of the insulator 102b is preferably lower than that of the insulator 102a. Although the insulator 102b and the insulator 102a are stacked in FIG. 14, the structure is not limited thereto, and a single-layer insulator may be provided instead.

An insulator 104 is provided over the insulator 102b, an insulator 106 is provided over the insulator 104, and an insulator 108 is provided over the insulator 106. Any of the insulators that can be used as the insulator 99 may be used for the insulator 102a, the insulator 102b, the insulator 104, the insulator 106, and the insulator 108. Any of the insulator 102a, the insulator 102b, the insulator 104, the insulator 106, and the insulator 108 preferably has a function of blocking oxygen and impurities such as hydrogen. For example, in the case where a metal which tends to diffuse, e.g., copper, is used for the conductors 52a to 52c, an insulator which is less permeable to copper, such as silicon nitride or silicon nitride carbide, is used as the insulator 104, in which case impurities such as copper can be prevented from diffusing into the oxide semiconductor film included in the element layer 30.

The conductors 111a, 111b, and 111c which serve as plugs are provided in the insulator 104 and the insulator 106. The conductor 111a is formed in an opening formed in the insulator 104 and the insulator 106 so that the bottom surface is in contact with the conductor 52a. The conductor 111b is formed in an opening formed in the insulator 104 and the insulator 106 so that the bottom surface is in contact with the conductor 52b. The conductor 111c is formed in an opening formed in the insulator 104 and the insulator 106 so that the bottom surface is in contact with the conductor 52c.

The conductors 112a, 112b, and 112c are embedded in the insulator 108. The conductors 112a, 112b, and 112c are in contact with top surfaces of the conductors 111a, 111b, and 111c, respectively. Note that the conductors 111a, 111b, and 111c correspond to the conductor 20b shown in FIG. 4A and the like and that the conductors 112a, 112b, and 112c correspond to the conductor 22b shown in FIGS. 4A and 4B and the like.

The insulator 110 is provided over the insulator 108. The insulator 110 can be formed using the insulator that can be used as the insulator 99.

Since the transistor 60b illustrated in FIG. 11C is provided in the element layer 30 over the insulator 110, the above description can be referred to for the insulator 61, the insulator 67, the conductor 62, the insulator 65, the insulator 63, the insulator 64, the insulator 66a, the semiconductor 66b, the insulator 66c, the conductor 68a, the conductor 68b, the insulator 72, the conductor 74, the insulator 77, and the insulator 78.

The conductors 121a, 121b, and 121c which serve as plugs are provided in the insulator 61 and the insulator 110. The conductor 121a is formed in an opening formed in the insulator 61 and the insulator 110 so that the bottom surface is in contact with the conductor 112a. The conductor 121b is formed in an opening formed in the insulator 61 and the insulator 110 so that the bottom surface is in contact with the conductor 112b. The conductor 121c is formed in an opening formed in the insulator 61 and the insulator 110 so that the bottom surface is in contact with the conductor 112c.

Conductors 122a, 122b, and 122c are formed in the same layer as the conductor 62. The conductors 122a, 122b, and 122c are in contact with top surfaces of the conductors 121a, 121b, and 121c, respectively. Note that the conductors 121a, 121b, and 121c correspond to the conductor 20b shown in FIG. 4A and the like. The conductors 122a, 122b, and 122c correspond to the conductor 22b shown in FIGS. 4A and 4B and the like.

The insulator 81 is provided over the insulator 78. The insulator 81 can be formed using the insulator that can be used as the insulator 77.

Conductors 31a to 31e serving as plugs are provided in the insulators 81, 78, and 77. Furthermore, the conductors 31a, 31d, and 31e serving as plugs are provided in the insulators 65, 63, and 64. The conductor 31a is formed in an opening formed in the insulator 81, the insulator 78, the insulator 77, the insulator 64, the insulator 63, and the insulator 65 so that the bottom surface is in contact with the conductor 122a. The conductor 31b is formed in an opening formed in the insulators 81, 78, and 77 so that the bottom surface is in contact with the conductor 68a. The conductor 31c is formed in an opening formed in the insulators 81, 78, and 77 so that the bottom surface is in contact with the conductor 68b. The conductor 31d is formed in an opening formed in the insulators 81, 78, 77, 64, 63, and 65 so that the bottom surface is in contact with the conductor 112b. The conductor 31e is formed in an opening formed in the insulators 81, 78, 77, 64, 63, and 65 so that the bottom surface is in contact with the conductor 122c.

The conductors 32a, 32b, 82, and 32e are provided over the insulator 81. The conductor 82 is one electrode of the capacitor 80a included in the element layer 40. The conductors 32a and 32b are in contact with top surfaces of the conductors 31a and 31b, respectively. The conductor 82 is in contact with top surfaces of the conductors 31c and 31d. The conductor 32e is in contact with a top surface of the conductor 31e. Note that the conductors 31a, 31b, 31c, 31d, and 31e correspond to the conductor 31 shown in FIG. 9A and the like. The conductors 32a, 32b, 82, and 32e correspond to the conductor 32 shown in FIG. 9A and the like.

Although a wiring and a plug connecting the conductors 74 and 62 are not shown in the cross-sectional view of FIG. 14, they can be provided.

Since the capacitor 80a illustrated in FIG. 12A is provided in the element layer 40, the above description can be referred to for the insulator 81, the conductor 82, the insulator 83, the conductor 84, and the insulator 85.

The element layer 40 includes conductors 41a and 41b serving as plugs. A bottom surface of the conductor 41a is in contact with the conductor 32a. The conductor 41a is formed in an opening in the insulators 83 and 85. A bottom surface of the conductor 41b is in contact with the conductor 32e. The conductor 41b is formed in an opening in the insulators 83 and 85.

The conductors 42a and 42b serving as wirings are provided over the insulator 85. The conductors 42a and 42b are in contact with top surfaces of the conductors 41a and 41b, respectively. The hard mask residue 46 remains in a depressed portion of the top surface of the insulator 85 overlapping with the conductor 42a. Note that the conductors 41a and 41b correspond to the conductor 41 illustrated in FIG. 9B and the like, the conductors 42a and 42b correspond to the conductor 42 illustrated in FIG. 9B and the like, and the hard mask residue 46 corresponds to one in FIG. 9B and the like.

An insulator 134 is formed over the insulator 85 and overlaps the conductors 42a and 42b. The insulator 134 can be formed with the insulator that can be used as the insulator 85.

A conductor 131 serving as a plug is provided in the insulator 134. The conductor 131 is formed in an opening of the insulator 134 so that the bottom surface is in contact with the conductor 42a.

A conductor 132 serving as a wiring is provided over the insulator 134. The conductor 132 is in contact with a top surface of the conductor 131. Note that the conductors 131 and 132 respectively correspond to the conductors 20b and 22b shown in FIGS. 4A and 4B and the like.

An insulator 136 having an opening is formed over the insulator 134 so that the opening is located over the conductor 132. The insulator 136 can be formed using the insulator that can be used as the insulator 134. An organic insulating film such as a polyimide film may be used as the insulator 136.

A method for forming a wiring and a plug will be described using the conductor 42*a* (the wiring) and the conductor 41*a* (the plug) as an example, with reference to FIGS. 15A to 15D to FIGS. 19A to 19D illustrating cross-sectional views and top views. FIGS. 15A to 15D to FIGS. 19A to 19D are cross-sectional views each taken along dashed dotted line X3-X4 and top views. Note that FIGS. 15A to 15D to FIGS. 19A to 19D are shown in an exaggerated way by changing the aspect ratio from that of FIG. 14.

An insulator 83*a* is formed over the conductor 32*a*. An insulator 85*a* is formed over the insulator 83*a*. The insulator 83*a* becomes the insulator 83 after an opening is formed. The insulator 85*a* becomes the insulator 85 after the opening is formed. The conductor 32*a* corresponds to the conductor 12 shown in FIG. 1A and the like. The insulators 83*a* and 85*a* correspond to the insulator 14*a*.

First, a hard mask 146*a* is formed over the insulator 85*a*. A conductor used for the hard mask 146*a* can be the same as a conductor 152*a* used in the lowest layer of a below-described wiring. For example, titanium, tantalum, tungsten, titanium nitride, tantalum nitride, or the like can be used. Note that in the case of using titanium, titanium nitride, or the like for the conductor 152*a*, aluminum or the like which can be etched with the same etching gas may be used. The hard mask 146*a* can be formed by a sputtering method, a CVD method, an MBE method, a PLD method, an ALD method, or the like.

A hard mask 147*a* is formed over the hard mask 146*a*. An insulator which can be used as the insulator 77, such as silicon oxynitride or silicon nitride, can be used for the hard mask 147*a*. The hard masks 146*a* and 147*a* correspond to the hard mask 16*a* shown in FIGS. 1A and 1B. The hard mask 147*a* can be formed by a sputtering method, a CVD method, an MBE method, a PLD method, an ALD method, or the like.

Next, an organic coating film 145*a* is formed over the hard mask 147*a*. The organic coating film 145*a* between the hard mask 147*a* and a resist mask 148 can improve adhesion of the hard mask 147*a* to the resist mask 148.

Figure 15A:
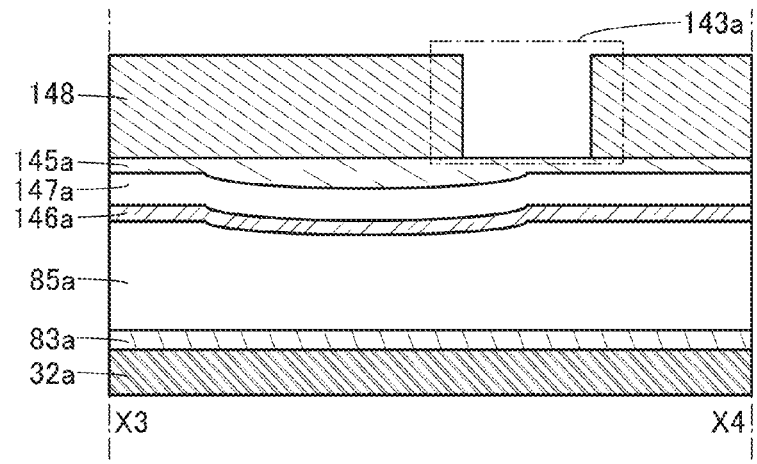
FIGS. 15A to 15D are cross-sectional views and top views illustrating a method for manufacturing a semiconductor device of one embodiment of the present invention.
Figure 15B:
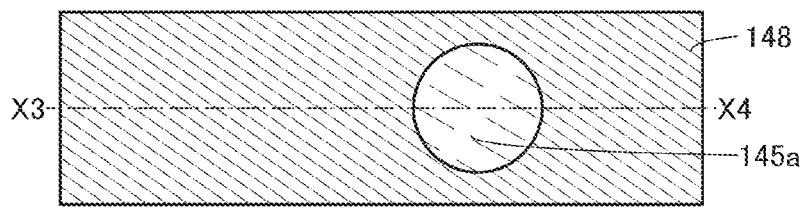

Next, the resist mask 148 having the opening 143*a* is formed over the hard mask 146*a* (see FIGS. 15A and 15B). Here, FIG. 15A corresponds to a cross section taken along dashed dotted line X3-X4 shown in FIG. 15B. In the same manner, each cross-sectional view shown in the following description corresponds to a cross section taken along dashed dotted line X3-X4 shown in the corresponding top view. The resist mask 148 is formed by a lithography method or the like.

Figure 15C:
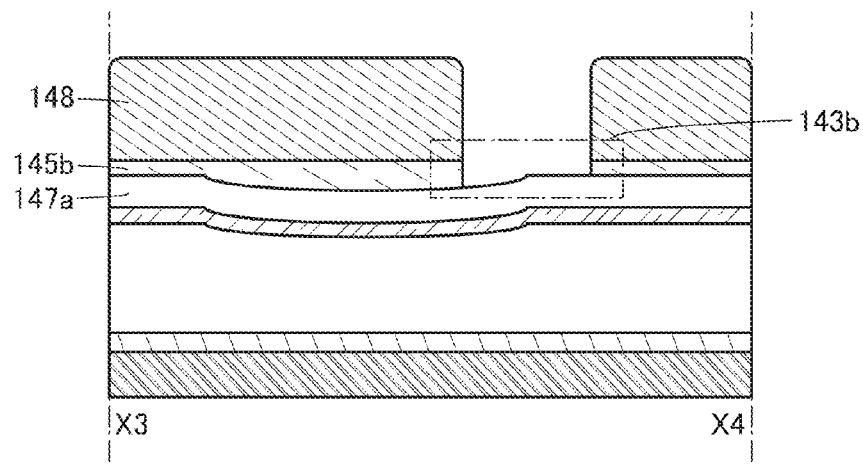
Figure 15D:
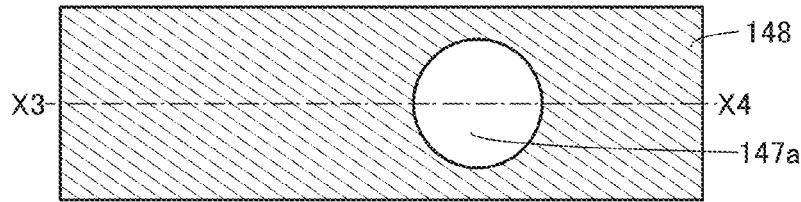

Next, the organic coating film 145*a* is etched using the resist mask 148 so as to form an organic coating film 145*b* having an opening 143*b* (see FIGS. 15C and 15D). The etching is performed so that the top surface of the hard mask 147*a* is exposed in the opening 143*b*. Note that dry etching is preferably used for the etching. For the dry etching, for example, a $C_4F_6$ gas, a $C_4F_8$ gas, a $CF_4$ gas, a $SF_6$ gas, a $CHF_3$ gas, or the like can be used. As a dry etching apparatus, an apparatus similar to that described above can be used. In some cases, the dry etching removes a corner or the like of the resist mask 148.

Figure 16A:
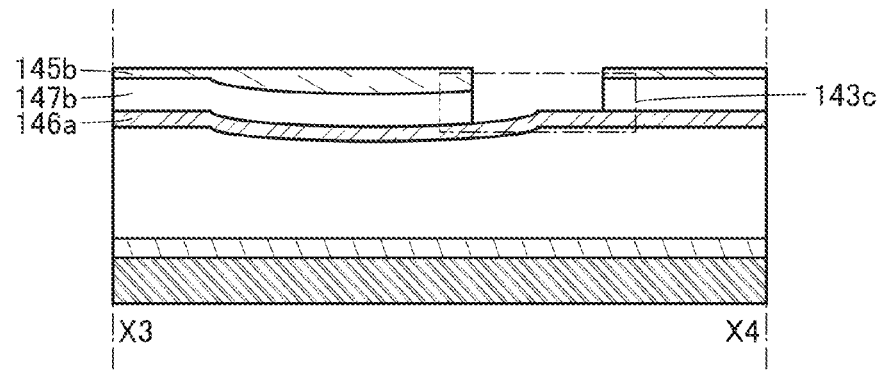
FIGS. 16A to 16D are cross-sectional views and top views illustrating a method for manufacturing a semiconductor device of one embodiment of the present invention.
Figure 16B:
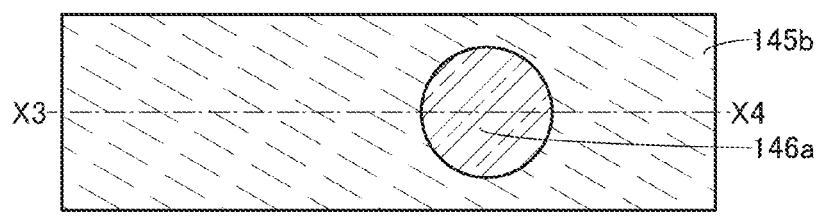

Next, the hard mask 147*a* is etched using the resist mask 148, whereby a hard mask 147*b* having an opening 143*c* is formed (see FIGS. 16A and 16B). The etching is performed so that the top surface of the hard mask 146*a* is exposed in the opening 143*c*. Note that dry etching is preferably used for the etching. For the dry etching, for example, a $C_4F_6$ gas, a $C_4F_8$ gas, a $CF_4$ gas, a $SF_6$ gas, a $CHF_3$ gas, or the like can be used alone or in combination. Alternatively, an oxygen gas, a helium gas, an argon gas, a hydrogen gas, or the like can be added to any of the above-described dry etching apparatuses can be used; however, a dry etching apparatus in which high-frequency power sources with different frequencies are connected to the parallel-plate-type electrodes is preferably used.

Figure 16C:
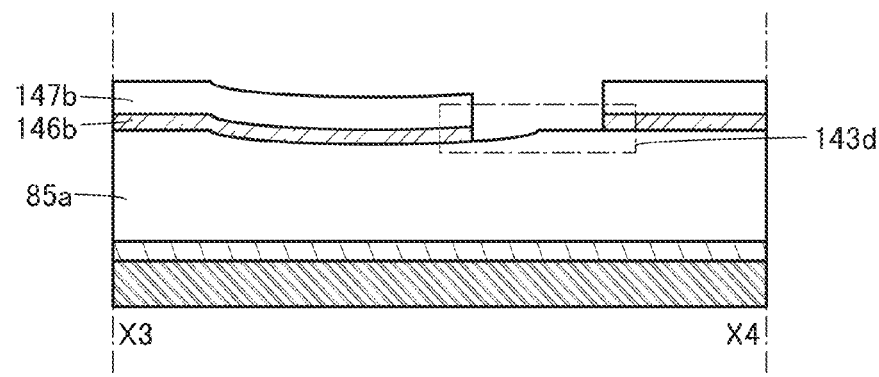
Figure 16D:
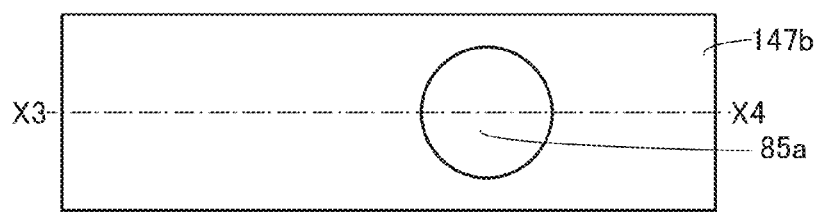

Next, the hard mask 146*a* is etched using the resist mask 147*b*, whereby a hard mask 146*b* having an opening 143*d* is formed (see FIGS. 16C and 16D). The etching is performed so that the top surface of the insulator 85*a* is exposed in the opening 143*d*. Note that dry etching is preferably used for the etching. For the dry etching, for example, a $C_4F_6$ gas, a $C_4F_8$ gas, a $CF_4$ gas, a $SF_6$ gas, a $CHF_3$ gas, a $C_{12}$ gas, a $BCl_3$ gas, a $SiCl_4$ gas, or the like can be used alone or in combination. Alternatively, an oxygen gas, a helium gas, an argon gas, a hydrogen gas, or the like can be added to any of the above gases as appropriate. Any of the above-described dry etching apparatuses can be used; however, a dry etching apparatus in which high-frequency power sources with different frequencies are connected to the parallel-plate-type electrodes is preferably used.

The resist mask 148 and the organic coating film 145*b* are preferably removed after the etching. There is a case where the resist mask 148 disappears in the step of forming the hard mask 147*b* as shown in FIGS. 16A and 16B. There also is a case where the organic coating film 145*b* disappears in the step of forming the hard mask 146*b* as shown in FIGS. 16C and 16D. Note that the disappearance of the resist mask 148 and the organic coating film 145*b* are just examples and do not impose a limit. For example, there is another case in which the resist mask 148 remains in the formation of the hard mask 147*b* and disappears together with the organic coating film 145*b* in the formation of the hard mask 146*b*.

Figure 17A:
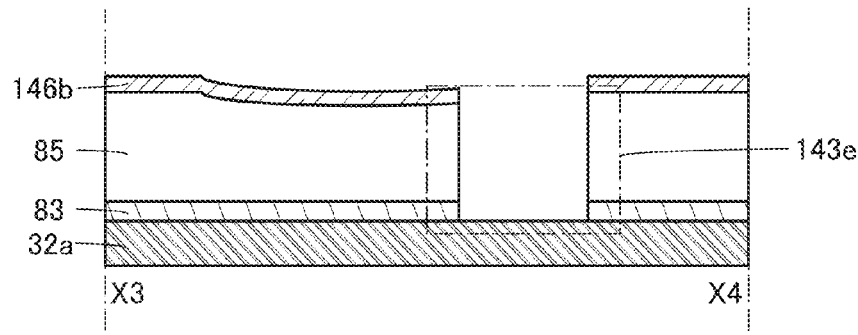
FIGS. 17A to 17D are cross-sectional views and top views illustrating a method for manufacturing a semiconductor device of one embodiment of the present invention.
Figure 17B:
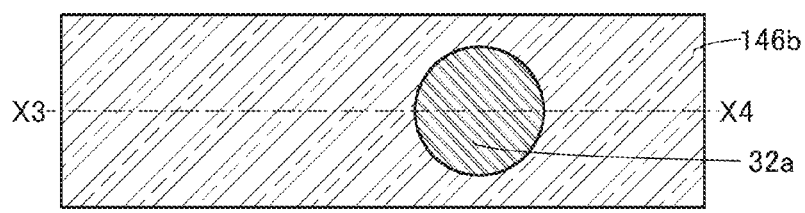

Next, the insulators 85 and 83 are sequentially etched using the hard masks 147*b* and 146*b* so as to have an opening 143*e* (see FIGS. 17A and 17B). The etching here is performed so that the top surface of the conductor 32*a* can be exposed in the opening 143*e*. Note that dry etching is preferably employed for the etching. As a gas for the dry etching, for example, a $C_4F_6$ gas, a $C_4F_8$ gas, a $CF_4$ gas, a $SF_6$ gas, a $CHF_3$ gas, or the like can be used alone or in combination. Alternatively, an oxygen gas, a helium gas, an argon gas, a hydrogen gas, or the like can be added to any of the above gases as appropriate. As the dry etching method, any of the above-described dry etching apparatuses can be used; however, a dry etching apparatus in which high-frequency power sources with different frequencies are connected to the parallel-plate-type electrodes is preferably used. Dry etching conditions such as selection of an etching gas may be determined as appropriate so as to be suitable for insulators used as the insulator 85*a* and the insulator 83*a*.

Since the hard masks 146*b* and 147*b* are stacked, the hard mask 147*b* protects the hard mask 146*b* from the etching gas. This can prevent a drastic change in the shape of the hard mask 146*b* through the etching of the insulators 83*a* and 85*a* (e.g., the opening 143*d* is drastically widened). As a result, an opening 143*e* with high aspect ratio can be formed. Note that the hard mask 147*b* disappears in some cases.

In the case where silicon oxide is used for the insulator 85*a*, the insulator 85*a* can be etched using a capacitively coupled plasma etching apparatus including parallel plate type electrodes under the following conditions: high-frequency power for an upper electrode and a lower electrode are 1800 W and 2000 W, respectively; the pressure is 3.3 Pa; and the flow rates of etching gases of $C_4F_6$, argon, and oxygen are 22 sccm, 800 sccm, and 30 sccm, respectively. In the case where aluminum oxide is used for the insulator 83a, the insulator 83a can be etched using a capacitively coupled plasma etching apparatus including parallel plate type electrodes under the following conditions: high-frequency power for an upper electrode and a lower electrode are 1000 W and 1200 W, respectively; the pressure is 2.3 Pa; and the flow rates of etching gases of $C_4F_8$, argon, and hydrogen are 8 sccm, 475 sccm, and 16 sccm, respectively.

The etching rates of W, Al, titanium nitride, and Ti in the etching conditions of silicon oxide are 15.1 nm/min, 8.0 nm/min, 17.0 nm/min, and 11.7 nm/min, respectively. The etching rates of W, Al, titanium nitride, and Ti in the etching conditions of aluminum oxide are 5.3 nm/min, 37.5 nm/min, 7.3 nm/min, and 2.1 nm/min, respectively. Although the etching rate of Al is relatively higher in the etching conditions of aluminum oxide, the etching rates of W, Al, titanium nitride, and Ti are relatively smaller than the etching rates of silicon oxide and aluminum oxide. Thus, the use of W, Al, titanium nitride, and Ti for the hard mask 146b can reduce the amount of change in the shape of the hard mask 146b in the etching. As a result, the opening 143e with high aspect ratio can be obtained.

When the opening 143e is formed, a by-product is sometimes formed on the side wall of the opening 143e by etching reaction. In that case, the by-product is preferably removed by plasma treatment in an oxygen-containing atmosphere after the opening 143e is formed. The above-described dry etching apparatus can be used for the plasma treatment in an oxygen-containing atmosphere.

Figure 17C:
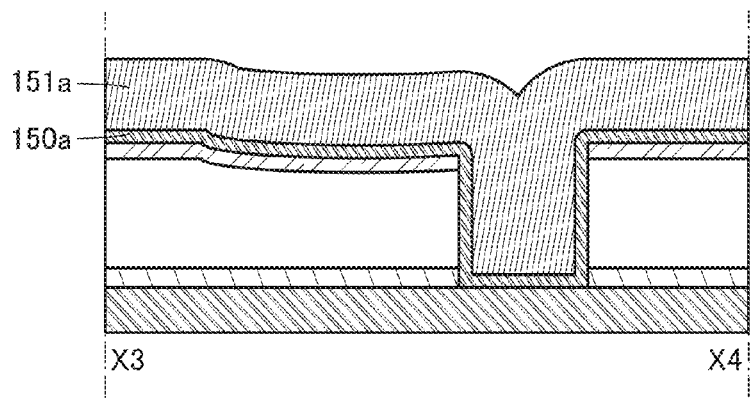
Figure 17D:
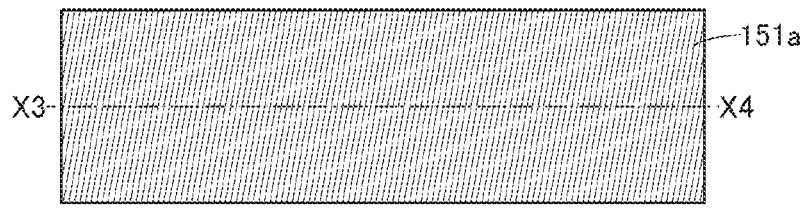

Next, conductors 150a and 151a which fill the openings 143d and 143e are stacked (see FIGS. 17C and 17D). The conductors 150a and 151a will become the conductor 41a in FIG. 14 in a later step and correspond to the conductor 20a in FIGS. 2C and 2D. For the conductors 150a, for example, a single layer or a stacked-layer including any of titanium, tantalum, titanium nitride, tantalum nitride, and the like is used. Effects, e.g., preventing diffusion of metal components contained in the conductor 151a, preventing oxidation of the conductor 151a, and improving adhesion of the conductor 151a with the openings 143d and 143e, can be obtained when the conductor 150a is provided. In addition, the use of a metal nitride, such as tantalum nitride or titanium nitride, in particular tantalum nitride, for the conductor 150a can inhibit impurities such as hydrogen and water from diffusing into the conductor 151a.

The conductors 150a and 151a can be formed by a sputtering method, a CVD method, an MBE method, a PLD method, an ALD method, or the like. Since the conductors 150a and 151a are formed so as to be embedded in the openings 143d and 143e, a CVD method (an MCVD method, in particular) is preferably used. When the conductor 150a is formed by an ALD method, the conductor 150a can have good coverage, and formation of a pin hole and the like in the conductor 150a can be prevented. Forming the conductor 150a in the above manner can further prevent impurities, such as hydrogen and water, from diffusing into the conductor 151a.

Figure 18A:
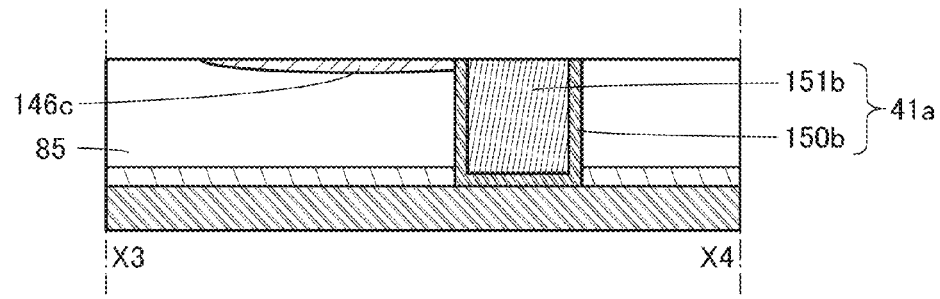
FIGS. 18A to 18D are cross-sectional views and top views illustrating a method for manufacturing a semiconductor device of one embodiment of the present invention.
Figure 18B:
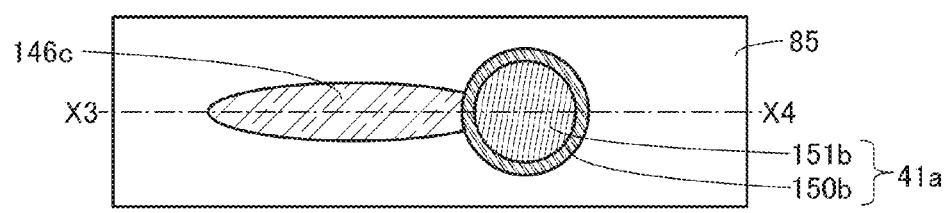

Next, the hard mask 146b and the conductors 150a and 151a are subjected to polishing treatment, so that conductors 150b and 151b embedded in the opening 143e is obtained (see FIGS. 18A and 18B). The conductors 150b and 151b correspond to the conductor 41a shown in FIG. 14. CMP treatment or the like can be performed for the polishing treatment. For example, the CMP treatment can remove the conductors 150a and 151a over the insulator 85 and the hard mask 146b. As a result, the conductors 150a and 151a are left only in the opening 143e in the insulators 85 and 83, so that the conductors 150b and 151b with a flat top surface is obtained.

In the case where a top surface of the insulator 85 is not sufficiently flat, a hard mask residue 146c sometimes remains in a depressed portion on the top surface of the insulator 85 as shown in FIGS. 18A and 18B, after the CMP treatment. The hard mask residue 146c corresponds to the hard mask residue 16c shown in FIGS. 3A and 3B.

Figure 18C:
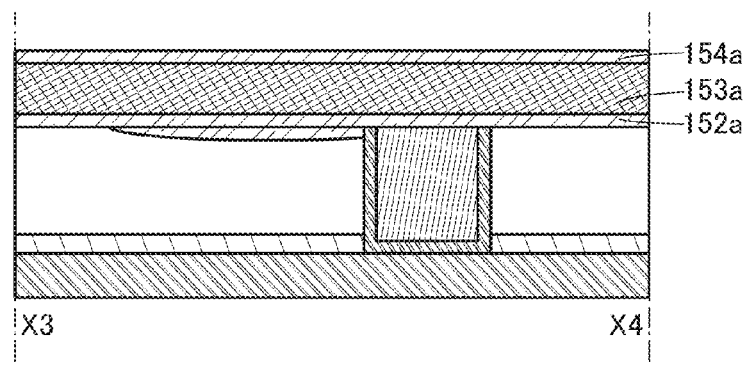
Figure 18D:
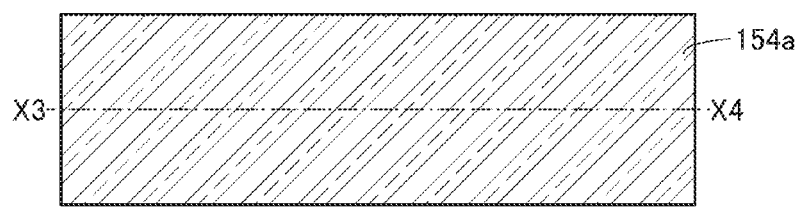

Next, the conductor 152a and conductors 153a and 154a are formed over the insulator 85 and the conductors 150b and 151b (see FIGS. 18C and 18D). The conductors 152a, 153a, and 154a will become the conductor 42a shown in FIG. 14 in a later step and correspond to the conductor 22b in FIGS. 4A and 4B. The conductors 152a, 153a, and 154a can be formed by a sputtering method, a CVD method, an MBE method, a PLD method, an ALD method, or the like.

Since the conductor 153a is formed over the element layers 40 and 30, high-temperature heat treatment is unnecessary after formation of the conductor 153a, in some cases. Accordingly, the conductor 153a is formed using a metal material which has low heat resistance and low resistance, such as aluminum or copper. Owing to this, wiring resistance of the conductor 42a, which will be formed later, can be reduced.

For the conductors 152a and 154a, for example, a single layer or a stacked-layer including any of titanium, tantalum, titanium nitride, tantalum nitride, and the like may be used. Owing to the conductors 152a and 154a, effects, e.g., preventing diffusion of metal components contained in the conductor 153a, preventing oxidation of the conductor 153a, improving adhesion of the conductor 153a with the insulator 85, and preventing change in the shape of the conductor 153a, can be obtained.

Although the stacked-layer structure including the conductor 152a, the conductor 153a, and the conductor 154a in this order is used in this process, a single layer structure, a two-layer structure, or a structure of four or more layers may be used. In the case of a single layer structure, tungsten or the like can be used, for example.

As described above, a material which can be etched with the etching gas for the hard mask residue 146c is used for the conductor 152a. Thus, the hard mask 146a and the conductor 152a preferably contain the same kind of metal element.

Figure 19A:
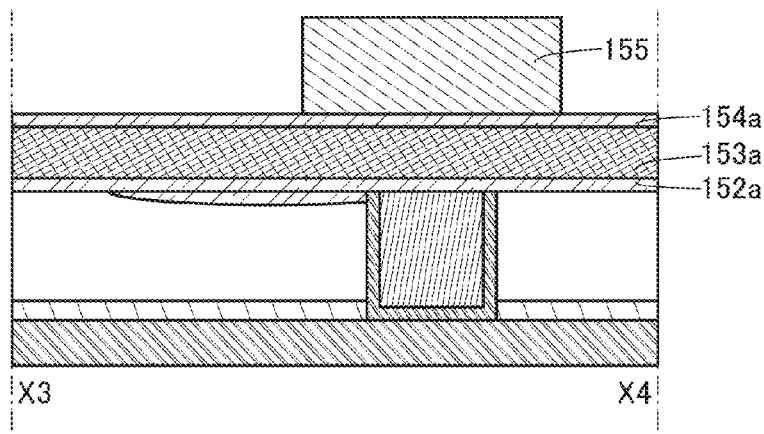
FIGS. 19A to 19D are cross-sectional views and top views illustrating a method for manufacturing a semiconductor device of one embodiment of the present invention.
Figure 19B:
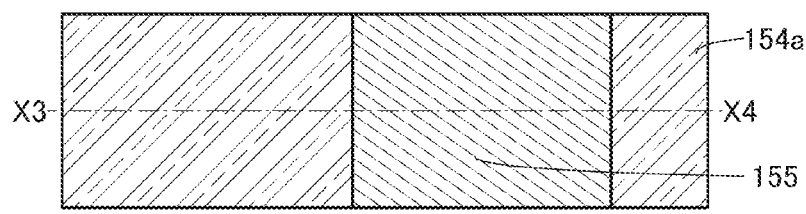

Next, a resist mask 155 is formed in a pattern over the conductor 154a (see FIGS. 19A and 19B). The resist mask 155 can be formed by a lithography method or the like.

Figure 19C:
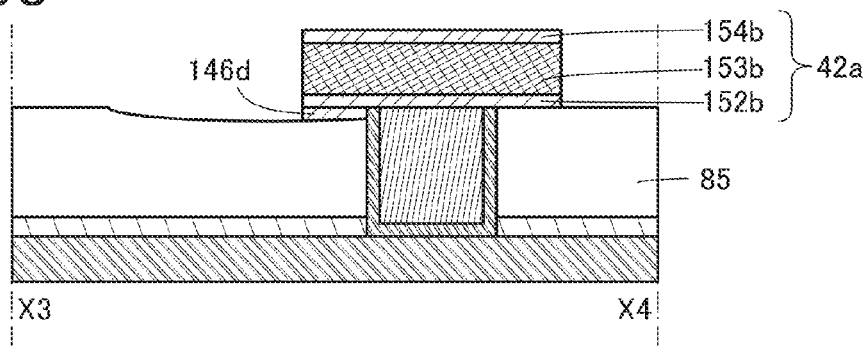
Figure 19D:
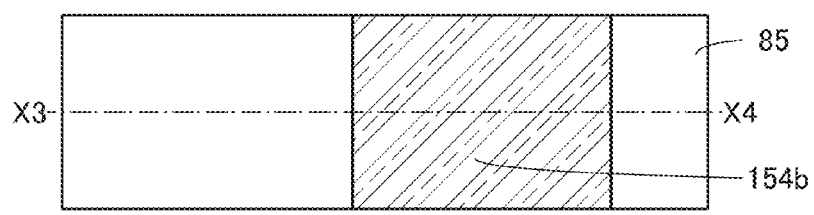

Next, the conductors 152a, 153a, and 154a are etched using the resist mask 155 and an etching gas, so that conductors 152b, 153b, and 154b are obtained (see FIGS. 19C and 19D). The conductors 152b, 153b, and 154b correspond to the conductor 42a shown in FIG. 14.

The etching is performed so that the top surface of the insulator 85 is exposed at a region not overlapping with the resist mask 155. Note that dry etching is preferably employed for the etching. For the dry etching, for example, any of a $C_4F_6$ gas, a $C_4F_8$ gas, a $CF_4$ gas, a $SF_6$ gas, a $CHF_3$ gas, a $C_{12}$ gas, a $BCl_3$ gas, a $SiCl_4$ gas, and the like can be used alone or in combination. Alternatively, an oxygen gas, a helium gas, an argon gas, a hydrogen gas, or the like can be added to any of the above gases as appropriate. Any of the above dry etching apparatuses can be used; however, a dry etching apparatus in which high-frequency power sources with different frequencies are connected to the parallel-plate electrodes is preferably used.

Note that an etching gas which can etch both of the conductor 152a and the hard mask residue 146c is used in the dry etching. Etching conditions, such as power applied to electrodes, the flow rate of the etching gas, and pressure, are also adjusted appropriately so that the conductor 152a and the hard mask residue 146c can be etched.

Note that the resist mask 155 is preferably removed after the etching.

The region of the hard mask residue 146c not overlapping with the resist mask 155 is removed together with the formation of the conductors 152b, 153b, and 154b, so that a hard mask residue 146d remains only in a region overlapping with the conductors 152b, 153b, and 154b. Note that the hard mask residue 146c is thoroughly removed if there is no hard mask residue 146c in the region overlapping with the resist mask 155.

In this manner, leakage between wirings caused by the hard mask residue 146c can be prevented in the semiconductor device in this embodiment even in an integrated circuit whose process rule is smaller. In addition, the wiring (the conductor 42a) can be formed at the same time as the removal of the hard mask residue 16c; thus, the semiconductor device can be manufactured without an increase in the number of steps for removing a hard mask residue.

The plug (the conductor 41a) and the wiring (the conductor 42a) can be formed by the above-described method. Without limitation to the conductor 41a and the conductor 42a, the conductor 51a and the conductor 52a; the conductor 51b and the conductor 52b; the conductor 51c and the conductor 52c; the conductor 111a and the conductor 112a; the conductor 111b and the conductor 112b; the conductor 111c and the conductor 112c; the conductor 121a and the conductor 122a; the conductor 121b and the conductor 122b; the conductor 121c and the conductor 122c; the conductor 31a and the conductor 32a; the conductor 31b and the conductor 32b; the conductor 31c, the conductor 31d, and the conductor 82; the conductor 31e and the conductor 32e; the conductor 41b and the conductor 42b; the conductor 131 and the conductor 132; and the like can be formed by the similar method.

Note that highly heat-resistant metal with high melting point is preferably used for the wirings and plugs below the element layer 30 or 40 because there is a case where the layers are subjected to high-temperature heat treatment after their formation. For example, tungsten, titanium, tantalum, titanium nitride, tantalum nitride, or the like may be used Note that the above described method is not necessarily employed to form the conductors serving as plugs or wirings. For example, a single damascene method or a dual damascene method may be employed to form the conductors serving as plugs or wirings below the electrode layer 30.

As described above, with the use of the method for manufacturing a semiconductor described in this embodiment, a semiconductor device which can prevent leakage of current between wirings can be provided. With the use of the method for manufacturing a semiconductor described in this embodiment, a semiconductor device which can prevent leakage of current between wirings can be provided without an increase in the number of steps. With the use of the method for manufacturing a semiconductor described in this embodiment, a semiconductor device which includes an oxide semiconductor and which can prevent leakage of current between wirings. With the use of the method for manufacturing a semiconductor described in this embodiment, a miniaturized semiconductor device can be provided.

The structure and method described in this embodiment can be combined as appropriate with any of the other structures and methods described in the other embodiments.

Embodiment 2

In this embodiment, an oxide semiconductor included in a semiconductor device of one embodiment of the present invention is described below in detail.

<Structure of oxide semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 23A:
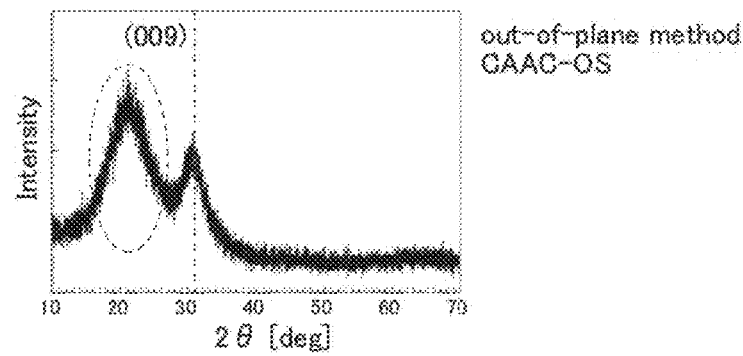
FIGS. 23A to 23E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 23A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 23B:
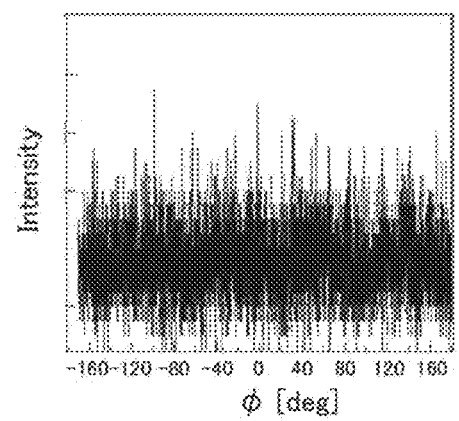
Figure 23C:
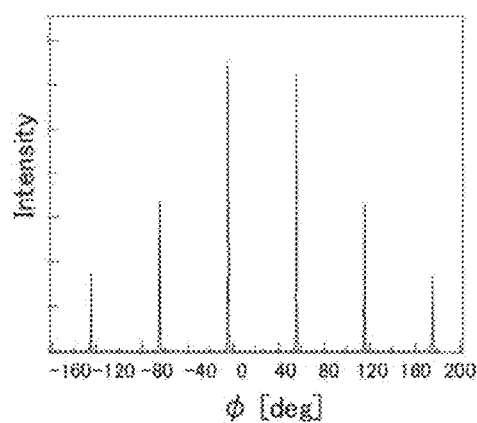

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (ϕ axis), as shown in FIG. 23B, a peak is not clearly observed. In contrast, in the case where single crystal InGaZnO$_4$ is subjected to ϕ scan with 2θ fixed at around 56°, as shown in FIG. 23C, six peaks that are derived from crystal planes equivalent to the (110) plane are observed. Accordingly, the structural analysis using XRD shows that the directions of a-axes and b-axes are irregularly oriented in the CAAC-OS.

Figure 23D:
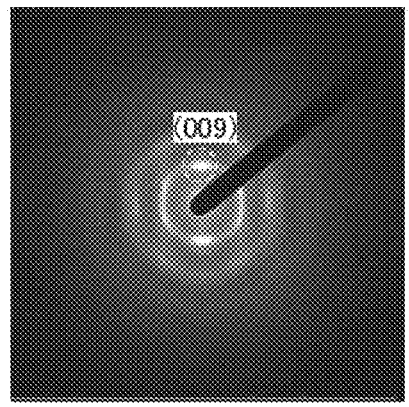
Figure 23E:
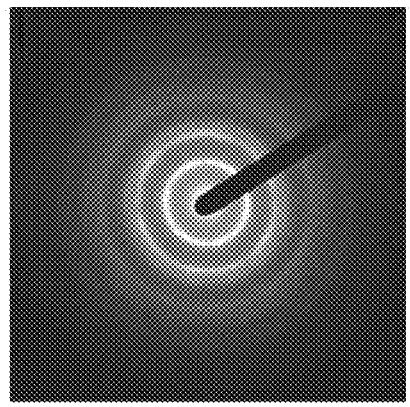

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 23D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 23E shows a diffraction pattern obtained in such a manner that an electron beam with a probe diameter of 300 nm is incident on the same sample in a direction perpendicular to the sample surface. As shown in FIG. 23E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 23E is derived from the (010) plane, the (100) plane, and the like of the InGaZnO$_4$ crystal. The second ring in FIG. 23E is derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 24A:
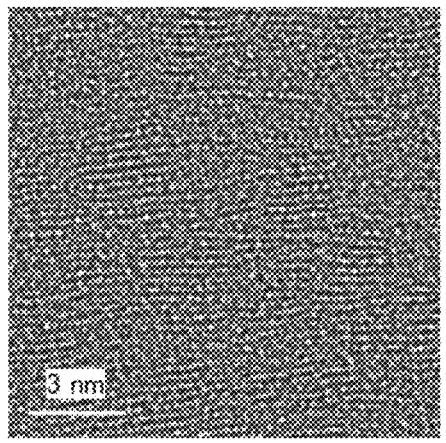
FIGS. 24A to 24E show a cross-sectional TEM image and plan-view TEM images of a CAAC-OS and images obtained through analysis thereof.

FIG. 24A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 24A shows pellets in which metal atoms are arranged in a layered manner. FIG. 24A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 24B:
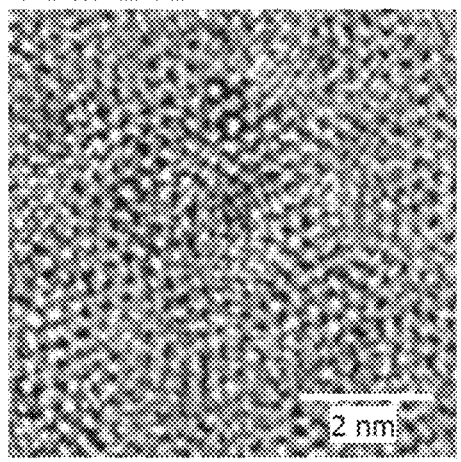
Figure 24C:
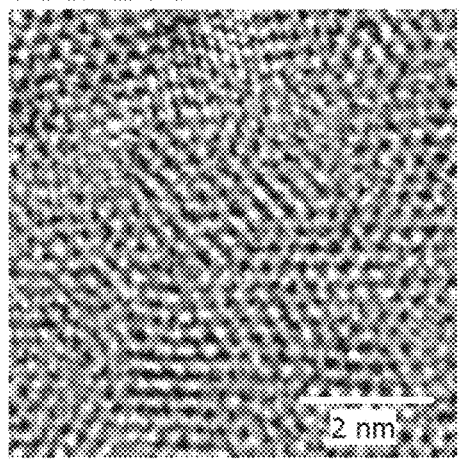
Figure 24D:
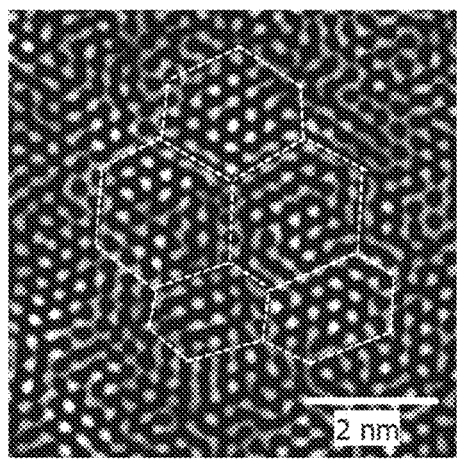
Figure 24E:
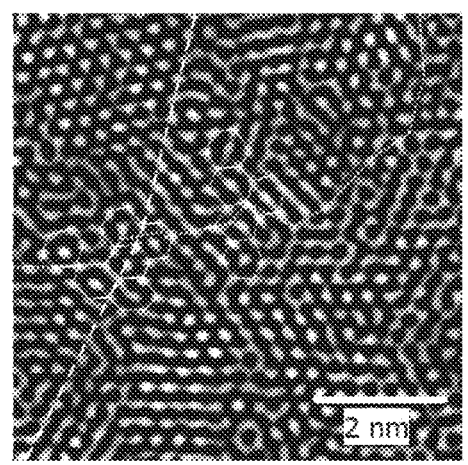

FIGS. 24B and 24C show Cs-corrected high-resolution TEM images of a plane of the CAAC-OS observed from a direction substantially perpendicular to the sample surface. FIGS. 24D and 24E are images obtained through image processing of FIGS. 24B and 24C. The method of image processing is as follows. The images in FIGS. 24B and 24C are subjected to fast Fourier transform (FFT), so that FFT images are obtained. Then, mask processing is performed such that a range of from 2.8 nm$^{-1}$ to 5.0 nm$^{-1}$ from the origin point in the obtained FFT images remains. After the mask processing, the FFT images are processed by inverse fast Fourier transform (IFFT) to obtain processed images. The images obtained in this manner are called FFT filtering images. An FFT filtering image is a Cs-corrected high-resolution TEM image from which a periodic component is extracted, and shows a lattice arrangement.

In FIG. 24D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 24E, a dotted line denotes a portion where the direction of a lattice arrangement is changed between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. For example, oxygen vacancies in the oxide semiconductor might serve as carrier traps or serve as carrier generation sources when hydrogen is captured therein.

The CAAC-OS having small amounts of impurities and oxygen vacancies is an oxide semiconductor film with a low carrier density (specifically, lower than $8\times10^{11}$/cm$^3$, preferably lower than $1\times10^{11}$/cm$^3$, and further preferably lower than $1\times10^{10}$/cm$^3$ and higher than or equal to $1\times10^{-9}$/cm$^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor which can exhibit stable transistor characteristics.

<Nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 25A:
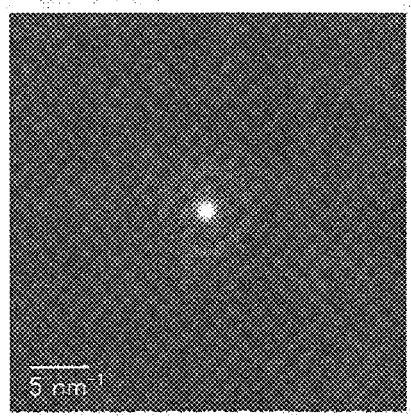
FIGS. 25A to 25D show electron diffraction patterns and a cross-sectional TEM image of an nc-OS.
Figure 25B:
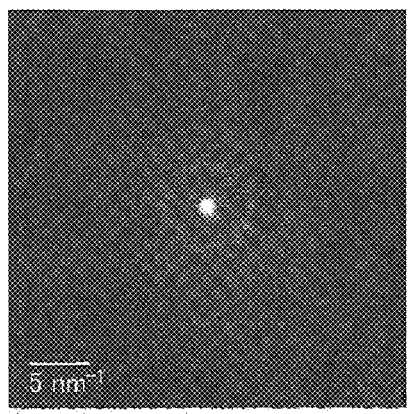

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 25A is observed. FIG. 25B shows a diffraction pattern obtained when an electron beam with a probe diameter of 1 nm is incident on the same sample. As shown in FIG. 25B, a plurality of spots are observed in a ring-like region. In other words, ordering in an nc-OS is not observed with an electron beam with a probe diameter of 50 nm but is observed with an electron beam with a probe diameter of 1 nm.

Figure 25C:
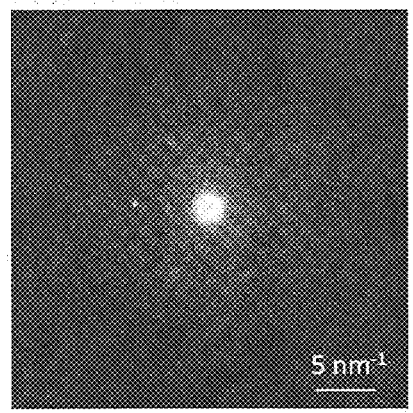

Furthermore, an electron diffraction pattern in which spots are arranged in an approximately regular hexagonal shape is observed in some cases as shown in FIG. 25C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 25D:
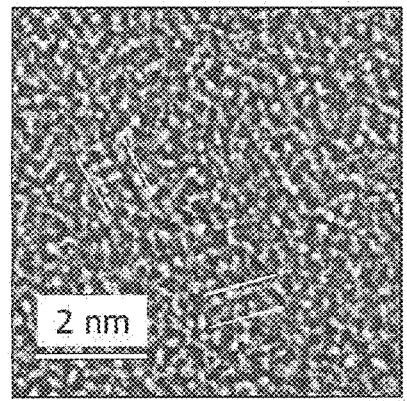

FIG. 25D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 25D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure between those of the nc-OS and the amorphous oxide semiconductor.

Figure 26A:
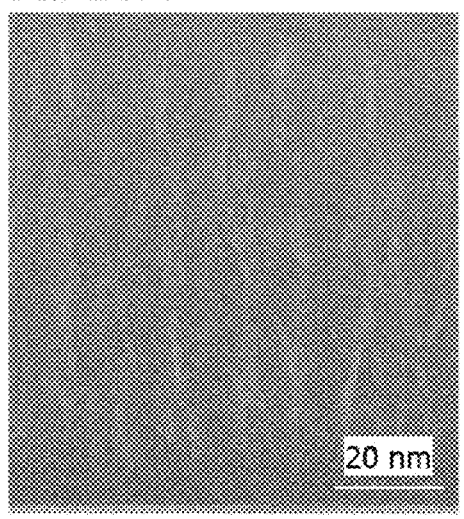
FIGS. 26A and 26B show cross-sectional TEM images of an a-like OS.
Figure 26B:
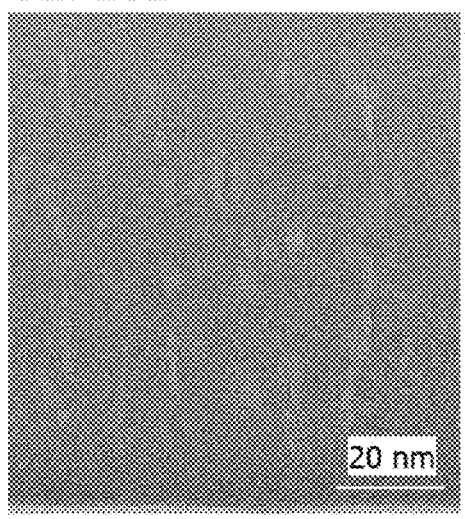

FIGS. 26A and 26B are high-resolution cross-sectional TEM images of an a-like OS. FIG. 26A is the high-resolution cross-sectional TEM image of the a-like OS at the start of the electron irradiation. FIG. 26B is the high-resolution cross-sectional TEM image of a-like OS after the electron (e$^-$) irradiation at $4.3\times10^8$ e$^-$/nm$^2$. FIGS. 26A and 26B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 27:
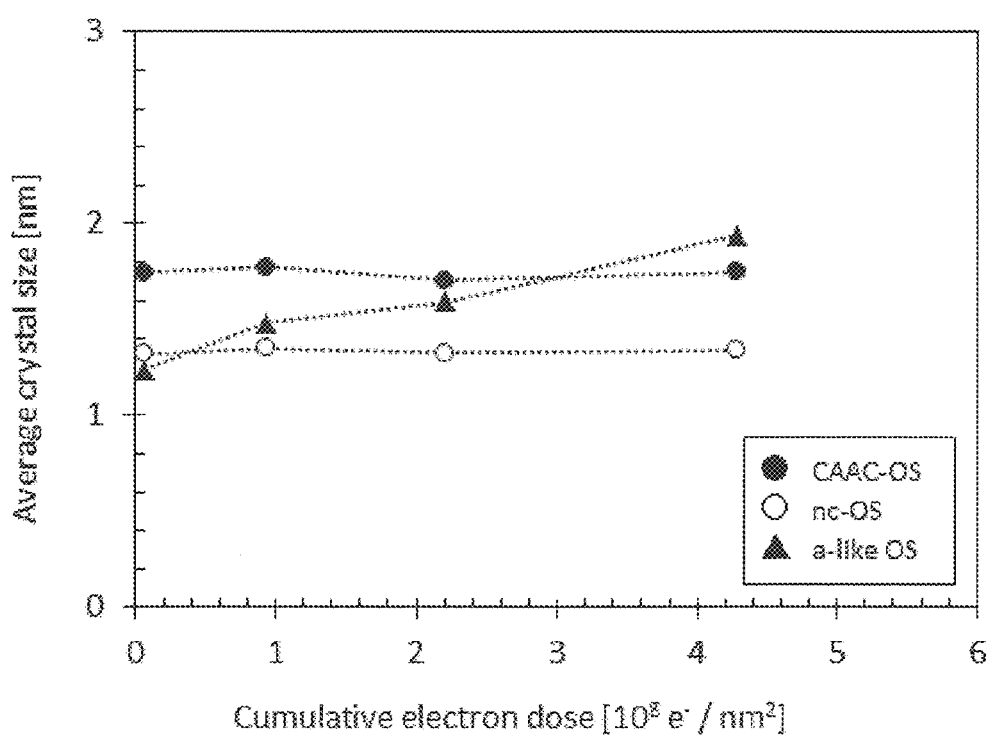
FIG. 27 shows a change in crystal part of an In—Ga—Zn oxide induced by electron irradiation.

FIG. 27 shows a change in the average size of crystal parts (at 22 points to 30 points) in each sample. Note that the crystal part size corresponds to the length of a lattice fringe. FIG. 27 indicates that the crystal part size in the a-like OS increases with an increase in the cumulative electron dose in obtaining TEM images, for example. As shown in FIG. 27, a crystal part of approximately 1.2 nm (also referred to as an initial nucleus) at the start of TEM observation grows to a size of approximately 1.9 nm at a cumulative electron (e) dose of $4.2\times10^8$ e$^-$/nm$^2$. In contrast, the crystal part size in the nc-OS and the CAAC-OS shows little change from the start of electron irradiation to a cumulative electron dose of $4.2\times10^8$ e/nm$^2$. As shown in FIG. 27, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7\times10^5$ e$^-$/(nm$^2$·s); and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

The structures and methods described in this embodiment can be used in combination as appropriate with any of the other structures and methods described in the other embodiments.

Embodiment 3

Figure 28A:
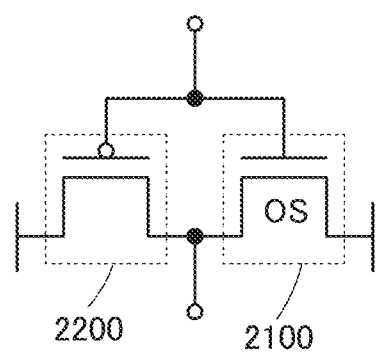
FIGS. 28A and 28B are circuit diagrams each illustrating a semiconductor device of one embodiment of the present invention.

In this embodiment, an example of a circuit of a semiconductor device including the transistor or the like of one embodiment of the present invention is described.
<CMOS Inverter>
A circuit diagram in FIG. 28A shows a configuration of what is called a CMOS inverter in which a p-channel transistor 2200 and an n-channel transistor 2100 are connected to each other in series and in which gates of them are connected to each other. Here, the transistors 2200 and 2100 are formed using the element layers 50 and 30, respectively, whereby the circuit shown in FIG. 28A can be configured using the semiconductor device illustrated in FIG. 9C or the like.

Figure 28B:
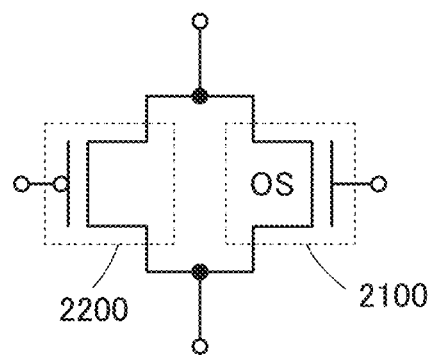

In the semiconductor device shown in FIG. 28A, a p-channel transistor is formed utilizing a semiconductor substrate, and an n-channel transistor is formed above that; therefore, the area occupied by the element can be reduced. That is, the integration degree of the semiconductor device can be improved. In addition, the manufacturing process can be simplified compared with the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared with a semiconductor device where an n-channel transistor is formed utilizing the semiconductor substrate.
<CMOS Analog Switch>
A circuit diagram in FIG. 28B shows a configuration in which sources of the transistors 2100 and 2200 are connected to each other and drains of the transistors 2100 and 2200 are connected to each other. With such a configuration, the transistors can function as a so-called CMOS analog switch. Here, the transistors 2200 and 2100 are formed using the element layers 50 and 30, respectively, whereby the circuit shown in FIG. 28B can be configured using the semiconductor device illustrated in FIG. 9C or the like.
<Memory Device 1>
An example of a semiconductor device (memory device) which includes the transistor of one embodiment of the present invention, which can retain stored data even when not powered, and which has an unlimited number of write cycles is shown in FIGS. 29A and 29B.

Figure 29A:
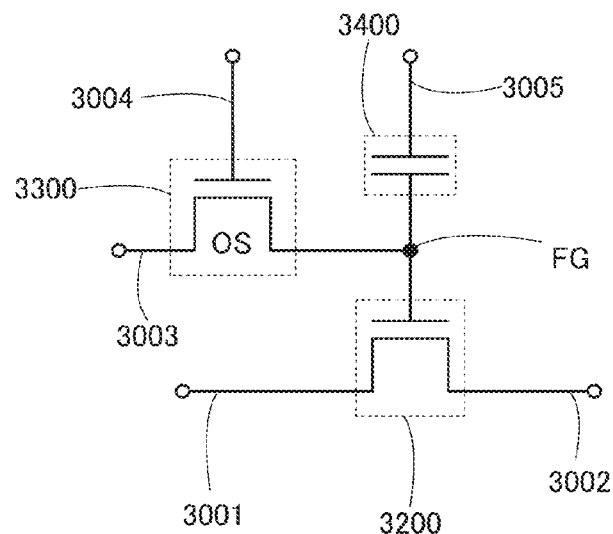
FIGS. 29A to 29C are each a circuit diagram illustrating a memory device of one embodiment of the present invention.
Figure 29B:
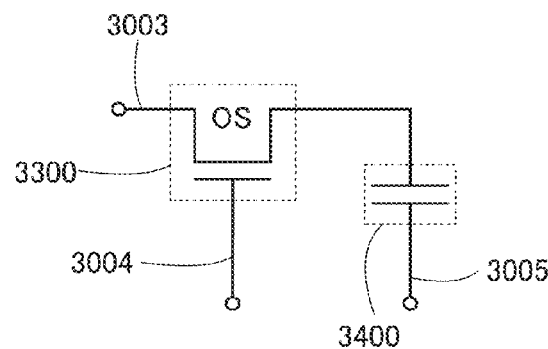

The semiconductor device illustrated in FIG. 29A includes a transistor 3200 using a first semiconductor, a transistor 3300 using a second semiconductor, and a capacitor 3400. Note that a transistor similar to the above-described transistor 2100 can be used as the transistor 3300. Here, the transistor 3200 is formed using the element layer 50, the transistor 3300 is formed using the element layer 30, and the capacitor 3400 is formed using the element layer 40, whereby the circuit shown in FIG. 29A can be configured using the semiconductor device illustrated in FIG. 10A or 10B.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 29A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 29A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined electric charge is supplied to the gate of the transistor 3200 (writing). Here, one of two kinds of electric charge providing different potential levels (hereinafter referred to as a low-level electric charge and a high-level electric charge) is supplied. After that, the potential of the fourth wiring 3004 is set to a potential at which the transistor 3300 is off, so that the transistor 3300 is turned off. Thus, the electric charge is held at the node FG (retaining).

Since the off-state current of the transistor 3300 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of electric charge retained in the node FG. This is because in the case of using an n-channel transistor as the transistor 3200, an apparent threshold voltage $V_{th\_H}$ at the time when the high-level electric charge is given to the gate of the transistor 3200 is lower than an apparent threshold voltage $V_{th\_L}$ at the time when the low-level electric charge is given to the gate of the transistor 3200. Here, an apparent threshold voltage refers to the potential of the fifth wiring 3005 which is needed to make the transistor 3200 be in on state. Thus, the potential of the fifth wiring 3005 is set to a potential $V_0$ which is between $V_{th\_H}$ and $V_{th\_L}$, whereby electric charge supplied to the node FG can be determined. For example, in the case where the high-level electric charge is supplied to the node FG in writing and the potential of the fifth wiring 3005 is $V_0$ ($>V_{th\_H}$), the transistor 3200 is brought into on state. In the case where the low-level electric charge is supplied to the node FG in writing, even when the potential of the fifth wiring 3005 is $V_0$ ($<V_{th\_L}$), the transistor 3200 still remains in off state. Thus, the data retained in the node FG can be read by determining the potential of the second wiring 3002.

Note that in the case where memory cells are arrayed, it is necessary that data of a desired memory cell be read in read operation. A configuration in which only data of a desired memory cell can be read by supplying a potential at which the transistor 3200 is brought into an off state regardless of the charge supplied to the node FG, that is, a potential lower than $V_{th\_H}$ to the fifth wiring 3005 of memory cells from which data is not read may be employed, for example. Alternatively, a configuration in which only data of a desired memory cell can be read by supplying a potential at which the transistor 3200 is brought into an on state regardless of the charge supplied to the node FG, that is, a potential higher than $V_{th\_L}$ to the fifth wiring 3005 of memory cells from which data is not read may be employed.

Although an example in which two kinds of electric charge are retained in the node FG, the semiconductor device of the present invention is not limited to this example. For example, a structure in which three or more kinds of electric charge can be retained in the node FG of the semiconductor device may be employed. With such a structure, the semiconductor device can be a multi-level semiconductor device with increased storage capacity.

<Memory Device 2>

The semiconductor device in FIG. 29B is different from the semiconductor device in FIG. 29A in that the transistor 3200 is not provided. Also in this case, data can be written and retained in a manner similar to that of the semiconductor device in FIG. 29A. Here, the transistor 3300 and the capacitor 3400 are formed using the element layers 30 and 40, respectively, whereby the circuit shown in FIG. 29B can be configured using the semiconductor device illustrated in FIGS. 9B and 9D. In addition, a sense amplifier or the like can be provided below the semiconductor device shown in FIG. 29B, in which case the semiconductor device illustrated in FIG. 10A or 10B can be used in the sense amplifier.

Reading of data in the semiconductor device in FIG. 29B is described. When the transistor 3300 is brought into on state, the third wiring 3003 which is in a floating state and the capacitor 3400 are brought into conduction, and the electric charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the electric charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is unlikely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Memory Device 3>

A modification example of the semiconductor device (memory device) illustrated in FIG. 29A is described with reference to a circuit diagram in FIG. 30.

Figure 30:
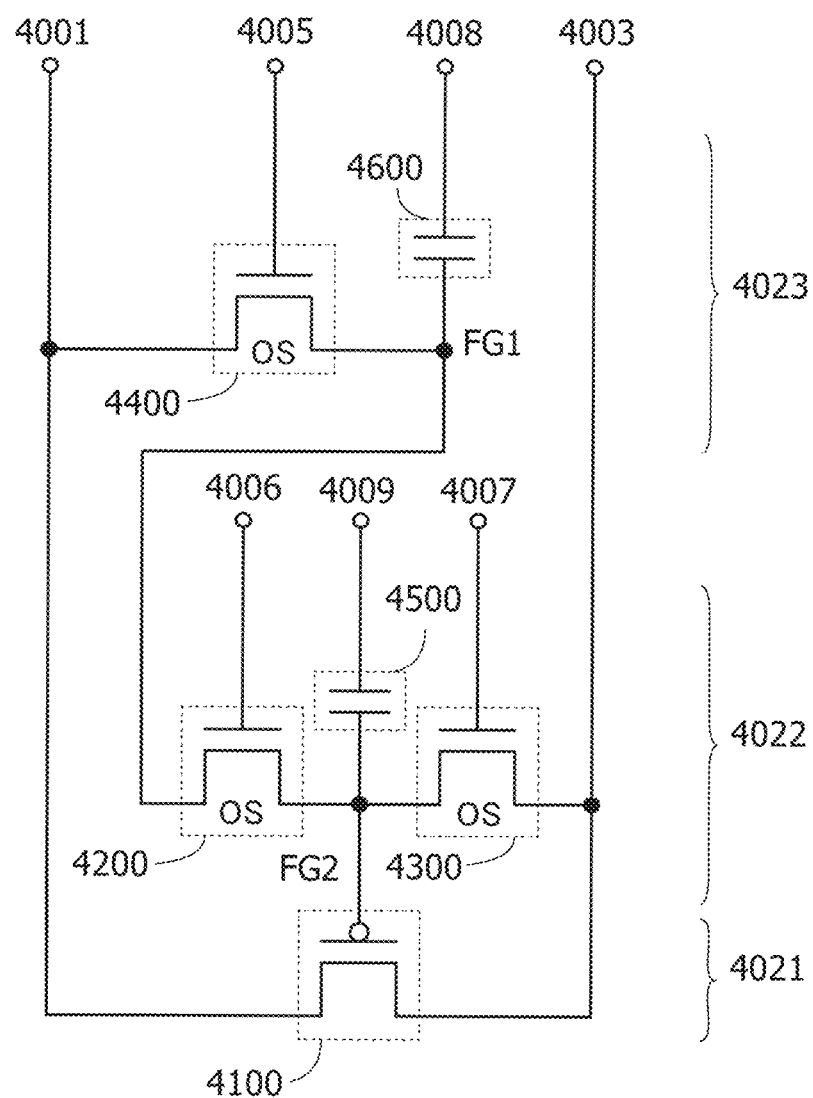
FIG. 30 is a circuit diagram illustrating a memory device of one embodiment of the present invention.

The semiconductor device illustrated in FIG. 30 includes transistors 4100, 4200, 4300, and 4400 and capacitors 4500 and 4600. Here, a transistor similar to the above-described transistor 3200 can be used as the transistor 4100, and transistors similar to the above-described transistor 3300 can be used as the transistors 4200 to 4400. Although not illustrated in FIG. 30, a plurality of semiconductor devices in FIG. 30 is provided in a matrix. The semiconductor devices in FIG. 30 can control writing and reading of a data voltage in accordance with a signal or a potential supplied to a wiring 4001, a wiring 4003, and wirings 4005 to 4009. Here, the transistor 4100 is formed using the element layer 50, the transistors 4200, 4300, and 4400 are formed using the element layer 30, and the capacitors 4500 and 4600 are formed using the element layer 40, whereby the circuit shown in FIG. 30 can be configured using the semiconductor device illustrated in FIG. 10A or 10B.

One of a source and a drain of the transistor 4100 is connected to the wiring 4003. The other of the source and the drain of the transistor 4100 is connected to the wiring 4001. Although the transistor 4100 is a p-channel transistor in FIG. 30, the transistor 4100 may be an n-channel transistor.

The semiconductor device in FIG. 30 includes two data retention portions. For example, a first data retention portion retains an electric charge between one of a source and a drain of the transistor 4400, one electrode of the capacitor 4600, and one of a source and a drain of the transistor 4200 which are connected to a node FG1. A second data retention portion retains an electric charge between a gate of the transistor 4100, the other of the source and the drain of the transistor 4200, one of a source and a drain of the transistor 4300, and one electrode of the capacitor 4500 which are connected to a node FG2.

The other of the source and the drain of the transistor 4300 is connected to the wiring 4003. The other of the source and the drain of the transistor 4400 is connected to the wiring 4001. A gate of the transistor 4400 is connected to the wiring 4005. A gate of the transistor 4200 is connected to the wiring 4006. A gate of the transistor 4300 is connected to the wiring 4007. The other electrode of the capacitor 4600 is connected to the wiring 4008. The other electrode of the capacitor 4500 is connected to the wiring 4009.

The transistors 4200, 4300, and 4400 each function as a switch for control of writing a data voltage and retaining an electric charge. Note that, as each of the transistors 4200, 4300, and 4400, it is preferable to use a transistor having a low current that flows between a source and a drain in an off state (low off-state current). As an example of the transistor with a low off-state current, a transistor including an oxide semiconductor in its channel formation region (an OS transistor) is preferably used. An OS transistor has a low off-state current and can be manufactured to overlap with a transistor including silicon, for example. Although the transistors 4200, 4300, and 4400 are n-channel transistors in FIG. 30, the transistors 4200, 4300, and 4400 may be p-channel transistors.

The transistors 4200 and 4300 are preferably provided in a layer different from the layer where the transistor 4400 is provided even when the transistors 4200, 4300, and 4400 are transistors including oxide semiconductors. In other words, the semiconductor device in FIG. 30 preferably includes, as illustrated in FIG. 30, a first layer 4021 where the transistor 4100 is provided, a second layer 4022 where the transistors 4200 and 4300 are provided, and a third layer 4023 where the transistor 4400 is provided. By stacking layers where transistors are provided, the circuit area can be reduced, so that the size of the semiconductor device can be reduced.

Next, operation of writing data to the semiconductor device illustrated in FIG. 30 is described.

First, operation of writing data voltage to the data retention portion connected to the node FG1 (hereinafter referred to as writing operation 1) is described. In the following description, data voltage written to the data retention portion connected to the node FG1 is $V_{D1}$, and the threshold voltage of the transistor 4100 is $V_{th}$.

In the writing operation 1, the potential of the wiring 4003 is set at $V_{D1}$, and after the potential of the wiring 4001 is set at a ground potential, the wiring 4001 is brought into an electrically floating state. The wirings 4005 and 4006 are set at a high level. The wirings 4007 to 4009 are set at a low level. Then, the potential of the node FG2 in the electrically floating state is increased, so that a current flows through the transistor 4100. The current flows through the transistor 4100, so that the potential of the wiring 4001 is increased. The transistors 4400 and 4200 are turned on. Thus, as the potential of the wiring 4001 is increased, the potentials of the nodes FG1 and FG2 are increased. When the potential of the node FG2 is increased and a voltage ($V_{gs}$) between a gate and a source of the transistor 4100 reaches the threshold voltage $V_{th}$ of the transistor 4100, the current flowing through the transistor 4100 is decreased. Accordingly, the potentials of the wiring 4001 and the nodes FG1 and FG2 stop increasing, so that the potentials of the nodes FG1 and FG2 are fixed at "$V_{D1}-V_{th}$" in which $V_{D1}$ is decreased by $V_{th}$.

When a current flows through the transistor 4100, VD' supplied to the wiring 4003 is supplied to the wiring 4001, so that the potentials of the nodes FG1 and FG2 are increased. When the potential of the node FG2 becomes "$V_{D1}-V_{th}$" with the increase in the potentials, $V_{gs}$ of the transistor 4100 becomes $V_{th}$, so that the current flow is stopped.

Next, operation of writing data voltage to the data retention portion connected to the node FG2 (hereinafter referred to as writing operation 2) is described. In the following description, data voltage written to the data retention portion connected to the node FG2 is $V_{D2}$.

In the writing operation 2, the potential of the wiring 4001 is set at $V_{D2}$, and after the potential of the wiring 4003 is set at a ground potential, the wiring 4003 is brought into an electrically floating state. The wiring 4007 is set at the high level. The wirings 4005, 4006, 4008, and 4009 are set at the low level. The transistor 4300 is turned on, so that the wiring 4003 is set at the low level. Thus, the potential of the node FG2 is decreased to the low level, so that the current flows through the transistor 4100. By the current flow, the potential of the wiring 4003 is increased. The transistor 4300 is turned on. Thus, as the potential of the wiring 4003 is increased, the potential of the node FG2 is increased. When the potential of the node FG2 is increased and $V_{gs}$ of the transistor 4100 becomes $V_{th}$ of the transistor 4100, the current flowing through the transistor 4100 is decreased. Accordingly, an increase in the potentials of the wiring 4003 and the node FG2 is stopped, so that the potential of the node FG2 is fixed at "$V_{D2}-V_{th}$" in which $V_{D2}$ is decreased by $V_{th}$.

In other words, when a current flows through the transistor 4100, $V_{D2}$ supplied to the wiring 4001 is supplied to the wiring 4003, so that the potential of the node FG2 is increased. When the potential of the node FG2 becomes "$V_{D2}-V_{th}$" with the increase in the potential, $V_{gs}$ of the transistor 4100 becomes $V_{th}$, so that the current flow is stopped. At this time, the transistors 4200 and 4400 are off and the potential of the node FG1 remains at "$V_{D1}-V_{th}$" written in the writing operation 1.

In the semiconductor device in FIG. 30, after data voltages are written to the plurality of data retention portions, the wiring 4009 is set at the high level, so that the potentials of the nodes FG1 and FG2 are increased. Then, the transistors are turned off to stop the movement of electric charge; thus, the written data voltages are retained.

By the above-described writing operation of the data voltages to the nodes FG1 and FG2, the data voltages can be retained in the plurality of data retention portions. Although examples where "$V_{D1}-V_{th}$" and "$V_{D2}-V_{th}$" are used as the written potentials are described, they are data voltages corresponding to multi-level data. Therefore, in the case where the data retention portions each retain 4-bit data, 16-level "$V_{D1}-V_{th}$" and 16-level "$V_{D2}-V_{th}$" can be obtained.

Next, operation of reading data from the semiconductor device illustrated in FIG. 30 is described.

First, operation of reading data voltage to the data retention portion connected to the node FG2 (hereinafter referred to as reading operation 1) is described.

In the reading operation 1, after precharge is performed, the wiring 4003 in an electrically floating state is discharged. The wirings 4005 to 4008 are set low. When the wiring 4009 is set low, the potential of the node FG2 which is electrically floating is set at "$V_{D2}-V_{th}$". The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D2}$" which is larger than the potential of the node FG2, "$V_{D2}-V_{th}$", by $V_{th}$. The potential of the wiring 4003 corresponds to the data voltage of the data retention portion connected to the node FG2. The data voltage of the read analog value is subjected to A/D conversion, so that data of the data retention portion connected to the node FG2 is obtained.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D2}$". In the transistor 4100, $V_{gs}$ between "$V_{D2}-V_{th}$" of the node FG2 and "$V_{D2}$" of the wiring 4003 becomes $V_{th}$, so that the current stops. Then, "$V_{D2}$" written in the writing operation 2 is read to the wiring 4003.

After data in the data retention portion connected to the node FG2 is obtained, the transistor 4300 is turned on to discharge "$V_{D2}-V_{th}$" of the node FG2.

Then, the electric charges retained in the node FG1 are distributed between the node FG1 and the node FG2, data voltage in the data retention portion connected to the node FG1 is transferred to the data retention portion connected to the node FG2. The wirings 4001 and 4003 are set low. The wiring 4006 is set high. The wiring 4005 and the wirings 4007 to 4009 are set low. When the transistor 4200 is turned on, the electric charges in the node FG1 are distributed between the node FG1 and the node FG2.

Here, the potential after the electric charge distribution is decreased from the written potential, "$V_{D1}-V_{th}$". Thus, the capacitance of the capacitor 4600 is preferably larger than the capacitance of the capacitor 4500. Alternatively, the potential written to the node FG1, "$V_{D1}-V_{th}$", is preferably larger than the potential corresponding to the same data, "$V_{D2}-V_{th}$". By changing the ratio of the capacitances and setting the written potential larger in advance as described above, a decrease in potential after the electric charge distribution can be suppressed. The change in potential due to the electric charge distribution is described later.

Next, operation of reading data voltage to the data retention portion connected to the node FG1 (hereinafter referred to as reading operation 2) is described.

In the reading operation 2, the wiring 4003 which is brought into an electrically floating state after precharge is discharged. The wirings 4005 to 4008 are set low. The wiring 4009 is set high at the time of precharge and then, set low. When the wiring 4009 is set low, the potential of the node FG2 which is electrically floating is set at "$V_{D1}-V_{th}$". The potential of the node FG2 is decreased, so that a current flows through the transistor 4100. The current flows, so that the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D1}$" which is larger than the potential of the node FG2, "$V_{D1}-V_{th}$", by $V_{th}$. The potential of the wiring 4003 corresponds to the data voltage of the data retention portion connected to the node FG1. The data voltage of the read analog value is subjected to A/D conversion, so that data of the data retention portion connected to the node FG1 is obtained. The above is the reading operation of the data voltage of the data retention portion connected to the node FG1.

In other words, the wiring 4003 after precharge is brought into a floating state and the potential of the wiring 4009 is changed from high to low, whereby a current flows through the transistor 4100. When the current flows, the potential of the wiring 4003 which is in a floating state is decreased to be "$V_{D1}$". In the transistor 4100, $V_{gs}$ between "$V_{D1}-V_{th}$" of the node FG2 and "$V_{D1}$" of the wiring 4003 becomes $V_{th}$, so that the current stops. Then, "$V_{D1}$" written in the writing operation 1 is read to the wiring 4003.

In the above-described reading operation of data voltages from the nodes FG1 and FG2, the data voltages can be read from the plurality of data retention portions. For example, 4-bit (16-level) data is retained in each of the node FG1 and the node FG2, whereby 8-bit (256-level) data can be retained in total. Although the first to third layers 4021 to 4023 are provided in the structure illustrated in FIG. 30, the storage capacity can be increased by adding layers without increasing the area of the semiconductor device.

The read potential can be read as a voltage larger than the written data voltage by $V_{th}$. Therefore, $V_{th}$ of "$V_{D1}-V_{th}$" and $V_{th}$ of "$V_{D2}-V_{th}$" written in the writing operation can be canceled out in reading. As a result, the storage capacity per memory cell can be improved and read data can be close to accurate data; thus, the data reliability becomes excellent.

<Memory Device 4>

Figure 29C:
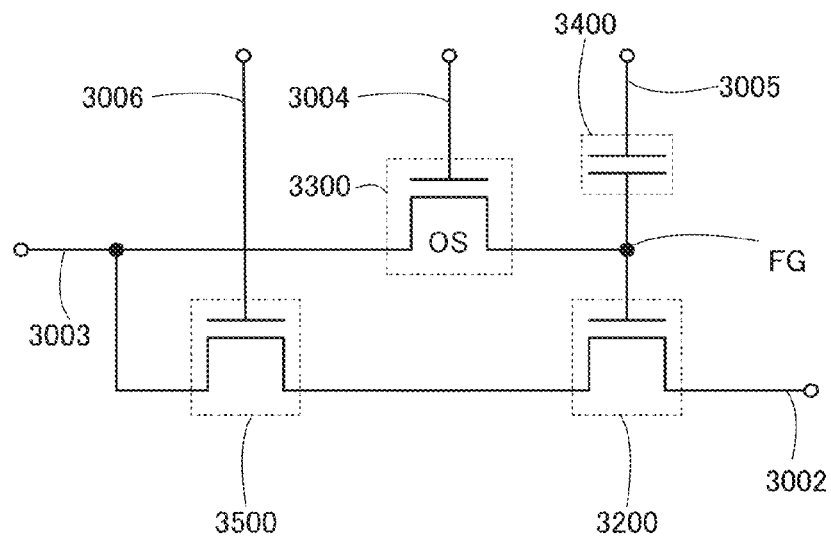

The semiconductor device in FIG. 29C is different from the semiconductor device in FIG. 29A in that the transistor 3500 and a sixth wiring 3006 are included. Also in this case, data can be written and retained in a manner similar to that of the semiconductor device in FIG. 29A. A transistor similar to the transistor 3200 described above can be used as the transistor 3500. Here, the transistor 3200 and the transistor 3500 are each formed using the element layer 50, the transistor 3300 is formed using the element layer 30, and the capacitor 3400 is formed using the element layer 40, whereby the circuit shown in FIG. 29C can be configured using the semiconductor device illustrated in FIG. 10A or 10B.

The sixth wiring 3006 is electrically connected to a gate of the transistor 3500, one of a source and a drain of the transistor 3500 is electrically connected to the drain of the transistor 3200, and the other of the source and the drain of the transistor 3500 is electrically connected to the third wiring 3003.

The structure described in this embodiment can be used in appropriate combination with the structure described in any of the other embodiments.

Embodiment 4

In this embodiment, circuit configuration examples to which the OS transistors described in the above embodiment can be used are described with reference to FIGS. 31A to 31C, FIGS. 32A to 32C, FIGS. 33A and 33B, and FIGS. 34A and 34B.

Figure 31A:
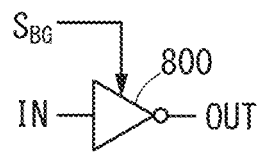
FIGS. 31A to 31C are circuit diagrams and a timing chart illustrating one embodiment of the present invention.

FIG. 31A is a circuit diagram of an inverter. An inverter 800 outputs a signal whose logic is inverted from the logic of a signal supplied to an input terminal IN to an output terminal OUT. The inverter 800 includes a plurality of OS transistors. A signal $S_{BG}$ can switch electrical characteristics of the OS transistors.

Figure 31B:
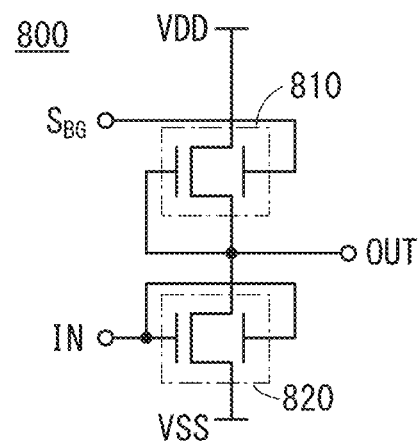

FIG. 31B illustrates an example of the inverter 800. The inverter 800 includes an OS transistor 810 and an OS transistor 820. The inverter 800 can be formed using only n-channel transistors; thus, the inverter 800 can be formed at lower cost than an inverter formed using a complementary metal oxide semiconductor (i.e., a CMOS inverter).

Note that the inverter 800 including the OS transistors can be provided over a CMOS circuit including Si transistors. Since the inverter 800 can be provided so as to overlap with the CMOS circuit, no additional area is required for the inverter 800, and thus, an increase in the circuit area can be suppressed.

Each of the OS transistors 810 and 820 includes a first gate functioning as a front gate, a second gate functioning as a back gate, a first terminal functioning as one of a source and a drain, and a second terminal functioning as the other of the source and the drain.

The first gate of the OS transistor 810 is connected to its second terminal. The second gate of the OS transistor 810 is connected to a wiring that supplies the signal $S_{BG}$. The first terminal of the OS transistor 810 is connected to a wiring that supplies a voltage VDD. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring that supplies a voltage VSS.

Figure 31C:
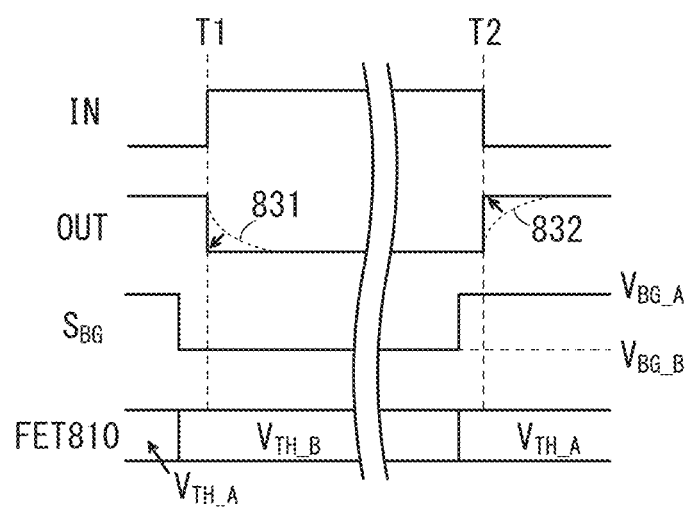

FIG. 31C is a timing chart illustrating the operation of the inverter 800. The timing chart in FIG. 31C illustrates changes of a signal waveform of the input terminal IN, a signal waveform of the output terminal OUT, a signal waveform of the signal $S_{BG}$, and the threshold voltage of the OS transistor 810 (FET 810).

The signal $S_{BG}$ can be supplied to the second gate of the OS transistor 810 to control the threshold voltage of the OS transistor 810.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 810 can be shifted in the negative direction to be a threshold voltage $V_{TH\_A}$ when the voltage $V_{BG\_A}$ is applied to the second gate. The threshold voltage of the OS transistor 810 can be shifted in the positive direction to be a threshold voltage $V_{TH\_B}$ when the voltage $V_{BG\_B}$ is applied to the second gate.

Figure 32A:
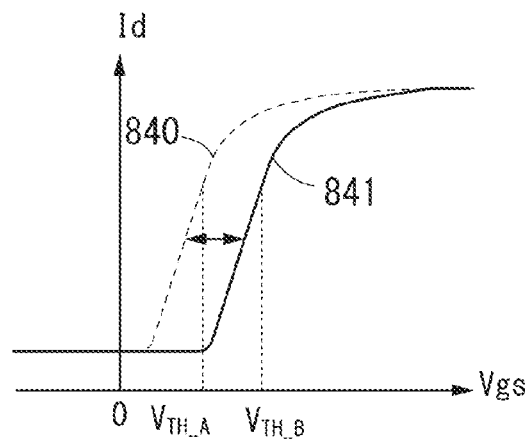
FIGS. 32A to 32C are a graph and circuit diagrams illustrating one embodiment of the present invention.

To visualize the above description, FIG. 32A shows a $V_g$-$I_d$ curve, which is one of indicators of the transistor's electrical characteristics.

When a high voltage such as the voltage $V_{BG\_A}$ is applied to the second gate, the electrical characteristics of the OS transistor 810 can be shifted to match a curve shown by a dashed line 840 in FIG. 32A. When a low voltage such as the voltage $V_{BG\_B}$ is applied to the second gate, the electrical characteristics of the OS transistor 810 can be shifted to match a curve shown by a solid line 841 in FIG. 32A. As shown in FIG. 32A, switching the signal $S_{BG}$ between the voltage $V_{BG\_A}$ and the voltage $V_{BG\_B}$ enables the threshold voltage of the OS transistor 810 to be shifted in the positive direction or the negative direction.

Figure 32B:
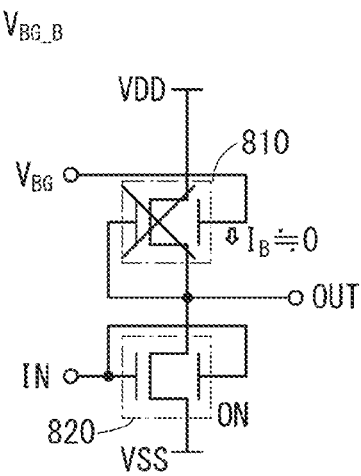

The shift of the threshold voltage in the positive direction toward the threshold voltage $V_{TH\_B}$ can make a current less likely to flow in the OS transistor 810. FIG. 32B visualizes the state. As illustrated in FIG. 32B, a current $I_B$ that flows in the OS transistor 810 can be extremely low. Thus, when a signal supplied to the input terminal IN is at a high level and the OS transistor 820 is on (ON), the voltage of the output terminal OUT can drop sharply.

Since a state in which a current is less likely to flow in the OS transistor 810 as illustrated in FIG. 32B can be obtained, a signal waveform 831 of the output terminal in the timing chart in FIG. 31C can be made steep. Shoot-through current between the wiring that supplies the voltage VDD and the wiring that supplies the voltage VSS can be low, leading to low-power operation.

Figure 32C:
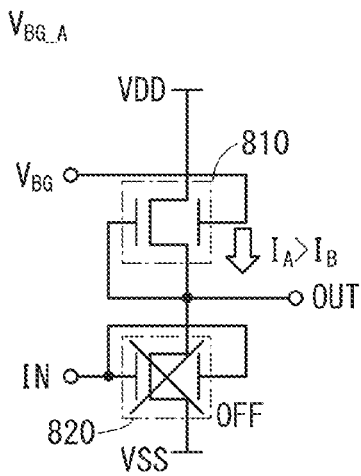

The shift of the threshold voltage in the negative direction toward the threshold voltage $V_{TH\_A}$ can make a current flow easily in the OS transistor 810. FIG. 32C visualizes the state. As illustrated in FIG. 32C, a current $I_A$ flowing at this time can be higher than at least the current $I_B$. Thus, when a signal supplied to the input terminal IN is at a low level and the OS transistor 820 is off (OFF), the voltage of the output terminal OUT can be increased sharply.

Since a state in which current is likely to flow in the OS transistor 810 as illustrated in FIG. 32C can be obtained, a signal waveform 832 of the output terminal in the timing chart in FIG. 31C can be made steep. Shoot-through current between the wiring that supplies the voltage VDD and the wiring that supplies the voltage VSS can be reduced, leading to low-power operation.

Note that the threshold voltage of the OS transistor 810 is preferably controlled by the signal $S_{BG}$ before the state of the OS transistor 820 is switched, i.e., before time T1 or time T2. For example, as in FIG. 31C, it is preferable that the threshold voltage of the OS transistor 810 be switched from the threshold voltage $V_{TH\_A}$ to the threshold voltage $V_{TH\_B}$ before time T1 at which the level of the signal supplied to the input terminal IN is switched to a high level. Moreover, as in FIG. 31C, it is preferable that the threshold voltage of the OS transistor 810 be switched from the threshold voltage $V_{TH\_B}$ to the threshold voltage $V_{TH\_A}$ before time T2 at which the level of the signal supplied to the input terminal IN is switched to a low level.

Figure 33A:
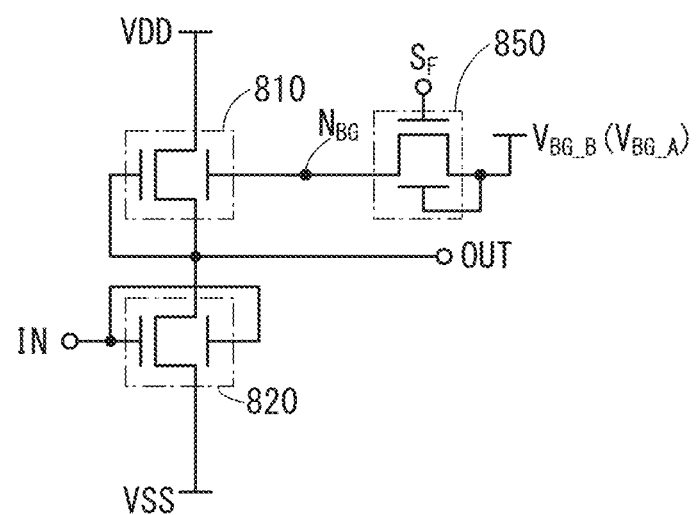
FIGS. 33A and 33B are a circuit diagram and a timing chart illustrating one embodiment of the present invention.

Although the timing chart in FIG. 31C illustrates the structure in which the level of the signal $S_{BG}$ is switched in accordance with the signal supplied to the input terminal IN, a different structure may be employed in which voltage for controlling the threshold voltage is held by the second gate of the OS transistor 810 in a floating state, for example. FIG. 33A illustrates an example of such a circuit configuration.

The circuit configuration in FIG. 33A is the same as that in FIG. 31B, except that an OS transistor 850 is added. A first terminal of the OS transistor 850 is connected to the second gate of the OS transistor 810. A second terminal of the OS transistor 850 is connected to a wiring that supplies the voltage $V_{BG\_B}$ (or the voltage $V_{BG\_A}$). A first gate of the OS transistor 850 is connected to a wiring that supplies a signal $S_F$. A second gate of the OS transistor 850 is connected to the wiring that supplies the voltage $V_{BG\_B}$ (or the voltage $V_{BG\_A}$).

Figure 33B:
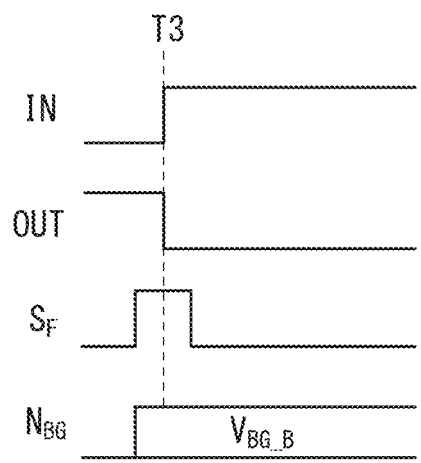

The operation with the circuit configuration in FIG. 33A is described with reference to a timing chart in FIG. 33B.

The voltage for controlling the threshold voltage of the OS transistor 810 is supplied to the second gate of the OS transistor 810 before time T3 at which the level of the signal supplied to the input terminal IN is switched to a high level. The signal $S_F$ is set to a high level and the OS transistor 850 is turned on, so that the voltage $V_{BG\_B}$ for controlling the threshold voltage is supplied to a node $N_{BG}$.

The OS transistor 850 is turned off after the voltage of the node $N_{BG}$ becomes $V_{BG\_B}$. Since the off-state current of the OS transistor 850 is extremely low, the voltage $V_{BG\_B}$ held by the node $N_{BG}$ can be retained while the OS transistor 850 remains off and the node $N_{BG}$ is in a state that is very close to a floating state. Therefore, the number of times the voltage $V_{BG\_B}$ is supplied to the second gate of the OS transistor 850 can be reduced and accordingly, the power consumption for rewriting the voltage $V_{BG\_B}$ can be reduced.

Figure 34A:
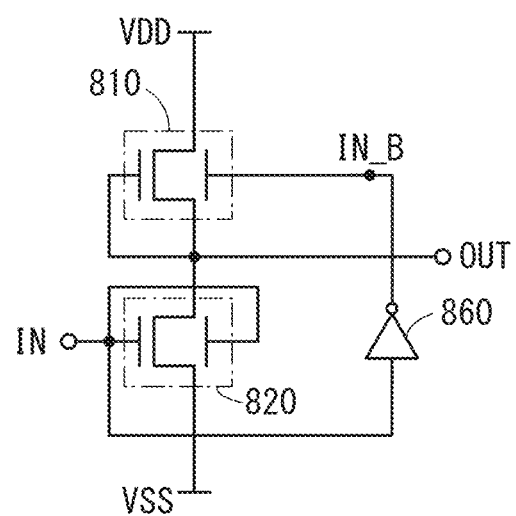
FIGS. 34A and 34B are a circuit diagram and a timing chart illustrating one embodiment of the present invention.

Although FIG. 31B and FIG. 33A each illustrate the case where the voltage is supplied to the second gate of the OS transistor 810 by control from the outside, a different structure may be employed in which voltage for controlling the threshold voltage is generated on the basis of the signal supplied to the input terminal IN and supplied to the second gate of the OS transistor 810, for example. FIG. 34A illustrates an example of such a circuit configuration.

The circuit configuration in FIG. 34A is the same as that in FIG. 31B, except that a CMOS inverter 860 is provided between the input terminal IN and the second gate of the OS transistor 810. An input terminal of the CMOS inverter 860 is connected to the input terminal IN. An output terminal of the CMOS inverter 860 is connected to the second gate of the OS transistor 810.

The operation with the circuit configuration in FIG. 34A is described with reference to a timing chart in FIG. 34B. The timing chart in FIG. 34B illustrates changes of a signal waveform of the input terminal IN, a signal waveform of the output terminal OUT, an output waveform IN_B of the CMOS inverter 860, and a threshold voltage of the OS transistor 810 (FET 810).

The output waveform IN_B which corresponds to a signal whose logic is inverted from the logic of the signal supplied to the input terminal IN can be used as a signal that controls the threshold voltage of the OS transistor 810. Thus, the threshold voltage of the OS transistor 810 can be controlled as described with reference to FIGS. 32A to 32C. For example, the signal supplied to the input terminal IN is at a high level and the OS transistor 820 is turned on at time T4 in FIG. 34B. At this time, the output waveform IN_B is at a low level. Accordingly, a current can be made less likely to flow in the OS transistor 810; thus, the voltage of the output terminal OUT can be sharply decreased.

Figure 34B:
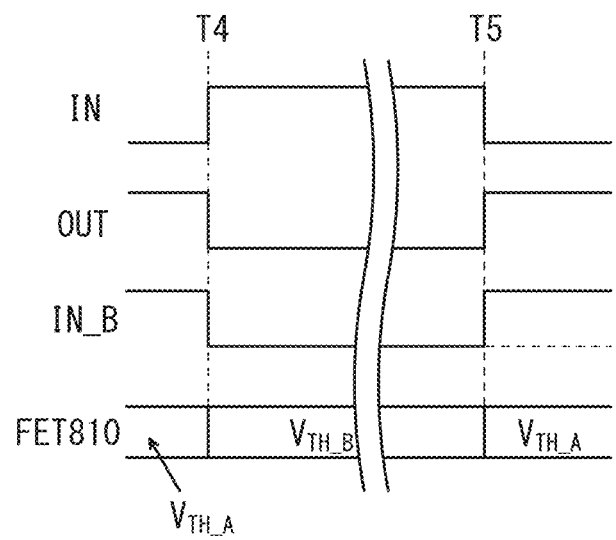

Moreover, the signal supplied to the input terminal IN is at a low level and the OS transistor 820 is turned off at time T5 in FIG. 34B. At this time, the output waveform IN_B is at a high level. Accordingly, a current can easily flow in the OS transistor 810; thus, a rise in the voltage of the output terminal OUT can be made steep.

As described above, in the configuration of the inverter including the OS transistor in this embodiment, the voltage of the back gate is switched in accordance with the logic of the signal supplied to the input terminal IN. In such a configuration, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

Embodiment 5

In this embodiment, examples of a semiconductor device which includes a plurality of circuits including OS transistors described in the above embodiment are described with reference to FIGS. 35A to 35E, FIGS. 36A and 36B, FIGS. 37A and 37B, FIGS. 38A to 38C, FIGS. 39A and 395B, FIGS. 40A to 40C, and FIGS. 41A and 41B.

Figure 35A:
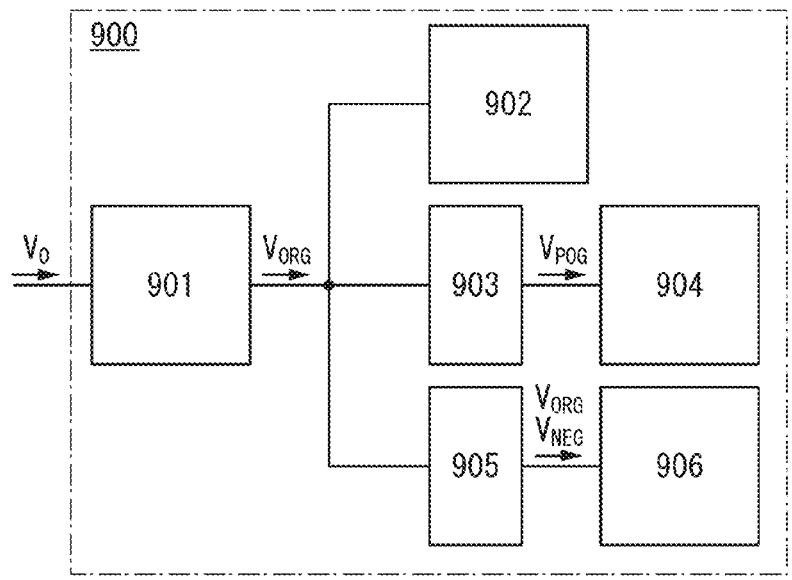
FIGS. 35A to 35E are a block diagram, circuit diagrams, and waveform diagrams for illustrating one embodiment of the present invention.

FIG. 35A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 900. The semiconductor device 900 can generate the voltage $V_{ORG}$ on the basis of one power supply voltage supplied from the outside. Thus, the semiconductor device 900 can operate without the supply of a plurality of power supply voltages from the outside.

The circuits 902, 904, and 906 operate with different power supply voltages. For example, the power supply voltage of the circuit 902 is a voltage applied on the basis of the voltage $V_{ORG}$ and the voltage $V_{SS}$ ($V_{ORG}>V_{SS}$). For example, the power supply voltage of the circuit 904 is a voltage applied on the basis of a voltage $V_{POG}$ and the voltage $V_{SS}$ ($V_{POG}>V_{ORG}$). For example, the power supply voltages of the circuit 906 are voltages applied on the basis of the voltage $V_{ORG}$, the voltage $V_{SS}$, and a voltage $V_{NEG}$ ($V_{ORG}>V_{SS}>V_{NEG}$). When the voltage $V_{SS}$ is equal to a ground potential (GND), the kinds of voltages generated in the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Thus, the semiconductor device 900 including the circuit 904 can operate on the basis of one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Thus, the semiconductor device 900 including the circuit 906 can operate on the basis of one power supply voltage supplied from the outside.

Figure 35B:
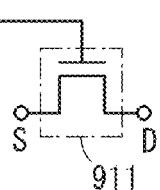
Figure 35C:
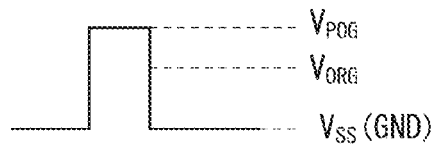

FIG. 35B illustrates an example of the circuit 904 that operates with the voltage $V_{POG}$ and FIG. 35C illustrates an example of a waveform of a signal for operating the circuit 904.

FIG. 35B illustrates a transistor 911. A signal supplied to a gate of the transistor 911 is generated on the basis of, for example, the voltage $V_{POG}$ and the voltage $V_{SS}$. The signal is generated on the basis of the voltage $V_{POG}$ at the time when the transistor 911 is turned on and on the basis of the voltage $V_{SS}$ at the time when the transistor 911 is turned off. As shown in FIG. 35C, the voltage $V_{POG}$ is higher than the voltage $V_{ORG}$. Therefore, an operation for bringing a source (S) and a drain (D) of the transistor 911 into a conduction state can be performed more surely. As a result, the frequency of malfunction of the circuit 904 can be reduced.

Figure 35D:
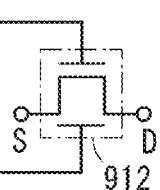
Figure 35E:
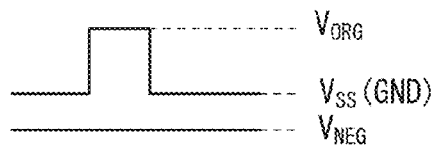

FIG. 35D illustrates an example of the circuit 906 that operates with the voltage $V_{NEG}$ and FIG. 35E illustrates an example of a waveform of a signal for operating the circuit 906.

FIG. 35D illustrates a transistor 912 having a back gate. A signal supplied to a gate of the transistor 912 is generated on the basis of, for example, the voltage $V_{ORG}$ and the voltage $V_{SS}$. The signal has generated on the basis of the voltage $V_{ORG}$ at the time when the transistor 911 is turned on and on the basis of the voltage $V_{SS}$ at the time when the transistor 911 is turned off. A signal supplied to the back gate of the transistor 912 is generated on the basis of the voltage $V_{NEG}$. As shown in FIG. 35E, the voltage $V_{NEG}$ is lower than the voltage $V_{SS}$ (GND). Therefore, the threshold voltage of the transistor 912 can be controlled so as to be shifted in the positive direction. Thus, the transistor 912 can be surely turned off and a current flowing between a source (S) and a drain (D) can be reduced. As a result, the frequency of malfunction of the circuit 906 can be reduced and power consumption thereof can be reduced.

The voltage $V_{NEG}$ may be directly supplied to the back gate of the transistor 912. Alternatively, a signal supplied to the gate of the transistor 912 may be generated on the basis of the voltage $V_{ORG}$ and the voltage $V_{NEG}$ and the generated signal may be supplied to the back gate of the transistor 912.

Figure 36A:
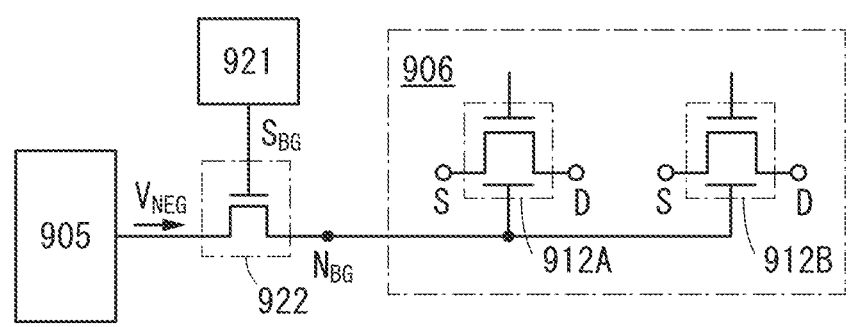
FIGS. 36A and 36B are a circuit diagram and a timing chart illustrating one embodiment of the present invention.
Figure 36B:
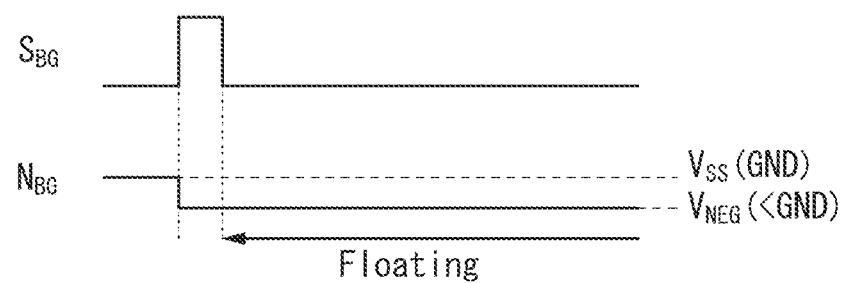

FIGS. 36A and 36B illustrate a modification example of FIGS. 35D and 35E, respectively.

In a circuit diagram illustrated in FIG. 36A, a transistor 922 whose conduction state can be controlled by a control circuit 921 is provided between the voltage generation circuit 905 and the circuit 906. The transistor 922 is an n-channel OS transistor. The control signal $S_{BG}$ output from the control circuit 921 is a signal for controlling the conduction state of the transistor 922. Transistors 912A and 912B included in the circuit 906 are the same OS transistors as the transistor 922.

A timing chart in FIG. 36B shows changes in a potential of the control signal $S_{BG}$ and a potential of the node $N_{BG}$. The potential of the node $N_{BG}$ indicates the states of potentials of back gates of the transistors 912A and 912B. When the control signal $S_{BG}$ is at a high level, the transistor 922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 922 is an OS transistor, its off-state current is small. Accordingly, even when the node $N_{BG}$ is in an electrically floating state, the voltage $V_{NEG}$ which has been supplied can be held.

Figure 37A:
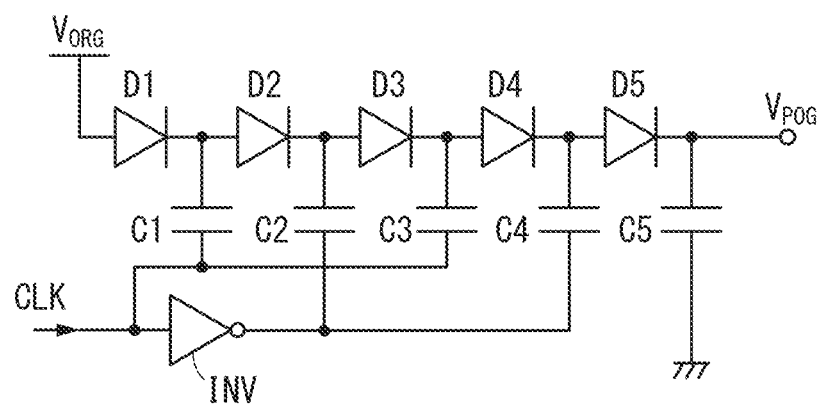
FIGS. 37A and 37B are circuit diagrams each illustrating one embodiment of the present invention.

FIG. 37A illustrates an example of a circuit configuration applicable to the above-described voltage generation circuit 903. The voltage generation circuit 903 illustrated in FIG. 37A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{POG}$, which has been increased to a positive voltage having a positively quintupled value of the voltage $V_{ORG}$ by application of the clock signal CLK, can be obtained. Note that a forward voltage of the diodes D1 to D5 is 0 V. A desired voltage $V_{POG}$ can be obtained when the number of stages of the charge pump is changed.

Figure 37B:
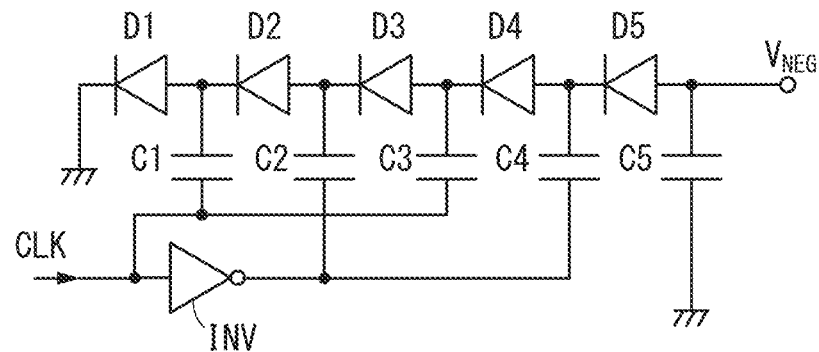

FIG. 37B illustrates an example of a circuit configuration applicable to the above-described voltage generation circuit 905. The voltage generation circuit 905 illustrated in FIG. 37B is a four-stage charge pump including the diodes D1 to D5, the capacitors C1 to C5, and the inverter INV. The clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{NEG}$, which has been reduced from GND (i.e., the voltage $V_{SS}$) to a negative voltage having a negatively quadrupled value of the voltage $V_{ORG}$ by application of the clock signal CLK, can be obtained. Note that a forward voltage of the diodes D1 to D5 is 0 V. A desired voltage $V_{NEG}$ can be obtained when the number of stages of the charge pump is changed.

The circuit configuration of the voltage generation circuit 903 is not limited to the configuration of the circuit diagram illustrated in FIG. 37A. Modification examples of the voltage generation circuit 903 are shown in FIGS. 38A to 38C and FIGS. 39A and 39B.

Figure 38A:
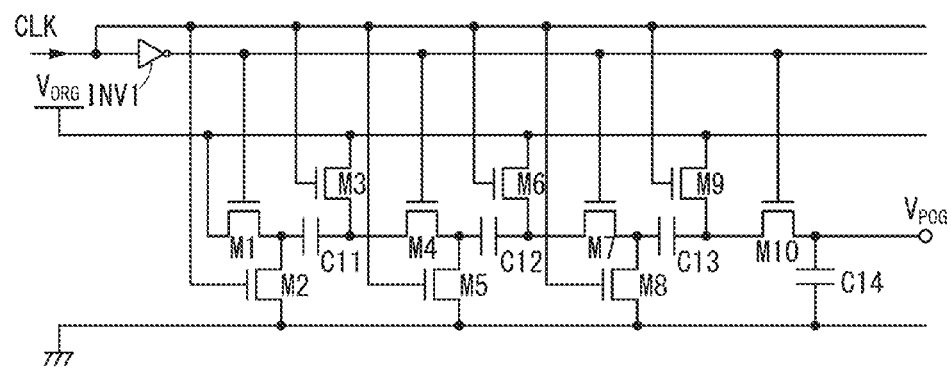
FIGS. 38A to 38C are circuit diagrams each illustrating one embodiment of the present invention.

The voltage generation circuit 903A illustrated in FIG. 38A includes transistors M1 to M10, capacitors C11 to C14, and an inverter INV1. The clock signal CLK is supplied to gates of the transistors M1 to M10 directly or through the inverter INV1. By application of the clock signal CLK, the voltage $V_{POG}$, which has been increased to a positive voltage having a positively quadrupled value of the voltage $V_{ORG}$, can be obtained. A desired voltage $V_{POG}$ can be obtained when the number of stages is changed. In the voltage generation circuit 903A in FIG. 38A, off-state current of each of the transistors M1 to M10 can be low when the transistors M1 to M10 are OS transistors, and leakage of charge held in the capacitors C11 to C14 can be suppressed. Accordingly, voltage raising from the voltage $V_{ORG}$ to the voltage $V_{POG}$ can be efficiently performed.

Figure 38B:
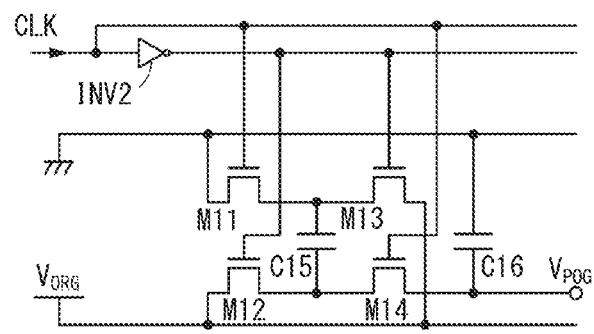

The voltage generation circuit 903B illustrated in FIG. 38B includes transistors M11 to M14, capacitors C15 and C16, and an inverter INV2. The clock signal CLK is supplied to gates of the transistors M11 to M14 directly or through the inverter INV2. By application of the clock signal CLK, the voltage $V_{POG}$, which has been increased to a positive voltage having a positively doubled value of the voltage $V_{ORG}$, can be obtained. In the voltage generation circuit 903B in FIG. 38B, off-state current of each of the transistors M11 to M14 can be low when the transistors M11 to M14 are OS transistors, and leakage of charge held in the capacitors C15 and C16 can be suppressed. Accordingly, voltage raising from the voltage $V_{ORG}$ to the voltage $V_{POG}$ can be efficiently performed.

Figure 38C:
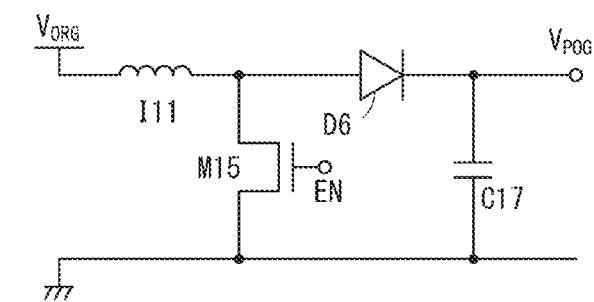

The voltage generation circuit 903C in FIG. 38C includes an inductor I11, a transistor M15, a diode D6, and a capacitor C17. The conduction state of the transistor M15 is controlled by a control signal EN. Owing to the control signal EN, the voltage $V_{POG}$ which is obtained by increasing the voltage $V_{ORG}$ can be obtained. Since the voltage generation circuit 903C in FIG. 38C increases the voltage using the inductor I11, the voltage can be increased efficiently.

Figure 39A:
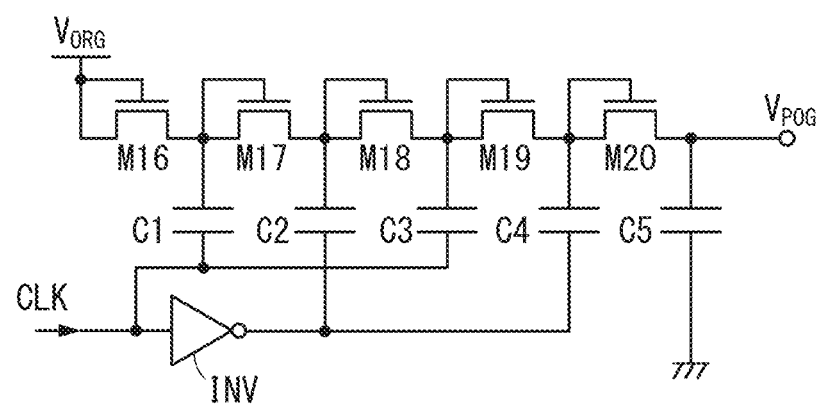
FIGS. 39A and 39B are circuit diagrams each illustrating one embodiment of the present invention.

A voltage generation circuit 903D in FIG. 39A has a configuration in which the diodes D1 to D5 of the voltage generation circuit 903 in FIG. 37A are replaced with diode-connected transistors M16 to M20. In the voltage generation circuit 903D in FIG. 39A, when the OS transistors are used as the transistors M16 to M20, the off-state current can be reduced, so that leakage of charge held in the capacitors C1 to C5 can be inhibited. Thus, efficient voltage increase from the voltage $V_{ORG}$ to the voltage $V_{POG}$ is possible.

Figure 39B:
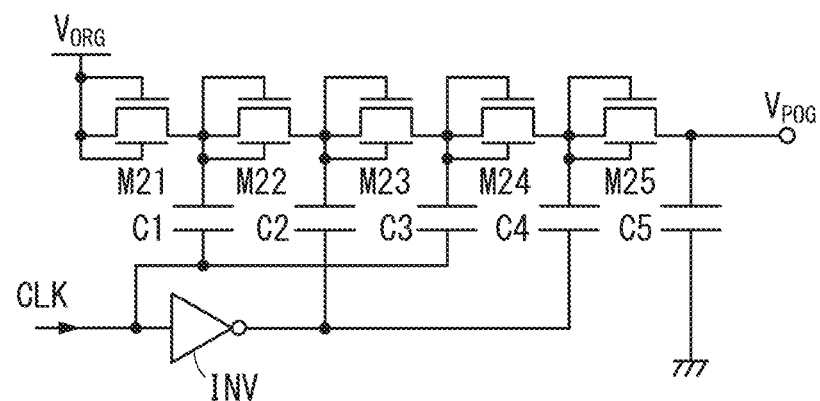
Figure 40A:
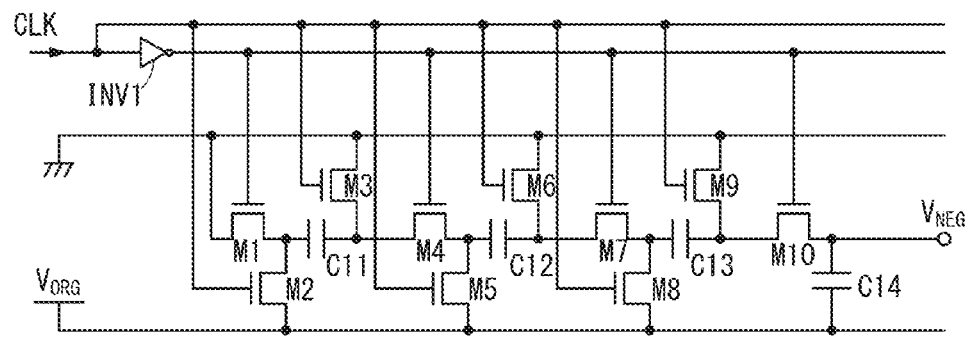
FIGS. 40A to 40C are circuit diagrams each illustrating one embodiment of the present invention.
Figure 40B:
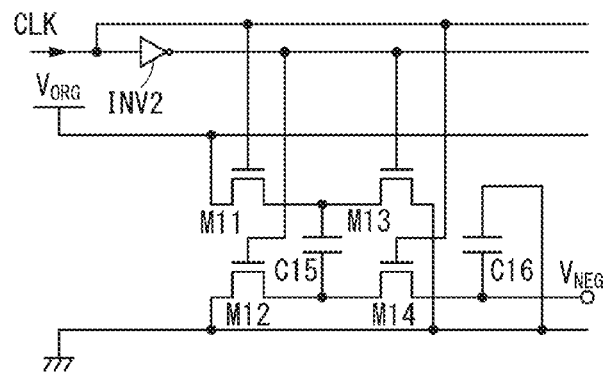
Figure 40C:
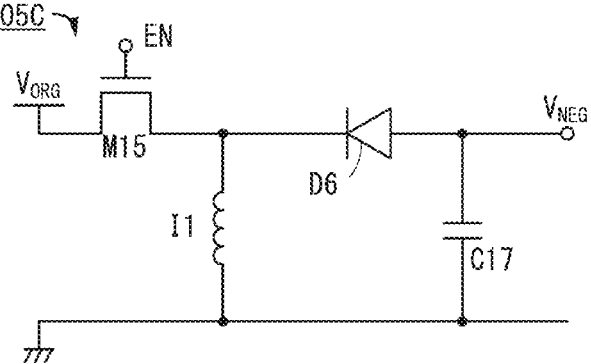
Figure 41A:
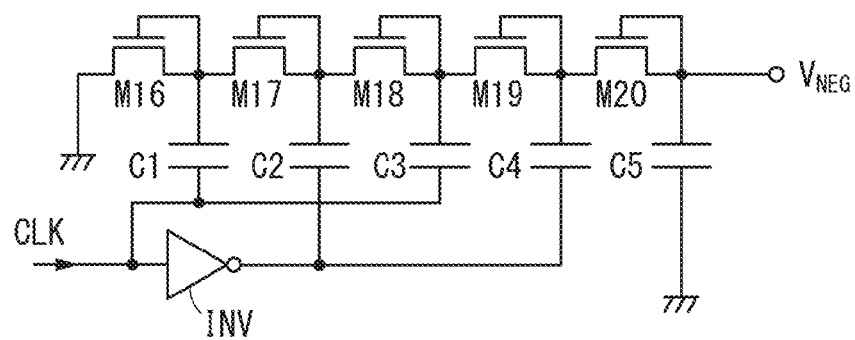
FIGS. 41A and 41B are circuit diagrams each illustrating one embodiment of the present invention.
Figure 41B:
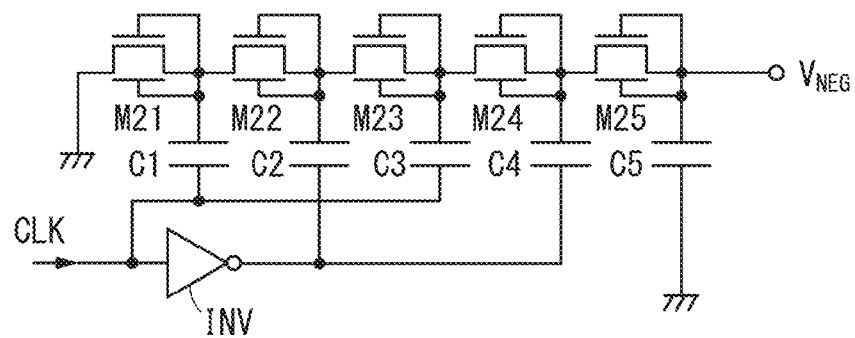

A voltage generation circuit 903E in FIG. 39B has a configuration in which the transistors M16 to M20 of the voltage generation circuit 903D in FIG. 39A are replaced with transistor M21 to M25 having back gates. In the voltage generation circuit 903E in FIG. 39B, the back gates can be supplied with voltages that are the same as those of the gates, so that the current flowing through the transistors can be increased. Thus, efficient voltage increase from the voltage $V_{ORG}$ to the voltage $V_{POG}$ is possible.

Note that the modification examples of the voltage generation circuit 903 can also be applied to the voltage generation circuit 905 in FIG. 37B. The configurations of a circuit diagram in this case are illustrated in FIGS. 40A to 40C and FIGS. 41A and 41B. In a voltage generation circuit 905A illustrated in FIG. 40A, the voltage $V_{NEG}$ which has been reduced from the voltage $V_{SS}$ to a negative voltage having a negatively tripled value of the voltage $V_{ORG}$ by application of the clock signal CLK, can be obtained. In a voltage generation circuit 905B illustrated in FIG. 40B, the voltage $V_{NEG}$ which has been reduced from the voltage $V_{SS}$ to a negative voltage having a negatively doubled value of the voltage $V_{ORG}$ by application of the clock signal CLK, can be obtained.

The voltage generation circuits 905A to 905E illustrated in FIGS. 40A to 40C and FIGS. 41A and 41B have configurations formed by changing the voltages applied to the wirings or the arrangement of the elements of the voltage generation circuits 903A to 903E illustrated in FIGS. 38A to 38C and FIGS. 39A and 39B. As in the voltage generation circuits 903A to 903E, in the voltage generation circuits 905A to 905E illustrated in FIGS. 40A to 40C and FIGS. 41A and 41B, an efficient voltage decrease from the voltage $V_{SS}$ to the voltage $V_{NEG}$ is possible.

As described above, in any of the structures of this embodiment, a voltage required for circuits included in a semiconductor device can be internally generated. Thus, in the semiconductor device, the kinds of power supply voltages supplied from the outside can be reduced.

Embodiment 6

In this embodiment, an example of CPU including semiconductor devices such as the transistor of one embodiment of the present invention and the above-described memory device is described.

<Configuration of CPU>

Figure 42:
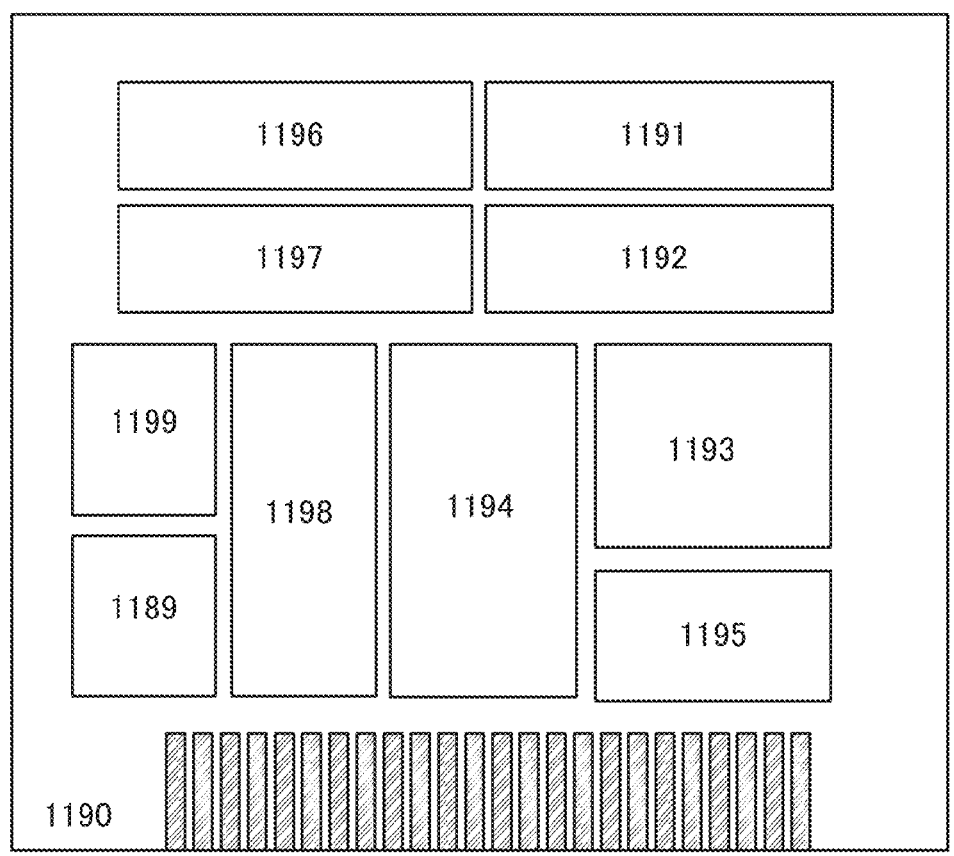
FIG. 42 is a block diagram illustrating a semiconductor device of one embodiment of the present invention.

FIG. 42 is a block diagram illustrating a configuration example of a CPU including any of the above-described transistors as a component. The following configuration of the CPU can be obtained using the semiconductor device illustrated in FIG. 10A or 10B.

The CPU illustrated in FIG. 42 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 42 is just an example in which the configuration has been simplified, and an actual CPU may have a variety of configurations depending on the application. For example, the CPU may have the following configuration: a structure including the CPU illustrated in FIG. 42 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 42, a memory cell is provided in the register 1196. For the memory cell of the register 1196, any of the above-described transistors, the above-described memory device, or the like can be used.

In the CPU illustrated in FIG. 42, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 43:
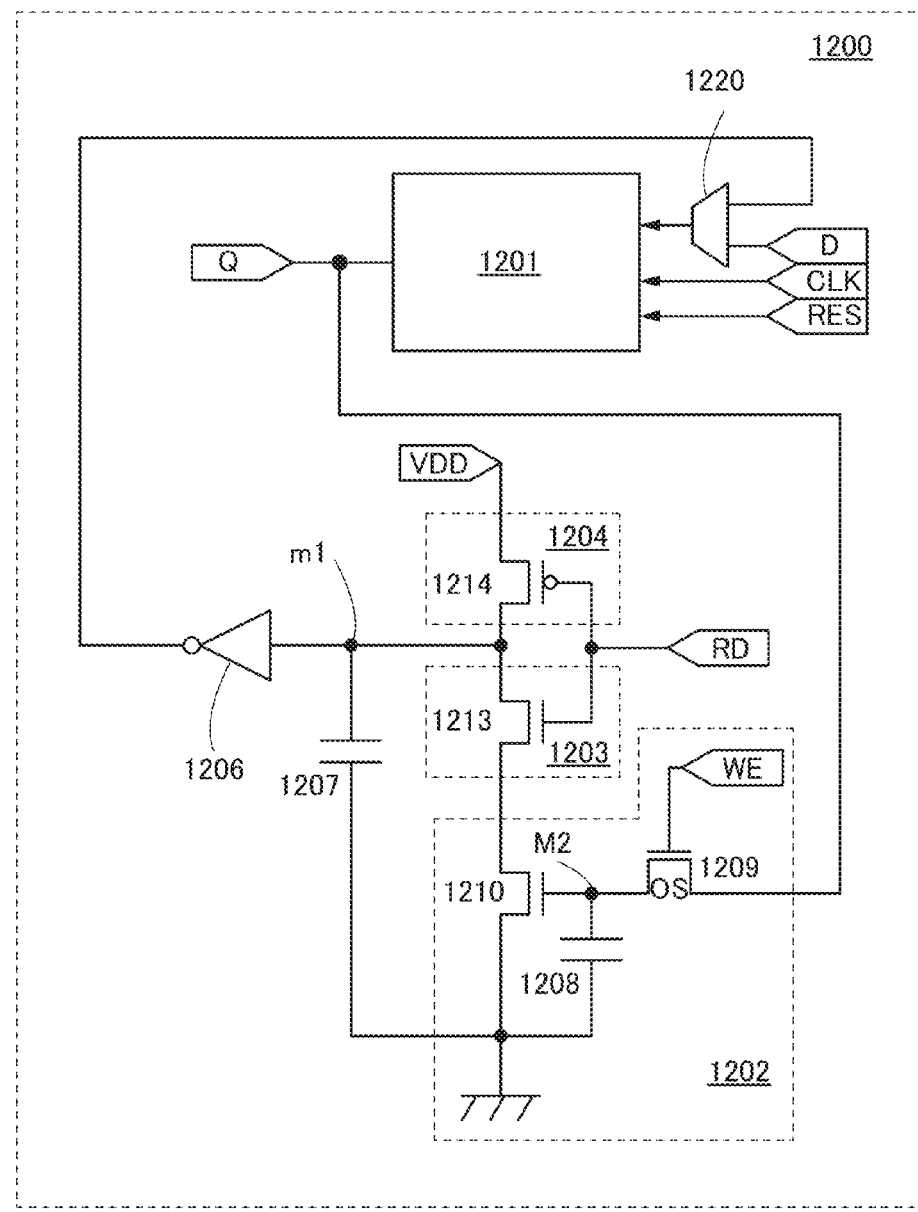
FIG. 43 is a circuit diagram illustrating a semiconductor device of one embodiment of the present invention.

FIG. 43 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node m1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 43 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 43, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 43, the transistors included in the memory element 1200 except the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a layer formed using a semiconductor other than an oxide semiconductor or in the substrate 1190 can be used for the reset of the transistors.

As the circuit 1201 in FIG. 43, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the state of the transistor 1210 (the on state or the off state) is determined in accordance with the signal retained by the capacitor 1208, and a signal can be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a programmable logic device (PLD), or a custom LSI, and a radio frequency (RF) device.

The structure described in this embodiment can be used in appropriate combination with any of the structures described in the other embodiments.

Embodiment 7

In this embodiment, an example of an imaging device including the transistor or the like of one embodiment of the present invention is described.

<Imaging Device>

An imaging device of one embodiment of the present invention is described below.

Figure 44A:
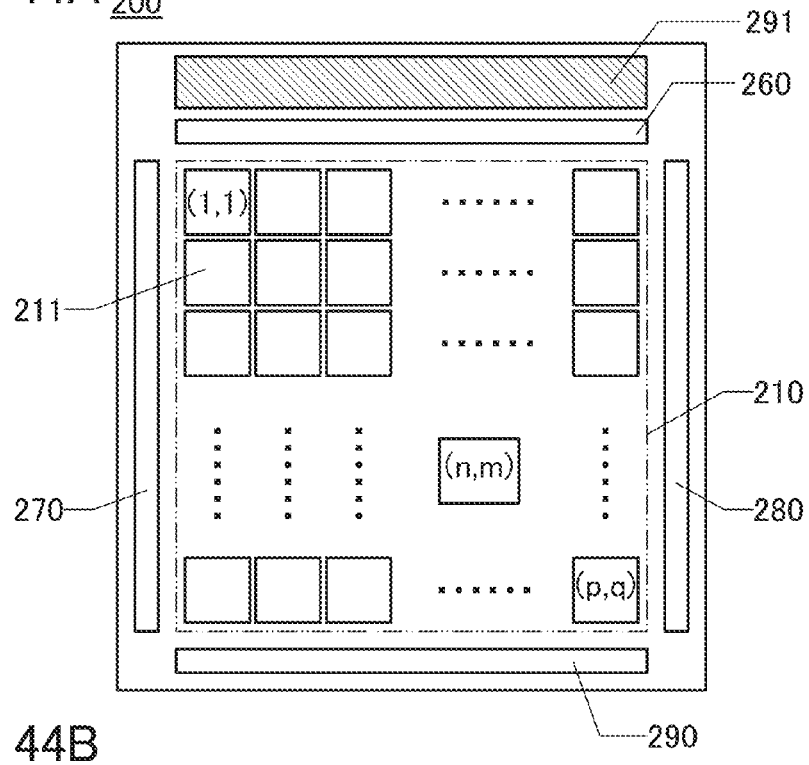
FIGS. 44A and 44B are top views each illustrating a semiconductor device of one embodiment of the present invention.

FIG. 44A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each an integer of 2 or more). The peripheral circuit 260, the peripheral circuit 270, the peripheral circuit 280, and the peripheral circuit 290 are each connected to the plurality of pixels 211, and a signal for driving the plurality of pixels 211 is supplied. In this specification and the like, in some cases, a "peripheral circuit" or a "driver circuit" indicate all of the peripheral circuits 260, 270, 280, and 290. For example, the peripheral circuit 260 can be regarded as part of the peripheral circuit.

The imaging device 200 preferably includes a light source 291. The light source 291 can emit detection light.

The peripheral circuit includes at least one of a logic circuit, a switch, a buffer, an amplifier circuit, and a converter circuit. The peripheral circuit may be formed over a substrate where the pixel portion 210 is formed. A semiconductor device such as an IC chip may be used as part or the whole of the peripheral circuit. Note that as the peripheral circuit, one or more of the peripheral circuits 260, 270, 280, and 290 may be omitted.

Figure 44B:
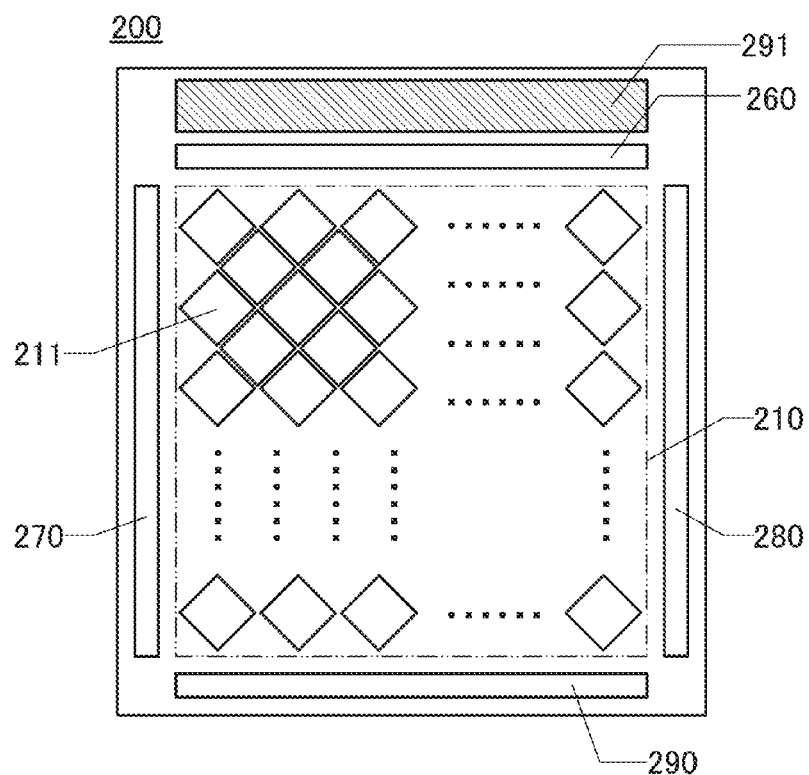

As illustrated in FIG. 44B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example 1 of Pixel>

The pixel 211 included in the imaging device 200 is formed with a plurality of subpixels 212, and each subpixel 212 is combined with a filter (color filter) which transmits light in a specific wavelength band, whereby data for achieving color image display can be obtained.

Figure 45A:
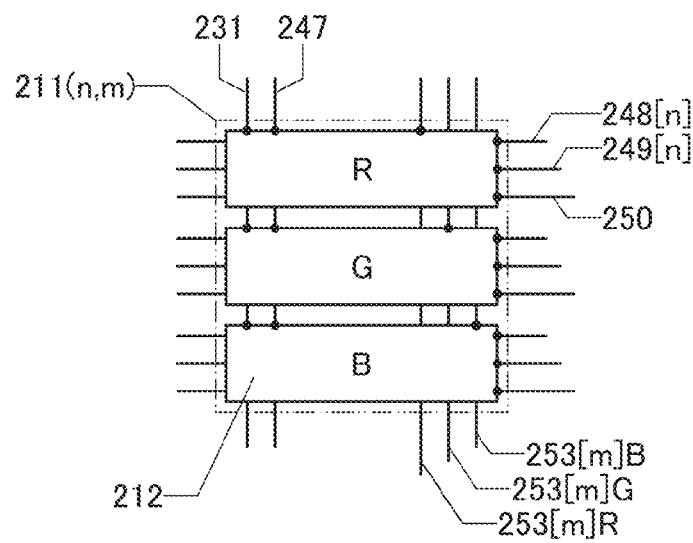
FIGS. 45A and 45B are block diagrams illustrating a semiconductor device of one embodiment of the present invention.

FIG. 45A is a top view showing an example of the pixel 211 with which a color image is obtained. The pixel 211 illustrated in FIG. 45A includes a subpixel 212 provided with a color filter that transmits light in a red (R) wavelength band (also referred to as a subpixel 212R), a subpixel 212 provided with a color filter that transmits light in a green (G) wavelength band (also referred to as a subpixel 212G), and a subpixel 212 provided with a color filter that transmits light in a blue (B) wavelength band (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independently provided. In this specification and the like, for example, the wiring 248 and the wiring 249 that are connected to the pixel 211 in the n-th row are referred to as a wiring 248[n] and a wiring 249[n]. For example, the wiring 253 connected to the pixel 211 in the m-th column is referred to as a wiring 253[m]. Note that in FIG. 45A, the wirings 253 connected to the subpixel 212R, the subpixel 212G, and the subpixel 212B in the pixel 211 in the m-th column are referred to as a wiring 253[m]R, a wiring 253[m]G, and a wiring 253[m]B. The subpixels 212 are electrically connected to the peripheral circuit through the above wirings.

Figure 45B:
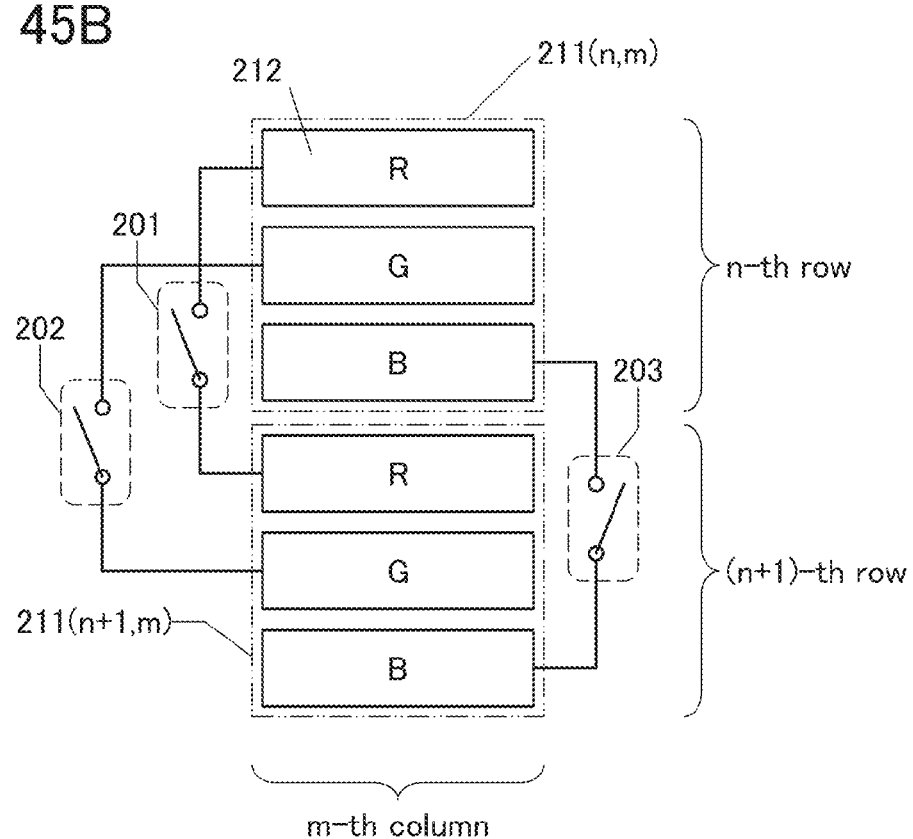

The imaging device 200 has a structure in which the subpixel 212 is electrically connected to the subpixel 212 in an adjacent pixel 211 which is provided with a color filter transmitting light in the same wavelength band as the subpixel 212, via a switch. FIG. 45B shows a connection example of the subpixels 212: the subpixel 212 in the pixel 211 arranged in the n-th (n is an integer greater than or equal to 1 and less than or equal to p) row and the m-th (m is an integer greater than or equal to 1 and less than or equal to q) column and the subpixel 212 in the adjacent pixel 211 arranged in an (n+1)-th row and the m-th column. In FIG. 45B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light in three different wavelength bands in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light in four different wavelength bands are provided in one pixel 211, the reproducibility of colors of an obtained image can be increased.

For example, in FIG. 45A, in regard to the subpixel 212 sensing light in a red wavelength band, the subpixel 212 sensing light in a green wavelength band, and the subpixel 212 sensing light in a blue wavelength band, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 sensing light in the same wavelength band are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 46A and 46B. With the lens 255, the photoelectric conversion element can receive incident light efficiently. Specifically, as illustrated in FIG. 46A, light 256 enters a photoelectric conversion element 220 through the lens 255, the filter 254 (a filter 254R, a filter 254G, and a filter 254B), a pixel circuit 230, and the like which are provided in the pixel 211.

As indicated by a region surrounded with dashed dotted lines, however, part of the light 256 indicated by arrows might be blocked by some wirings 257. Thus, a preferable structure is such that the lens 255 and the filter 254 are provided on the photoelectric conversion element 220 side as illustrated in FIG. 46B, whereby the photoelectric conversion element 220 can efficiently receive the light 256. When the light 256 enters the photoelectric conversion element 220 from the photoelectric conversion element 220 side, the imaging device 200 with high sensitivity can be provided.

Figure 46A:
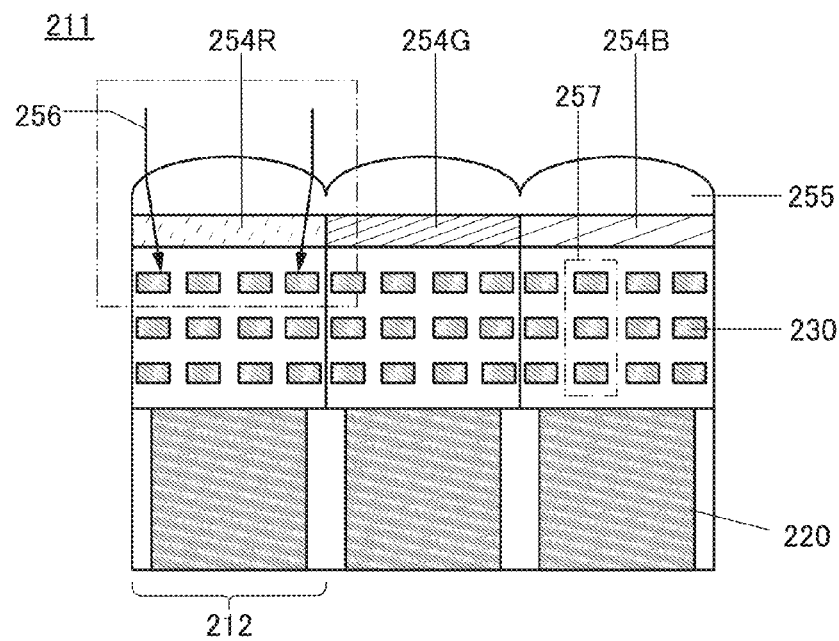
FIGS. 46A and 46B are cross-sectional views each illustrating a semiconductor device of one embodiment of the present invention.
Figure 46B:
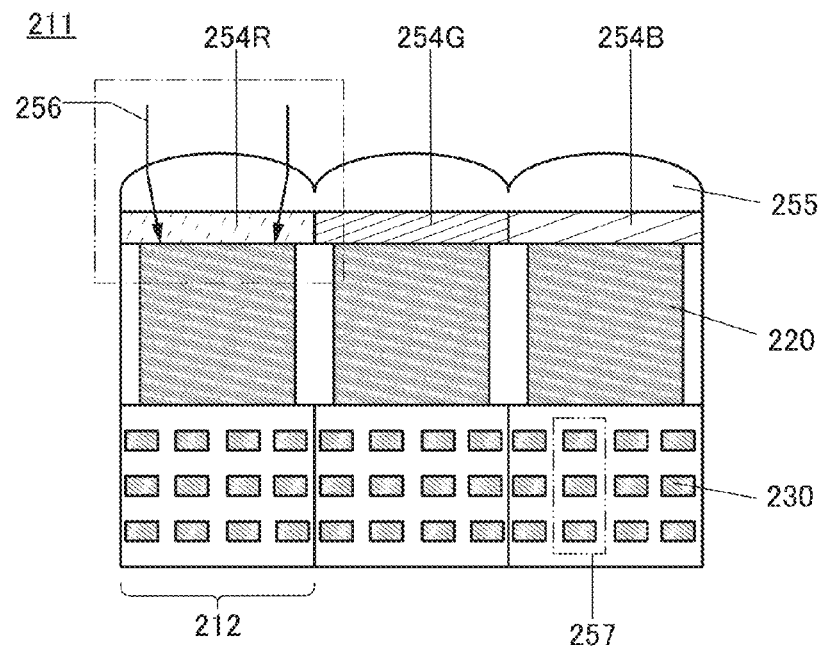

As the photoelectric conversion element 220 illustrated in FIGS. 46A and 46B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodide, gallium arsenide, cadmium telluride, and cadmium zinc alloy.

For example, when selenium is used for the photoelectric conversion element 220, the photoelectric conversion element 220 can have a light absorption coefficient in a wide wavelength band, such as visible light, ultraviolet light, infrared light, X-rays, and gamma rays.

One pixel 211 included in the imaging device 200 may include the subpixel 212 with a filter in addition to the subpixel 212 illustrated in FIGS. 45A and 45B.

<Configuration Example 2 of Pixel>

An example of a pixel including a transistor including silicon and a transistor including an oxide semiconductor is described below. A transistor similar to any of the transistors described in the above embodiment can be used as each of the transistors.

Figure 47A:
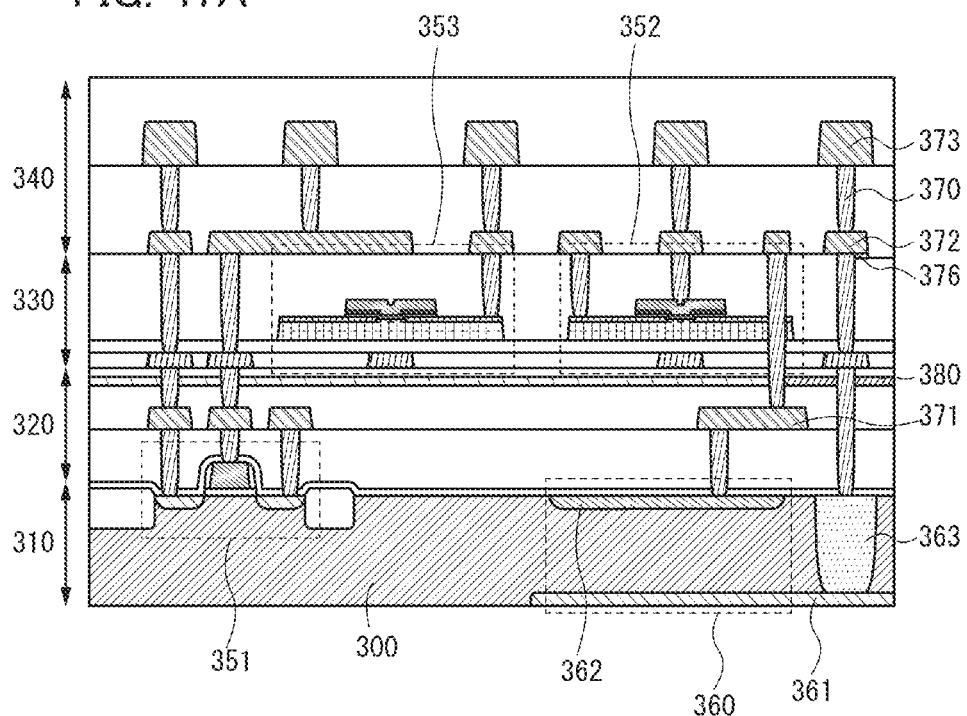
FIGS. 47A and 47B are cross-sectional views each illustrating a semiconductor device of one embodiment of the present invention.
Figure 47B:
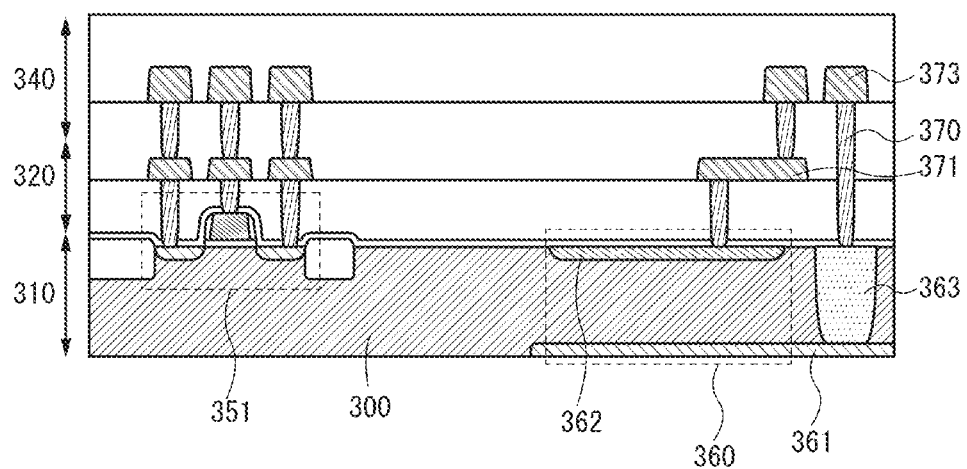

FIGS. 47A and 47B are cross-sectional views of an element included in an imaging device. The imaging device illustrated in FIG. 47A includes a transistor 351 including silicon over a silicon substrate 300, transistors 352 and 353 which include an oxide semiconductor and are stacked over the transistor 351, and a photodiode 360 provided in the silicon substrate 300. The transistors and the photodiode 360 are electrically connected to various plugs 370 and wirings 371. In addition, an anode 361 of the photodiode 360 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes the wirings 372 and the wirings 373. The wirings and plugs provided in the layers can be formed by the method described in the above embodiment. When they are formed, the hard mask residue 376 is sometimes formed in regions overlapping with the wirings.

In the example of the cross-sectional view in FIG. 47A, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case where a pixel is formed with use of only transistors including an oxide semiconductor, the layer 310 may include the transistor including an oxide semiconductor. Alternatively, the layer 310 may be omitted, and the pixel may include only transistors including an oxide semiconductor.

In the case where a pixel is formed with use of only transistors using silicon, the layer 330 may be omitted. An example of a cross-sectional view in which the layer 330 is not provided is shown in FIG. 47B.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 380 is provided between the layer 310 including the transistor 351 and the photodiode 360 and the layer 330 including the transistors 352 and 353. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352, the transistor 353, and the like becomes one of factors generating a carrier in the oxide semiconductor. Thus, the hydrogen may cause a reduction of the reliability of the transistor 352, the transistor 353, and the like. For this reason, in the case where the transistor including an oxide semiconductor is provided over the transistor including a silicon-based semiconductor, it is preferable that the insulator 380 having a function of blocking hydrogen be provided between the transistors. When the hydrogen is confined in layers below the insulator 380, the reliability of the transistor 351 can be improved. In addition, the hydrogen can be prevented from diffusing from the layers below the insulator 380 to layers above the insulator 380; thus, the reliability of the transistor 352, the transistor 353, and the like can be increased. In addition, the hydrogen can be prevented from being diffused from a part below the insulator 380 to a part above the insulator 380; thus, the reliability of the transistor 352, the transistor 353, and the like can be increased.

As the insulator 380, an insulator having a function of blocking oxygen or hydrogen is used, for example.

In the cross-sectional view in FIG. 47A, the photodiode 360 in the layer 310 and the transistor in the layer 330 can be formed so as to overlap with each other. Thus, the degree of integration of pixels can be increased. In other words, the resolution of the imaging device can be increased.

Part or the whole of the imaging device may be bent. The bent imaging device enables the curvature of field and astigmatism to be reduced. Thus, the optical design of lens and the like, which is used in combination of the imaging device, can be facilitated. For example, the number of lenses used for aberration correction can be reduced; accordingly, a reduction in size or weight of electronic devices using the imaging device, and the like, can be achieved. In addition, the quality of a captured image can be improved.

The structure described in this embodiment can be used in appropriate combination with the structure described in any of the other embodiments.

Embodiment 8

In this embodiment, electronic devices including the transistor or the like of one embodiment of the present invention are described.
<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 48A to 48F illustrate specific examples of these electronic devices.

Figure 48A:
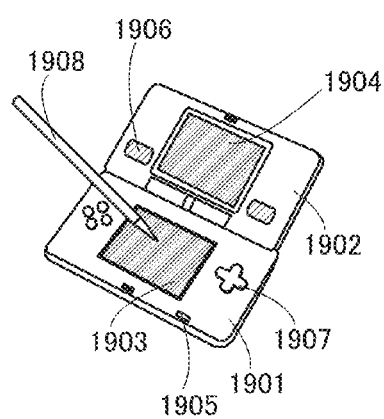
FIGS. 48A to 48F are perspective views each illustrating an electronic device of one embodiment of the present invention.

FIG. 48A illustrates a portable game console including a housing 1901, a housing 1902, a display portion 1903, a display portion 1904, a microphone 1905, a speaker 1906, an operation key 1907, a stylus 1908, and the like. Although the portable game console in FIG. 48A has the two display portions 1903 and 1904, the number of display portions included in a portable game console is not limited to this.

Figure 48B:
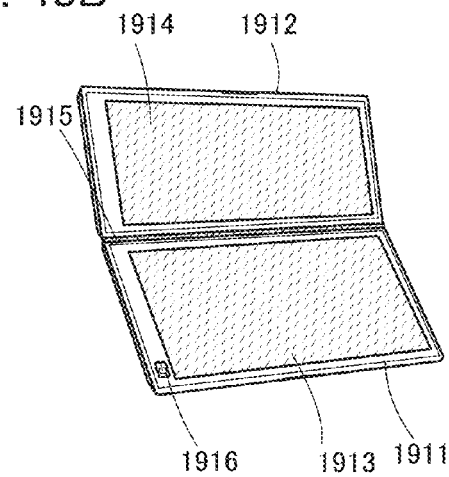

FIG. 48B illustrates a portable data terminal including a first housing 1911, a second housing 1912, a first display portion 1913, a second display portion 1914, a joint 1915, an operation key 1916, and the like. The first display portion 1913 is provided in the first housing 1911, and the second display portion 1914 is provided in the second housing 1912. The first housing 1911 and the second housing 1912 are connected to each other with the joint 1915, and the angle between the first housing 1911 and the second housing 1912 can be changed with the joint 1915. An image on the first display portion 1913 may be switched in accordance with the angle at the joint 1915 between the first housing 1911 and the second housing 1912. A display device with a position input function may be used as at least one of the first display portion 1913 and the second display portion 1914. Note that the position input function can be added by providing a touch panel in a display device. Alternatively, the position input function can be added by providing a photoelectric conversion element called a photosensor in a pixel portion of a display device.

Figure 48C:
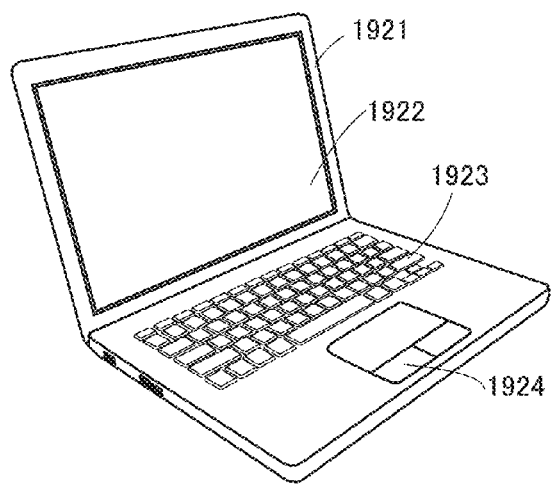

FIG. 48C illustrates a notebook personal computer, which includes a housing 1921, a display portion 1922, a keyboard 1923, a pointing device 1924, and the like.

Figure 48D:
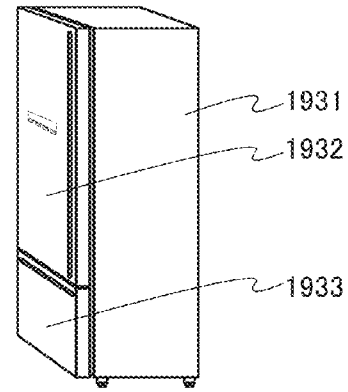

FIG. 48D illustrates an electric refrigerator-freezer, which includes a housing 1931, a door for a refrigerator 1932, a door for a freezer 1933, and the like.

Figure 48E:
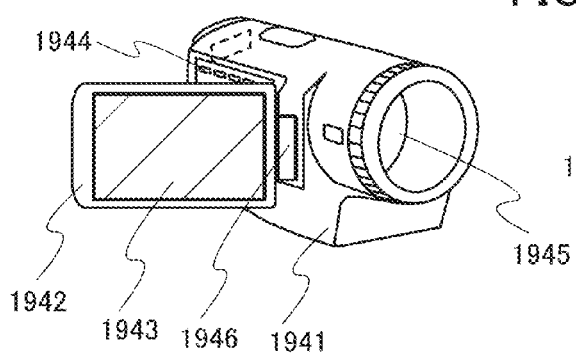

FIG. 48E illustrates a video camera, which includes a first housing 1941, a second housing 1942, a display portion 1943, operation keys 1944, a lens 1945, a joint 1946, and the like. The operation keys 1944 and the lens 1945 are provided for the first housing 1941, and the display portion 1943 is provided for the second housing 1942. The first housing 1941 and the second housing 1942 are connected to each other with the joint 1946, and the angle between the first housing 1941 and the second housing 1942 can be changed with the joint 1946. Images displayed on the display portion 1943 may be switched in accordance with the angle at the joint 1946 between the first housing 1941 and the second housing 1942.

Figure 48F:
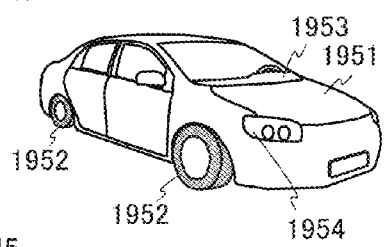

FIG. 48F illustrates a car including a car body 1951, wheels 1952, a dashboard 1953, lights 1954, and the like.

Note that described above are embodiments of the present invention. However, embodiments of the present invention are not limited to the above-described embodiments. That is, various embodiments of the invention are described in this embodiment and the like, and one embodiment of the present invention is not limited to a particular embodiment. Although an example in which a channel formation region, a source region, a drain region, or the like of a transistor includes an oxide semiconductor is described as one embodiment of the present invention, one embodiment of the present invention is not limited to this example. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor.

This application is based on Japanese Patent Application serial no. 2015-213167 filed with Japan Patent Office on Oct. 29, 2015, the entire contents of which are hereby incorporated by reference.

What is claimed is:

1. A method for manufacturing a semiconductor device comprising a semiconductor film over a substrate, comprising the steps of:
    forming a first conductor over the substrate;
    forming a first insulator over the first conductor;
    forming a first hard mask over the first insulator;
    forming a first resist mask comprising a first opening, over the first hard mask;
    etching the first hard mask using the first resist mask to form a second hard mask comprising a second opening;
    etching the first insulator using the second hard mask to form a second insulator comprising a third opening;
    forming a second conductor embedded in the second opening and the third opening;
    performing polishing treatment on the second hard mask and the second conductor to form a third conductor embedded in the third opening;
    forming a fourth conductor over the second insulator and the third conductor;
    forming a second resist mask in a pattern over the fourth conductor;
    etching the fourth conductor using the second resist mask and an etching gas to form a fifth conductor; and
    removing the second resist mask,
    wherein the second hard mask is etched with the etching gas.

2. The method for manufacturing a semiconductor device, according to claim 1, wherein the second hard mask and the fourth conductor comprise the same kind of metal element.

3. The method for manufacturing a semiconductor device, according to claim 1,
    wherein the first hard mask comprises a third hard mask and a fourth hard mask over the third hard mask,
    wherein the third hard mask is a conductor, and
    wherein the fourth hard mask is an insulator.

4. The method for manufacturing a semiconductor device, according to claim 3, wherein the third hard mask and the fourth conductor comprise the same kind of metal element.

5. The method for manufacturing a semiconductor device, according to claim 1,
    wherein the fourth conductor comprises a plurality of stacked conductive films, and
    wherein a lowermost conductive film of the fourth conductor and the second hard mask are etched with the etching gas.

6. The method for manufacturing a semiconductor device, according to claim 5, wherein the second hard mask and the lowermost conductive film of the fourth conductor comprise the same kind of metal element.

7. The method for manufacturing a semiconductor device, according to claim 1, wherein a region of the second hard mask not overlapping with the second resist mask is removed when etching the fourth conductor, so that a region of the second hard mask remains only in a region overlapping with the fifth conductor.

8. A method for manufacturing a semiconductor device comprising the steps of:
    forming a first conductor over a semiconductor substrate;
    forming a first insulator over the first conductor;
    forming a first hard mask over the first insulator;
    forming a first resist mask comprising a first opening, over the first hard mask;
    etching the first hard mask using the first resist mask to form a second hard mask comprising a second opening;
    etching the first insulator using the second hard mask to form a second insulator comprising a third opening;
    forming a second conductor embedded in the second opening and the third opening;
    performing polishing treatment on the second hard mask and the second conductor to form a third conductor embedded in the third opening;
    forming a fourth conductor over the second insulator and the third conductor;
    forming a second resist mask in a pattern over the fourth conductor;
    etching the fourth conductor using the second resist mask and a first etching gas to form a fifth conductor;
    removing the second resist mask,
    forming an oxide semiconductor film over the fifth conductor;
    forming a sixth conductor over the oxide semiconductor film;
    forming a third insulator over the sixth conductor;
    forming a third hard mask over the third insulator;
    forming a third resist mask comprising a fourth opening, over the third hard mask;
    etching the third hard mask using the third resist mask to form a fourth hard mask comprising a fifth opening;
    etching the third insulator using the fourth hard mask to form a fourth insulator comprising a sixth opening;
    forming a seventh conductor embedded in the fifth opening and the sixth opening;
    performing polishing treatment on the fourth hard mask and the seventh conductor to form an eighth conductor embedded in the sixth opening;
    forming a ninth conductor over the fourth insulator and the eighth conductor;
    forming a fourth resist mask in a pattern over the ninth conductor;
    etching the ninth conductor using the fourth resist mask and a second etching gas to form a tenth conductor; and
    removing the fourth resist mask,
    wherein the second hard mask is etched with the first etching gas,
    wherein the fourth hard mask is etched with the second etching gas, and
    wherein a melting point of the tenth conductor is lower than a melting point of the fifth conductor.

9. The method for manufacturing a semiconductor device, according to claim 8,
    wherein the second hard mask and the fourth conductor comprise the same kind of metal element, and wherein the fourth hard mask and the ninth conductor comprise the same kind of metal element.

10. The method for manufacturing a semiconductor device, according to claim 8,
wherein the first hard mask comprises a fifth hard mask and a sixth hard mask over the fifth hard mask,
wherein the fifth hard mask is a conductor,
wherein the sixth hard mask is an insulator,
wherein the third hard mask comprises a seventh hard mask and an eighth hard mask over the seventh hard mask,
wherein the seventh hard mask is a conductor, and
wherein the eighth hard mask is an insulator.

11. The method for manufacturing a semiconductor device, according to claim 10,
wherein the fifth hard mask and the fourth conductor comprise the same kind of metal element, and
wherein the seventh hard mask and the ninth conductor comprise the same kind of metal element.

12. The method for manufacturing a semiconductor device, according to claim 8,
wherein the fourth conductor comprises a plurality of stacked conductive films,
wherein a lowermost conductive film of the fourth conductor and the second hard mask are etched with the first etching gas,
wherein the ninth conductor comprises a plurality of stacked conductive films, and
wherein a lowermost conductive film of the ninth conductor and the fourth hard mask are etched with the second etching gas.

13. The method for manufacturing a semiconductor device, according to claim 12,
wherein the second hard mask and the lowermost conductive film of the fourth conductor comprise the same kind of metal element, and
wherein the fourth hard mask and the lowermost conductive film of the ninth conductor comprise the same kind of metal element.

14. A method for manufacturing a semiconductor device comprising the steps of:
forming a first insulator;
forming a first mask comprising a first opening, over the first insulator;
etching the first insulator using the first mask to form a second insulator comprising a second opening;
forming a first conductor over the first mask and in the first opening and the second opening;
performing polishing treatment on the first mask and the first conductor to form a second conductor;
forming a third conductor over the second insulator and the second conductor;
forming a second mask in a pattern over the third conductor; and
etching the third conductor using the second mask to form a fourth conductor,
wherein the first mask is etched by the step of etching the third conductor, and
wherein the first mask comprises metal element.

15. The method for manufacturing a semiconductor device, according to claim 14, further comprising a step of;
forming a conductive layer under the first insulator,
wherein the second conductor is in contact with the conductive layer through the second opening.

16. The method for manufacturing a semiconductor device, according to claim 14, wherein the first mask and the third conductor comprise the same kind of metal element.

17. The method for manufacturing a semiconductor device, according to claim 14, wherein the polishing treatment is performed using chemical mechanical polishing method.

18. The method for manufacturing a semiconductor device, according to claim 14, wherein a region of the first mask is removed when etching the third conductor, so that a region of the first mask remains only in a region overlapping with the fourth conductor.

19. A method for manufacturing a semiconductor device comprising a semiconductor film over a substrate, comprising the steps of:
forming a first conductor over the substrate;
forming a first insulator over the first conductor;
forming a first hard mask over the first insulator;
forming a first resist mask comprising a first opening, over the first hard mask;
etching the first hard mask using the first resist mask to form a second hard mask comprising a second opening;
etching the first insulator using the second hard mask to form a second insulator comprising a third opening;
forming a second conductor embedded in the second opening and the third opening;
performing polishing treatment on the second hard mask and the second conductor to form a third conductor embedded in the third opening;
forming a fourth conductor over the second insulator and the third conductor;
forming a second resist mask in a pattern over the fourth conductor;
etching the fourth conductor using the second resist mask and an etching gas to form a fifth conductor; and
removing the second resist mask,
wherein the second hard mask and the fourth conductor comprise the same kind of metal element.

20. The method for manufacturing a semiconductor device, according to claim 19,
wherein the first hard mask comprises a third hard mask and a fourth hard mask over the third hard mask,
wherein the third hard mask is a conductor, and
wherein the fourth hard mask is an insulator.

21. The method for manufacturing a semiconductor device, according to claim 20, wherein the third hard mask and the fourth conductor comprise the same kind of metal element.

22. The method for manufacturing a semiconductor device, according to claim 19,
wherein the fourth conductor comprises a plurality of stacked conductive films, and
wherein a lowermost conductive film of the fourth conductor and the second hard mask are etched with the etching gas.

23. The method for manufacturing a semiconductor device, according to claim 22, wherein the second hard mask and the lowermost conductive film of the fourth conductor comprise the same kind of metal element.

24. The method for manufacturing a semiconductor device, according to claim 19, wherein a region of the second hard mask not overlapping with the second resist mask is removed when etching the fourth conductor, so that a region of the second hard mask remains only in a region overlapping with the fifth conductor.

* * * * *